(12) United States Patent
Kimura

(10) Patent No.: US 9,305,496 B2
(45) Date of Patent: Apr. 5, 2016

(54) ELECTRIC FIELD DRIVING DISPLAY DEVICE

(75) Inventor: Hajime Kimura, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 57 days.

(21) Appl. No.: 13/167,136

(22) Filed: Jun. 23, 2011

(65) Prior Publication Data

US 2012/0001889 A1 Jan. 5, 2012

(30) Foreign Application Priority Data

Jul. 1, 2010 (JP) ................................. 2010-151026

(51) Int. Cl.
G09G 3/34 (2006.01)

(52) U.S. Cl.
CPC ........ *G09G 3/344* (2013.01); *G09G 2300/0426* (2013.01); *G09G 2320/0257* (2013.01); *G09G 2330/021* (2013.01)

(58) Field of Classification Search
CPC .......... G09G 3/344; G09G 2300/0426; G09G 2320/0257; G09G 2330/021
USPC ........................................................ 345/107
See application file for complete search history.

(56) References Cited

U.S. PATENT DOCUMENTS

| | | | |
|---|---|---|---|
| 6,133,976 A | 10/2000 | Kimura | |
| 6,462,859 B1 * | 10/2002 | Bastiaens et al. | 359/296 |
| 6,545,797 B2 | 4/2003 | Chen et al. | |
| 6,593,691 B2 | 7/2003 | Nishi et al. | |
| 6,806,995 B2 | 10/2004 | Chung et al. | |
| 6,947,203 B2 * | 9/2005 | Kanbe | 359/296 |
| 6,999,149 B2 | 2/2006 | Miyajima et al. | |

(Continued)

FOREIGN PATENT DOCUMENTS

| | | |
|---|---|---|
| EP | 1329764 A | 7/2003 |
| JP | 05-216071 A | 8/1993 |

(Continued)

OTHER PUBLICATIONS

Taiwanese Office Action(Application No. 100122434) Dated Nov. 20, 2015.

*Primary Examiner* — Aneeta Yodichkas
*Assistant Examiner* — Joseph Fox
(74) *Attorney, Agent, or Firm* — Fish & Richardson P.C.

(57) ABSTRACT

It is an object to provide an electric field driving display device capable of displaying a high quality image and to provide an electric field driving display device in which residual images in an outline of a pixel is prevented from occurring. An insulating film is formed over a second electrode and a plurality of first electrodes are provided over the insulating film. Each of the first electrodes is electrically connected to the second electrode. The second electrode is provided to partly overlap a region between the adjacent two first electrodes. In other words, viewing the top and the bottom of the display device, the adjacent first electrodes are provided apart from each other and the second electrode is provided to embed a space between the adjacent first electrodes.

12 Claims, 43 Drawing Sheets

(56) References Cited

U.S. PATENT DOCUMENTS

| | | |
|---|---|---|
| 7,248,322 B2 | 7/2007 | Miyajima et al. |
| 7,463,399 B2 * | 12/2008 | Shin et al. .................... 359/265 |
| 7,777,939 B2 * | 8/2010 | Mathea et al. ................ 359/296 |
| 7,869,119 B2 | 1/2011 | Oikawa et al. |
| 8,159,130 B2 * | 4/2012 | Shim et al. .................... 313/511 |
| 2008/0273132 A1 | 11/2008 | Hsu et al. |
| 2008/0309613 A1 * | 12/2008 | Bae .............................. 345/107 |
| 2010/0007942 A1 | 1/2010 | Oikawa et al. |
| 2010/0140613 A1 * | 6/2010 | Kimura ........................... 257/43 |
| 2010/0277443 A1 | 11/2010 | Yamazaki et al. |
| 2011/0032227 A1 | 2/2011 | Miyaguchi |
| 2011/0063340 A1 | 3/2011 | Umezaki et al. |
| 2011/0090186 A1 | 4/2011 | Yamazaki et al. |

FOREIGN PATENT DOCUMENTS

| | | | |
|---|---|---|---|
| JP | 06-175156 A | 6/1994 | |
| JP | 10-288775 A | 10/1998 | |
| JP | 2000-137241 A | 5/2000 | |
| JP | 2003-207794 A | 7/2003 | |
| JP | 2003-248233 A | 9/2003 | |
| JP | 2005-250228 A | 9/2005 | |
| JP | 2006-518881 A | 8/2006 | |
| JP | 2007-271647 A | 10/2007 | |
| JP | 2008-276153 A | 11/2008 | |
| JP | 2009-086153 A | 4/2009 | |
| JP | 2009-139855 A | 6/2009 | |
| WO | WO 2010029885 A1 * | 3/2010 | ............. H01L 21/77 |

* cited by examiner

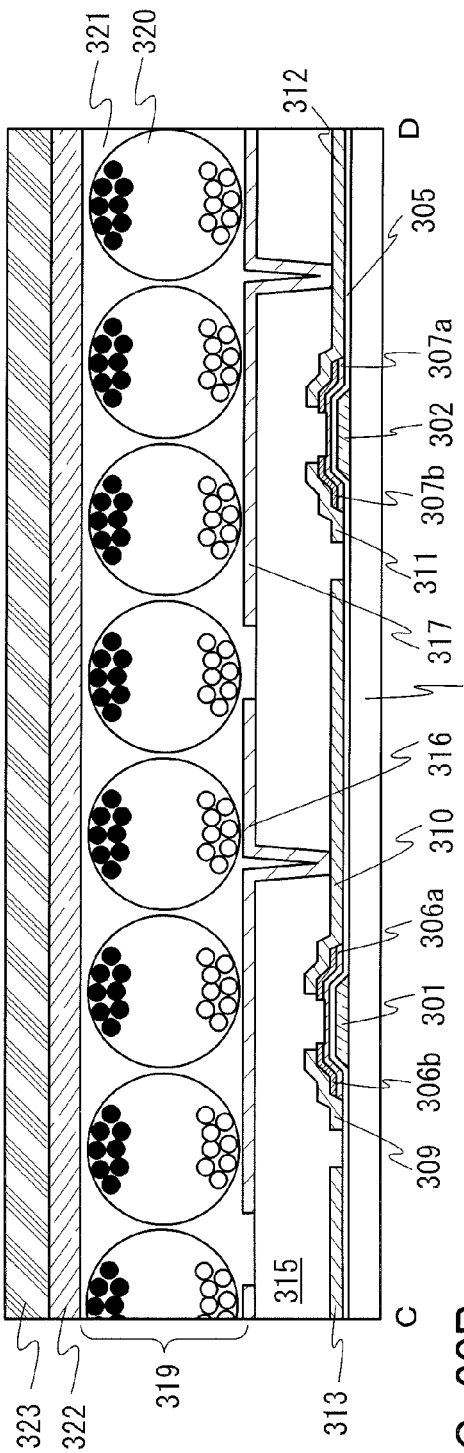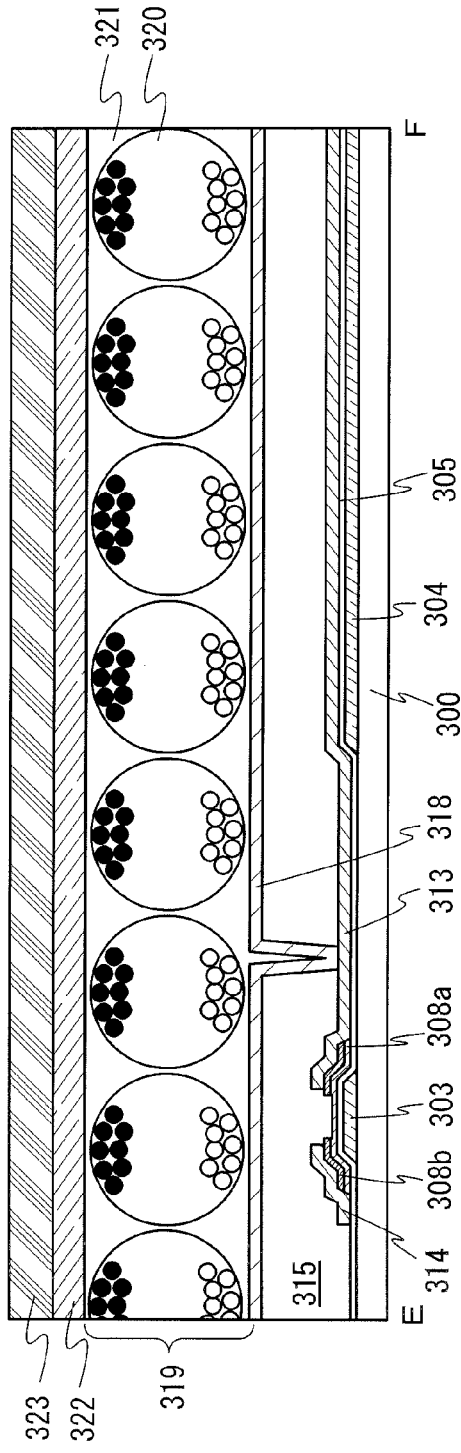

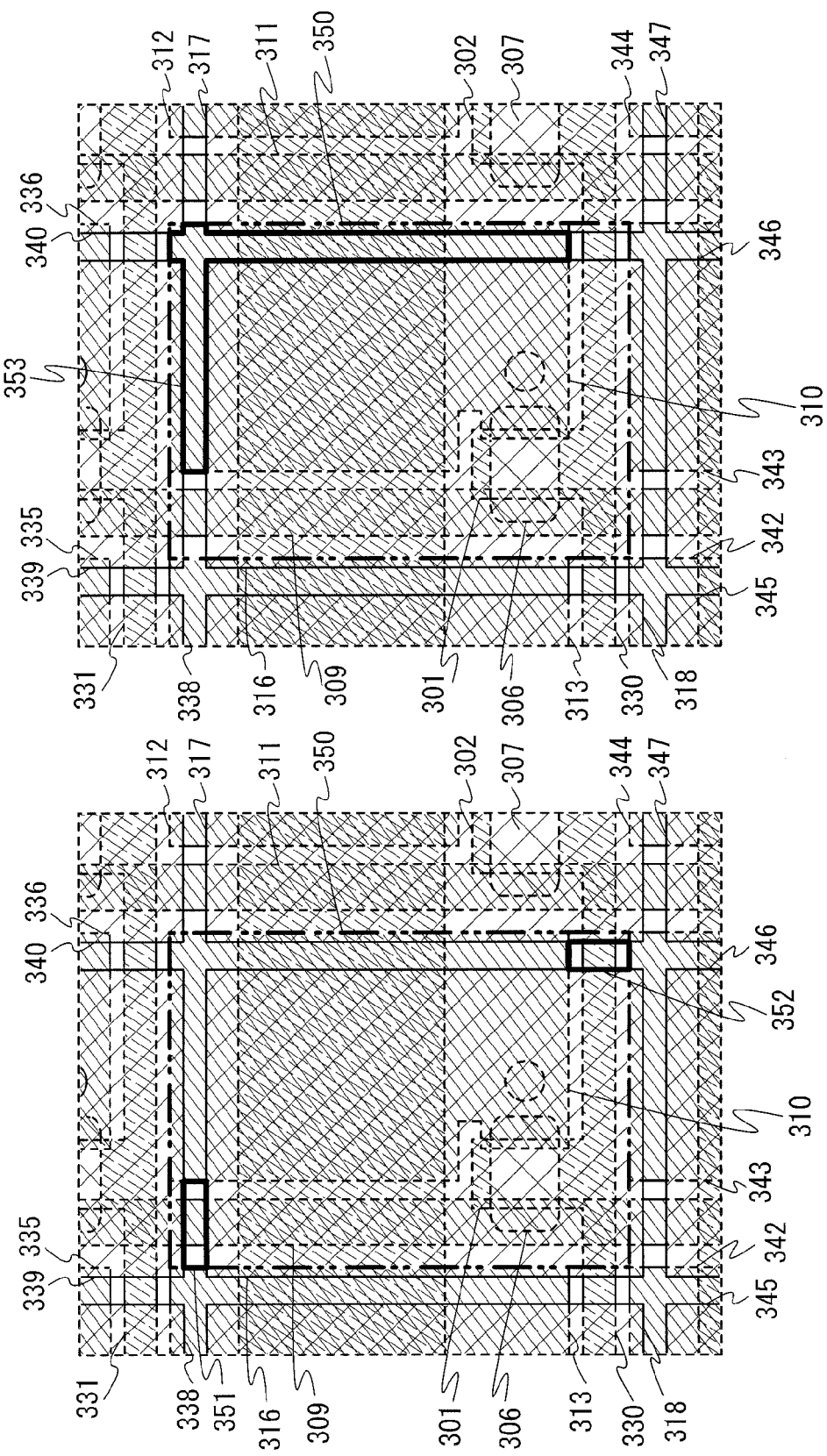

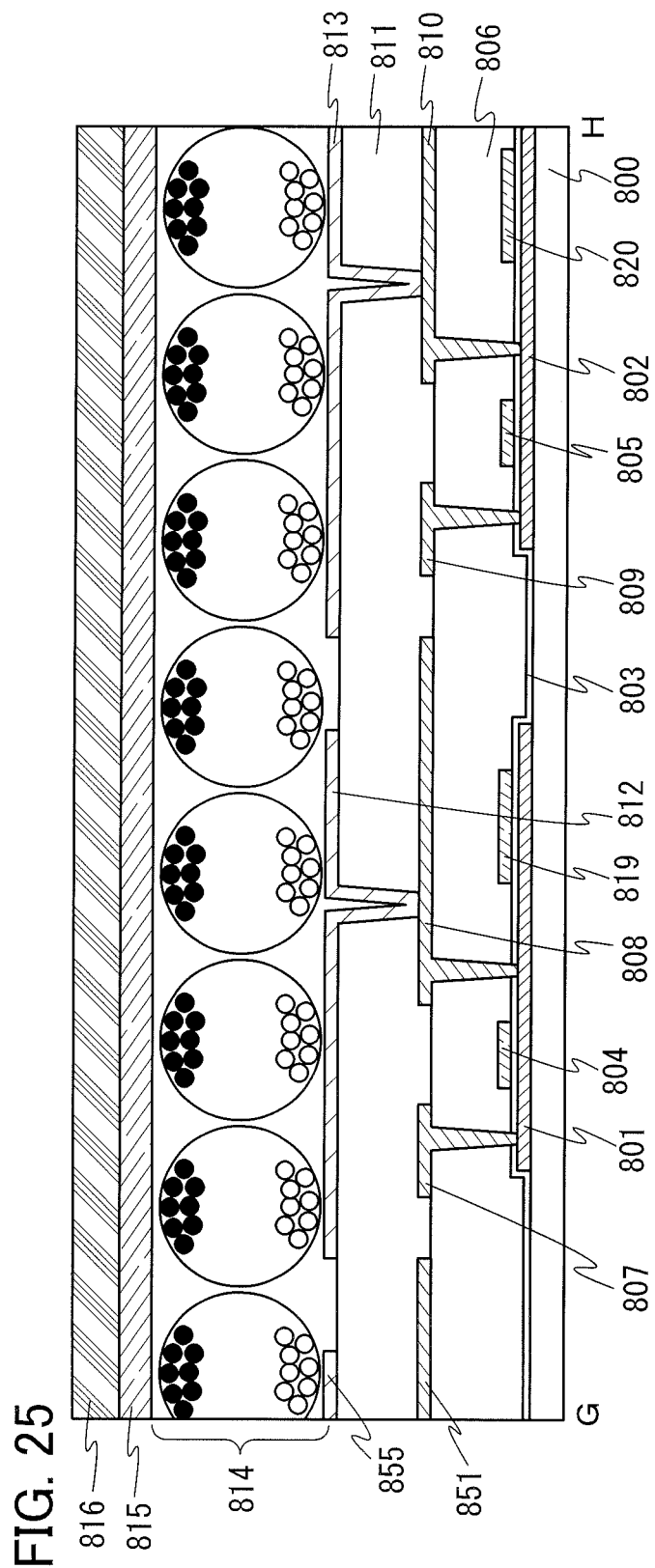

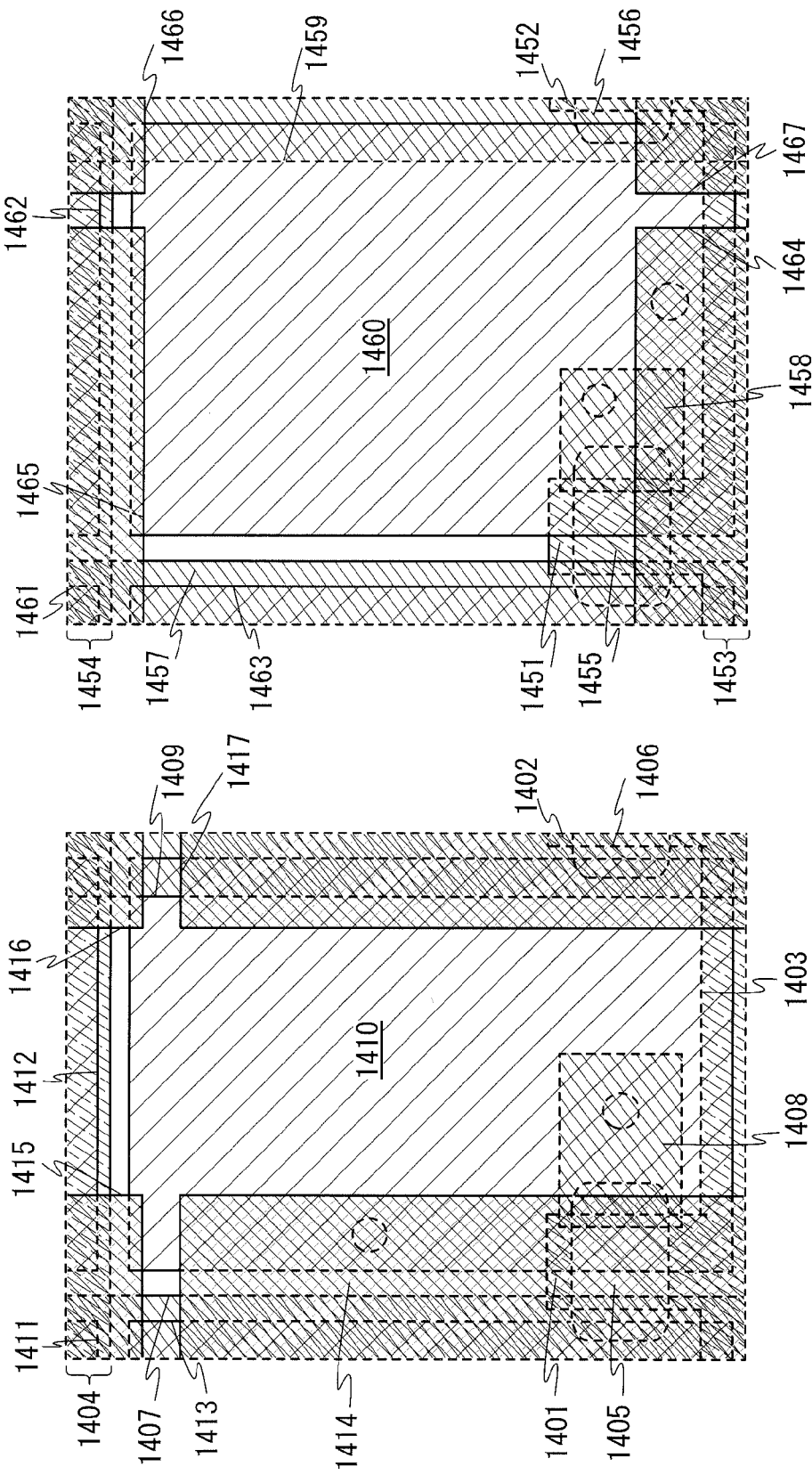

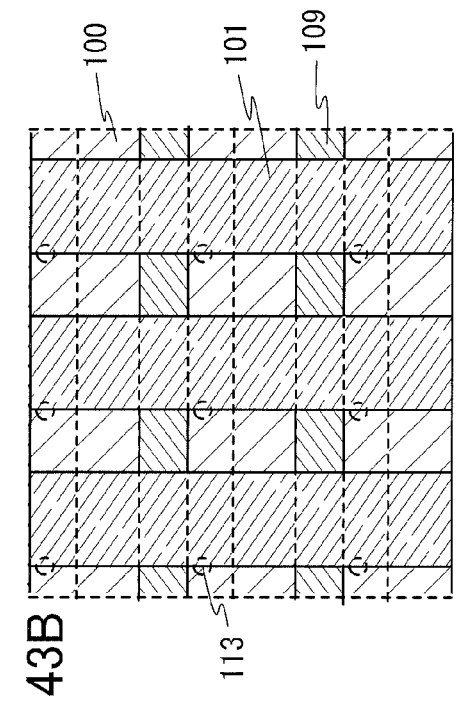
FIG. 43B
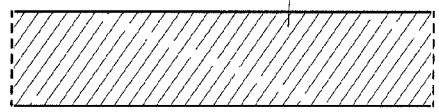
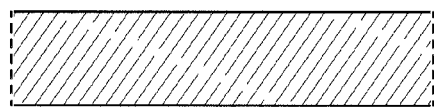
FIG. 43A
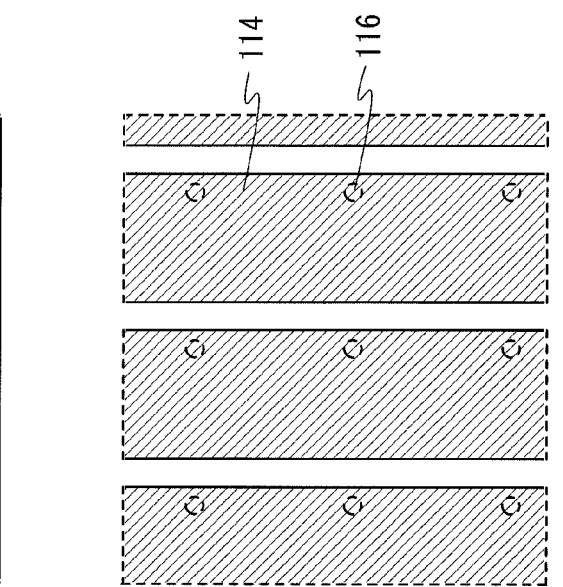
FIG. 43D
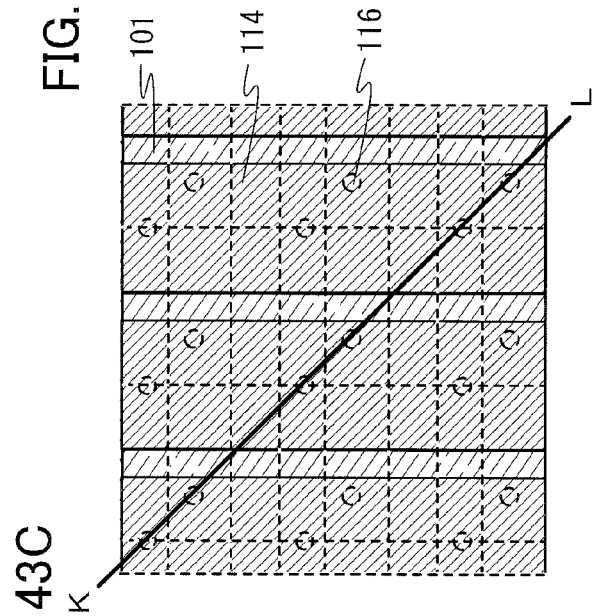
FIG. 43C

ELECTRIC FIELD DRIVING DISPLAY DEVICE

BACKGROUND OF THE INVENTION

1. Field of the Invention

This invention relates to a semiconductor device, a display device, and a reflective display device, driving methods thereof, and manufacturing methods thereof. In particular, the present invention relates to a semiconductor device, a display device, and a reflective display device which are driven by transferring a particle in liquid or gas, driving methods thereof, and manufacturing methods thereof. Alternatively, the present invention relates to a semiconductor device, a display device, and a reflective display device which utilize an electrophoresis phenomenon, driving methods thereof, and manufacturing methods thereof. Alternatively, the present invention relates to an electronic device including the semiconductor devices, the display devices, or the reflective display devices.

2. Description of the Related Art

In recent years, display devices have been extensively researched, and as one of the display devices capable of being driven at low power, electric field driving display devices (e.g., electronic paper) has attracted attention. The electric field driving display device has the advantage of consuming less power and holding an image even after being turned off; therefore, it has been expected to be applied to e-book readers or posters.

Various electric field driving display devices using various methods have been proposed thus far. For example, Patent Documents 1 and 2 each disclose an electrophoresis electric field driving display device which uses a microcapsule. Patent Document 3 discloses an electrophoresis electric field driving display device which uses a microcup. Patent Document 4 discloses a particle movement electric field driving display device which uses Electronic Liquid Powder (registered trademark).

REFERENCES

[Patent Document 1] Japanese Published Patent Application No. 2008-276153
[Patent Document 2] Japanese Published Patent Application No. 2009-086153
[Patent Document 3] Japanese Translation of PCT International Application No. 2006-518881
[Patent Document 4] Japanese Published Patent Application No. 2009-139855

SUMMARY OF THE INVENTION

It is an object of an embodiment of the present invention to provide an electric field driving display device capable of displaying a high quality image. Alternatively, it is an object of an embodiment of the present invention to provide an electric field driving display device in which display defects (e.g., a phenomenon of generating residual images in an outline of a pixel) are reduced. Alternatively, it is an object of an embodiment of the present invention to provide an electric field driving display device in which aggregation of particles included in a display medium is eased. Alternatively, it is an object of an embodiment of the present invention to provide an electric field driving display device in which how to apply an electric field to a display medium is improved. Alternatively, it is an object of an embodiment of the present invention to provide an electric field driving display device in which a contrast of a display device is improved.

Note that the descriptions of these objects do not disturb the existence of other objects. An embodiment of the present invention does not have to attain all the above objects. An object other than the above ones automatically becomes clear from description in the specification, the drawings, the claims, or the like. The object other than the above ones can be extracted from the description in the specification, the drawings, the claims, or the like.

An embodiment of the present invention is an electric field driving display device in which an auxiliary electrode is provided between a pixel electrode of one pixel and a pixel electrode of another pixel adjacent to the one pixel.

Alternatively, an embodiment of the present invention is an electric field driving display device including two first electrodes adjacent to each other, a second electrode, a third electrode, and a charged particle provided between the two first electrodes and the second electrode. The third electrode is provided between the two first electrodes and the second electrode and is electrically connected to one of the two first electrodes. The third electrode overlaps at least part of the one of the two first electrodes with an insulating film provided therebetween. The third electrode overlaps at least part of the other of the two first electrodes with the insulating film provided therebetween.

Alternatively, an embodiment of the present invention is an electric field driving display device including two first electrodes adjacent to each other, a second electrode, a third electrode, and a charged particle provided between the two first electrodes and the second electrode. The third electrode is provided between the two first electrodes and the second electrode and is electrically connected to one of the two first electrodes. The third electrode overlaps at least part of the one of the two first electrodes with an insulating film provided therebetween. The third electrode does not overlap the other of the two first electrodes with the insulating film provided therebetween.

Alternatively, an embodiment of the present invention is an electric field driving display device including two first electrodes adjacent to each other, a second electrode, a third electrode, and a charged particle provided between the two first electrodes and the second electrode. The two first electrodes are provided between the third electrode and the second electrode. The third electrode is electrically connected to one of the two first electrodes. The third electrode overlaps at least part of the one of the two first electrodes with an insulating film provided therebetween. The third electrode overlaps at least part of the other of the two first electrodes with the insulating film provided therebetween.

Alternatively, an embodiment of the present invention is an electric field driving display device including two first electrodes adjacent to each other, a second electrode, a third electrode, and a charged particle provided between the two first electrodes and the second electrode. The two first electrodes are provided between the thied electrode and the second electrode. The third electrode is electrically connected to one of the two first electrodes. The third electrode overlaps at least part of the one of the two first electrodes with an insulating film provided therebetween. The third electrode does not overlap the other of the two first electrodes with the insulating film provided therebetween.

Note that the size, the thickness of layers, or regions in diagrams is sometimes exaggerated for simplicity. Therefore, embodiments of the present invention are not limited to such scales.

Note that the drawings are schematic views of ideal examples, and shapes or the like are not limited to those illustrated in the drawings. For example, the drawings can include variations in shape due to a manufacturing technique or dimensional deviation.

Technical terms are used in order to describe a specific embodiment or the like in many cases. Note that one embodiment of the invention is not construed as being limited by the technical terms.

Terms which are not defined (including terms used for science and technology, such as technical terms and academic parlance) can be used as the terms which have a meaning equivalent to a general meaning that an ordinary person skilled in the art understands. It is preferable that terms defined by dictionaries or the like be construed as consistent meaning with the background of related art.

An embodiment of the present invention can provide an electric field driving display device capable of displaying a high quality image. Alternatively, an embodiment of the present invention can provide an electric field driving display device in which display defects (e.g., a phenomenon of generating residual images in an outline of a pixel) are reduced. Alternatively, an embodiment of the present invention can provide an electric field driving display device in which aggregation of particles included in a display medium is reduced. Alternatively, an embodiment of the present invention can provide an electric field driving display device in which how to apply an electric field to a display medium is improved. Alternatively, an embodiment of the present invention can provide an electric field driving display device in which a contrast of a display device is improved.

BRIEF DESCRIPTION OF THE DRAWINGS

FIGS. 20A and 20B are cross-sectional views in accordance with an embodiment of the present invention.

FIGS. 21A and 21B are top views in accordance with an embodiment of the present invention.

FIG. 25 is a cross-sectional view in accordance with an embodiment of the present invention.

FIGS. 40A and 40B are top views in accordance with an embodiment of the present invention.

FIGS. 43A to 43D are top views of a display device in accordance with an embodiment of the present invention.

DETAILED DESCRIPTION OF THE INVENTION

Figure 1:
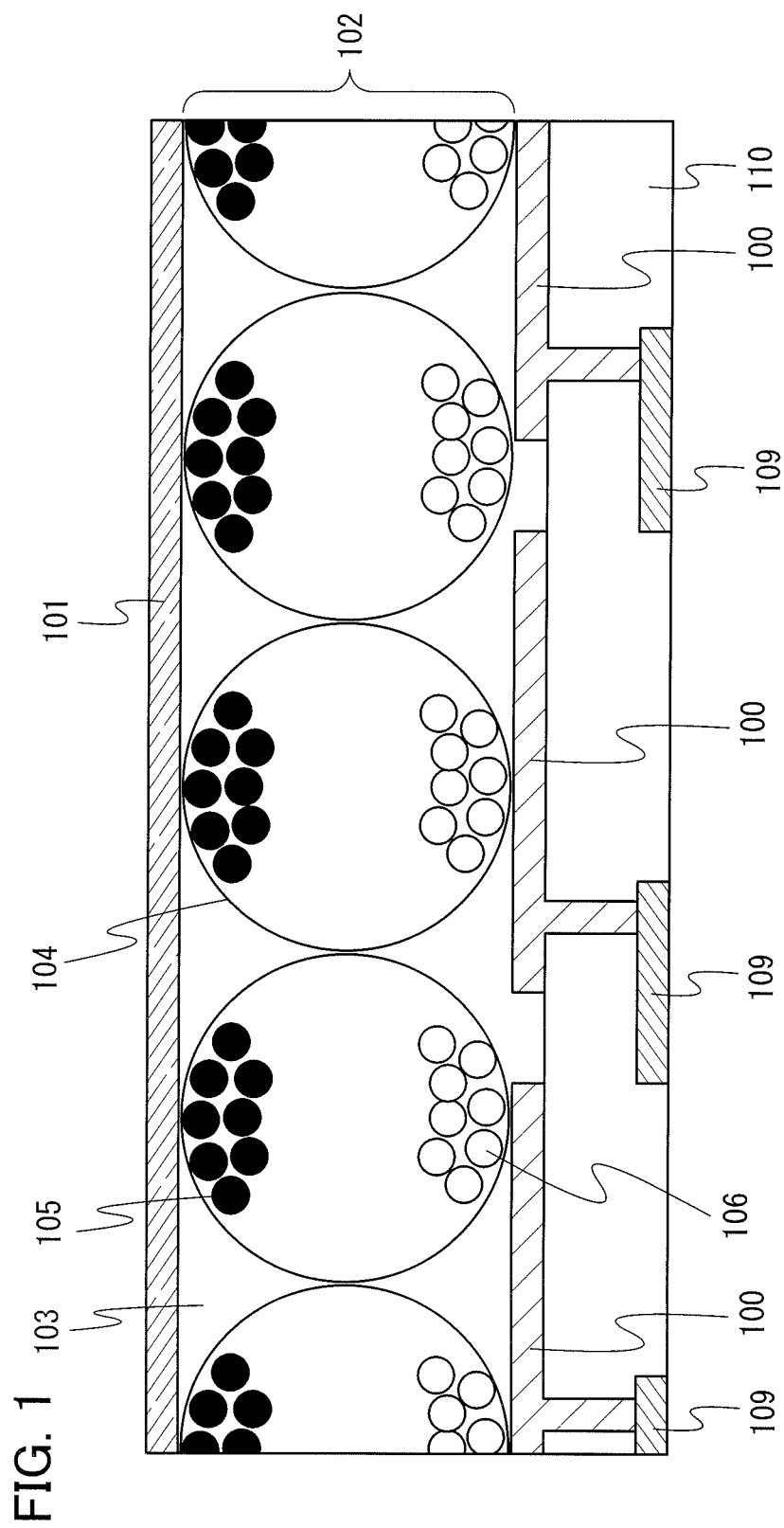
FIG. 1 is a cross-sectional view in accordance with an embodiment of the present invention.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below. In structures given below, the same portions or portions having similar functions are denoted by the same reference numerals in different drawings, and explanation thereof will not be repeated.

Note that what is described (or part thereof) in one embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with a paragraph disclosed in this specification.

Note that, by combining a diagram described in one embodiment, a different diagram (or part thereof) described in the same embodiment, and/or a diagram (or part thereof) described in one or a plurality of different embodiments, much more diagrams can be formed. In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Embodiment 1

In this embodiment, an embodiment of an electric field driving display device of the present invention will be described with reference to drawings.

FIG. 1 is a cross sectional schematic view of an electric field driving display device of the present invention. An insulating film 110 is formed over a plurality of electrodes 109. Contact holes are provided in the insulating film 110, and a plurality of electrodes 100 formed over the insulating film 110 are each connected to the plurality of electrodes 109. The electrode 109 is provided so as to overlap at least part of a region between adjacent two electrodes 100. In other words, viewing the top and the bottom of the display device, the adjacent two electrodes 100 are provided apart from each other and the electrode 109 is in a space between adjacent two electrodes 100. Here, the electrode 100 can function as a pixel electrode and the electrode 109 can function as an auxiliary electrode. In this specification, the auxiliary electrode has the same or smaller area than that of the pixel electrode.

A layer 102 is formed, provided, or attached between the electrode 100 and an electrode 101. The electrode 101 can function as a counter electrode. The layer 102 includes a display medium. The layer 102 can include a particle when the layer 102 is formed. Alternatively, the particle included in the layer 102 can be electrically charged. Such a particle is referred to as a charged particle in this specification. The layer 102 has a structure in which a microcapsule 104 is dispersed in a dispersant 103 and fixed as one example. In that case, an adhesive layer, a bonding layer, or the like can be formed between the electrode 100 and the layer 102 or between the electrode 101 and the layer 102.

The microcapsule 104 can be a capsule in which particles of two colors exist, for example. In FIG. 1, a positively-charged particle 105 of one color and a negatively-charged particle 106 of a different color are dispersed in a solvent. Note that a clear liquid can be used as the solvent, for example. When a line of electric force between the electrode 100 and the electrode 101 is changed by application of voltage to the electrode 100 and the electrode 101, the positively-charged particle 105 of the one color and the negatively-charged particle 106 of the different color move in accordance with the direction of the line of electric force (the direction of an electric field). In other words, the positively-charged particle 105 of the one color and the negatively-charged particle 106 of the different color moves to the electrode 100 side or the electrode 101 side, whereby the reflectance of the layer 102 is changed. Accordingly, a contrast varies depending on each pixel to display an image. Note that the solvent may be colored. Here, the case of using two kinds of particle, that is, particles of two colors, is described; however, one kind of particle (all of the particles having one color).

Figure 2:
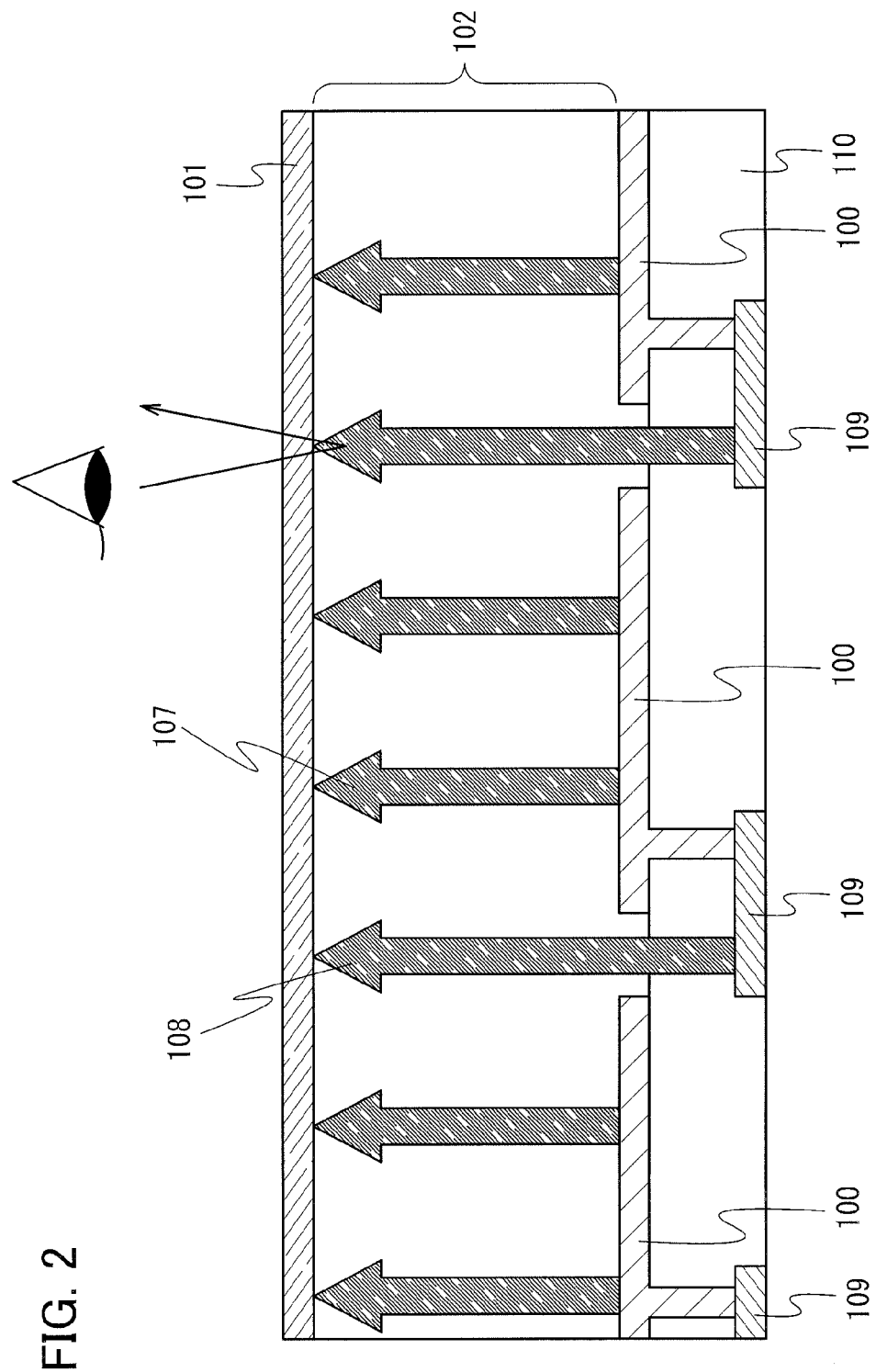
FIG. 2 is a cross-sectional view in accordance with an embodiment of the present invention.
Figure 3:
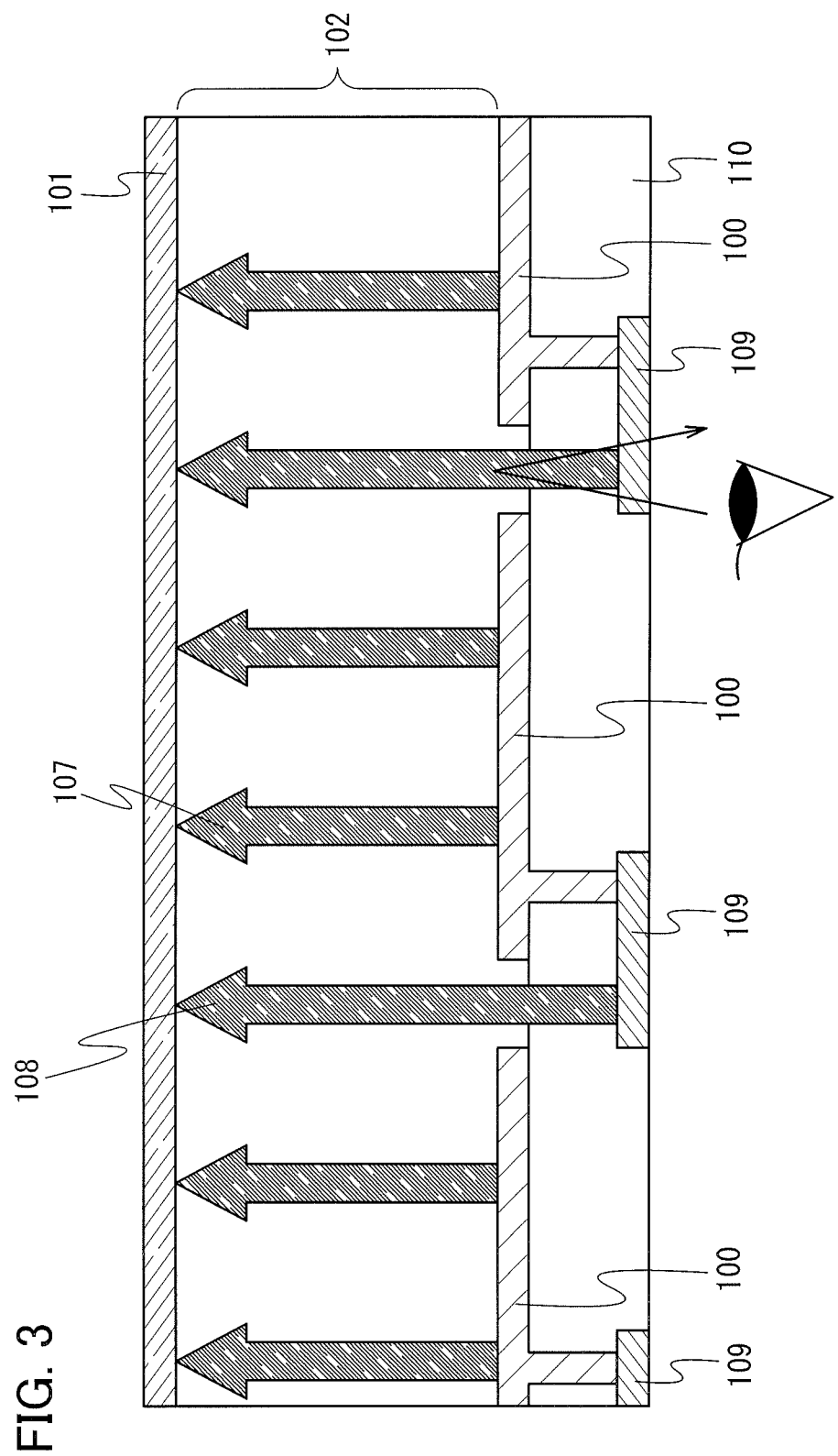
FIG. 3 is a cross-sectional view in accordance with an embodiment of the present invention.

FIG. 2 shows the case where a display surface is the top surface of the display device. FIG. 3 shows the case where a display surface is the bottom surface of the display device. When a line of electric force from the electrode 100 to the electrode 101 is changed by application of voltage to the electrode 100 and the electrode 101, a particle in a microcapsule provided over the electrode 100 moves in accordance with an electric field 107 which is applied nearly perpendicular to the electrode 101 from the electrode 100; in addition, a particle in a microcapsule provided over the region between the adjacent electrodes 100 moves in accordance with an electric field 108 which is applied nearly perpendicular to the electrode 101 from the electrode 109 (FIG. 2 and FIG. 3).

In this manner, in an example of an embodiment of the present invention, an electrophoresis phenomenon is utilized, in which an electrically charged object (e.g., a particle, a stick, and a tube) moves or rotates in liquid in accordance with an electric field. Therefore, a device utilizing an electrophoresis phenomenon can be referred to as an electrophoresis device (or an electrophoresis device). Further, a display device utilizing an electrophoresis phenomenon can be referred to as an electrophoresis display device (or an electrophoresis display device).

Alternatively, in an example of an embodiment of the present invention, a phenomenon is utilized, by which an electrically charged object (e.g., a particle, a stick, and a tube) moves or rotates in liquid or gas in accordance with an electric field. Therefore, a device utilizing such a phenomenon can be referred to as a particle moving device. Further, a display device utilizing such a phenomenon can be referred to as a particle moving display device.

Alternatively, in an example of an embodiment of the present invention, a phenomenon is utilized, by which an electrically charged object (e.g., a particle, a stick, and a tube) rotates in liquid in accordance with an electric field. Therefore, a device utilizing such a phenomenon can be referred to as a particle rotating device. Further, a display device utilizing such a phenomenon can be referred to as a particle rotating display device.

Alternatively, in an example of an embodiment of the present invention, a phenomenon is utilized, by which an electrically charged object (e.g., a particle, a stick, and a tube) moves or rotates in liquid in accordance with an electric field. Therefore, a device utilizing such a phenomenon can be referred to as an electric field driving device. Further, a display device utilizing such a phenomenon can be referred to as an electric field driving display device.

Alternatively, in an example of an embodiment of the present invention, a phenomenon is utilized, by which an electrically charged object (e.g., a particle, a stick, and a tube) moves or rotates in a tiny capsule such as a microcapsule in accordance with an electric field. Therefore, a device utilizing such a phenomenon can be referred to as a microcapsule device. Further, a display device utilizing such a phenomenon can be referred to as a microcapsule display device.

Therefore, a device illustrated in FIG. 1 can be referred to as an electrophoresis device, a particle moving device, a particle rotating device, an electric field driving device, or a microcapsule device.

In order to reduce display defects, it is important to control the aggregation of particles on the electrode 101 side in the case where the display surface is on the electrode 101 side as shown in FIG. 2. In the case where the display surface is on the electrode 100 side as shown in FIG. 3, it is important to control the aggregation of particles on the electrode 100 side. When the aggregation of the particles can be controlled, a display device in which display defects are reduced can be obtained without being provided with a light-shielding film. Note that in the case where the display surface is on the electrode 100 side as shown in FIG. 3, a transistor and a wiring which are connected to the electrode 100 or the electrode 109 are preferably transparent in order to be used for forming a display device.

In FIG. 1, FIG. 2, and FIG. 3, since the electrode 109 is electrically connected to the electrode 100, voltages applied to the electrode 109 and the electrode 100 are equivalent to each other. In addition, because a thickness of the insulating film 110 is a few nm to 2 μm while a thickness of the layer 102 is 40 μm to 100 μm, for example, a distance between the electrode 109 and the electrode 101 and a distance between the electrode 100 and the electrode 101 can be regarded as substantially the same. Therefore, when operation for rewriting a display image is performed, the electric field 107 and the electric field 108 which are applied to the electrode 101 are substantially the same. Therefore, particles in a microcapsule move and aggregation of particles can be reduced in a display region (a region to which the electric field 108 is applied) of the microcapsule provided over a region between the adjacent two electrodes 100 (above the electrode 109), as in a display region (a region to which the electric field 107 is applied) of the microcapsule provided over the electrode 100. Accordingly, display reflecting operation for rewriting a display image can be performed. Thus, an electric field driving display device, an electrophoresis display device, a particle moving display device, a particle rotating display device, or a microcapsule display device, in which a residual image is less likely to occur, can be fabricated.

In the case of no electrode 109, the electric field intensity of a region in which an electric field is curvedly applied from the electrode 100 to the electrode 101 (a region over the electrode 100) is lower than that of a region in which an electric field is applied nearly perpendicular to the electrode 101 from the electrode 100 (a region which does not overlap with the two adjacent electrodes 100). Therefore, there is a case of holding the state before operation for rewriting a display image is performed and the case of dragging the state before operation for rewriting a display image is performed, so that the image is not completely rewritten when operation for rewriting a display image is performed, in the region in which an electric field is curvedly applied from the electrode 100 to the electrode 101. At that time, the aggregation of particles might occur and a displayed image sometimes has a residual image. Such a phenomenon is likely to occur in a region in which the electrode 100 does not exist, that is, a region between adjacent two pixel electrodes. With the structures shown in FIG. 1, FIG. 2, and FIG. 3, residual images and aggregation of particles can be reduced.

Figure 4:
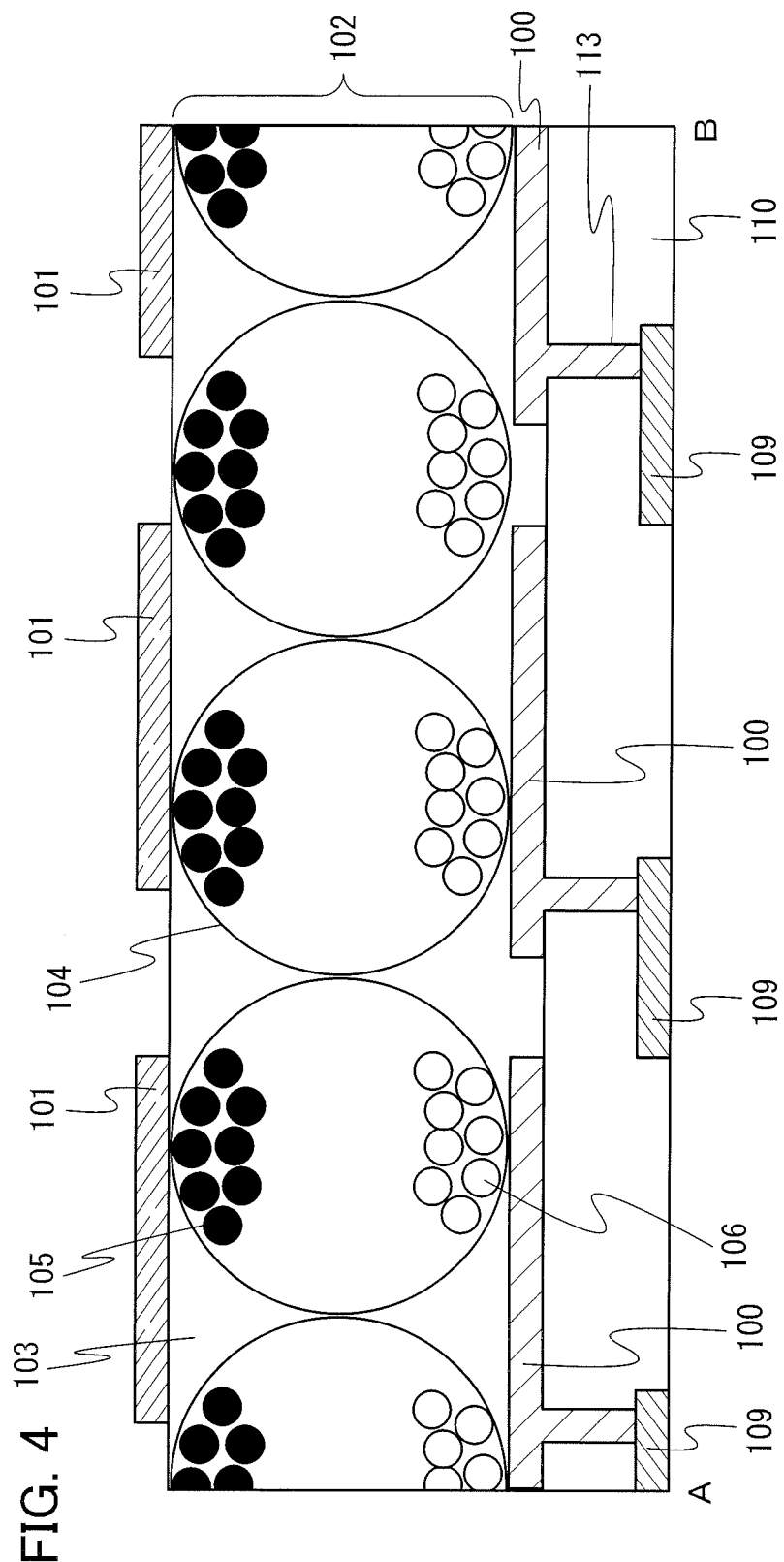
FIG. 4 is a cross-sectional view in accordance with an embodiment of the present invention.

Note that it is preferable that the electrode 101 be entirely formed, but an example of this embodiment is not limited to the structure. For example, the electrode 101 may be formed as stripes. Further, the electrode 101 and the electrode 100 may be formed as stripes and be orthogonal (FIG. 4). Accordingly, an example of this embodiment may be a passive matrix display device.

Figure 6A:
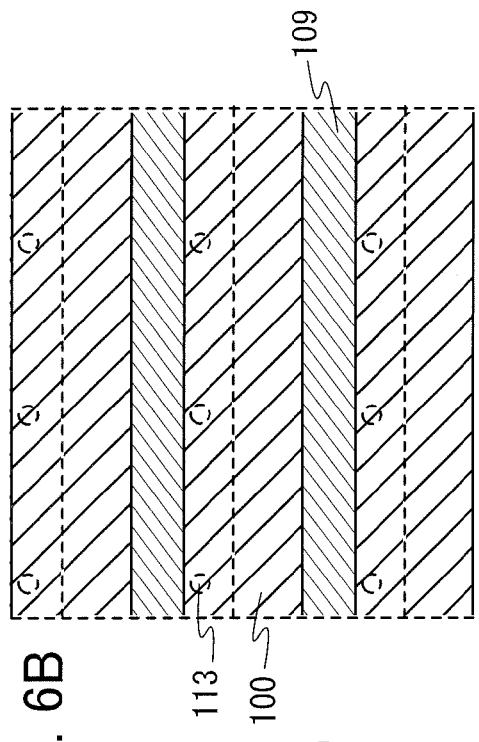
FIGS. 6A to 6D are top views in accordance with an embodiment of the present invention.
Figure 6B:
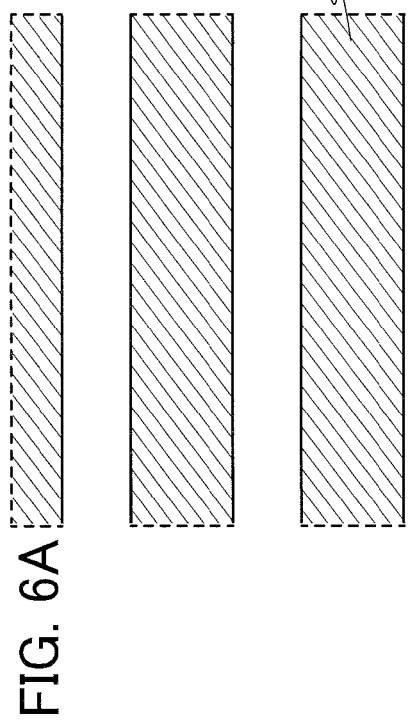
Figure 6D:
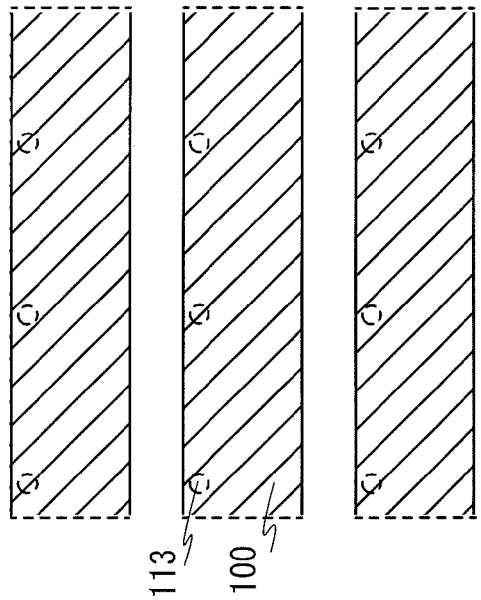
Figure 6C:
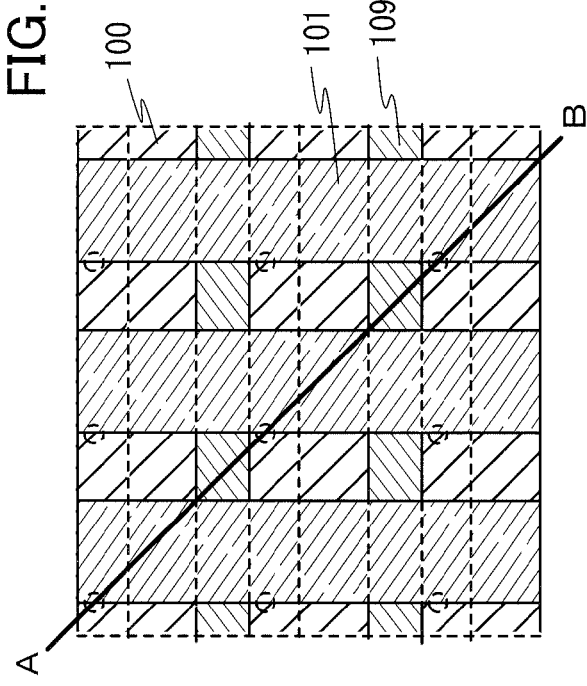

FIGS. 6A to 6D shows examples of a top view of a passive matrix display device. Further, the electrode 109 is formed (FIG. 4 and FIG. 6A). The electrode 109 can function as an auxiliary electrode. The insulating film 110 is formed over the electrode 109 (FIG. 4). A contact hole 113 is formed in the insulating film 110, and the electrode 100 electrically connected to the electrode 109 is formed as a stripe (FIG. 4 and FIG. 6B). The electrode 100 can function as a pixel electrode. The layer 102 including a display medium is formed over the electrode 100 (FIG. 4). The electrode 101 as a stripe is formed over the layer 102 including a display medium (under a substrate facing the substrate provided with the electrode 109) (FIG. 4 and FIG. 6C). The electrode 101 can function as a counter electrode. FIG. 4 is a cross section taken along a line A-B in FIG. 6C. FIG. 6D is a diagram in which the contact hole 113 and the electrode 100 in FIG. 6B are extracted. FIG. 43A is a diagram in which the electrode 101 as a stripe in FIG. 6C is extracted.

Viewing the passive matrix display device from the top or the bottom, the electrode 109 or the electrode 100 is formed in the whole of a pixel portion. In other words, the electrode 109 or the electrode 100 is formed in the region facing to the region in which the electrode 101 is formed (FIG. 6B). With such a structure, an electric field is almost uniformly applied to a region which overlaps the electrode 101 which can function as a counter electrode; therefore, a display device in which display defects are reduced can be obtained.

Figure 5:
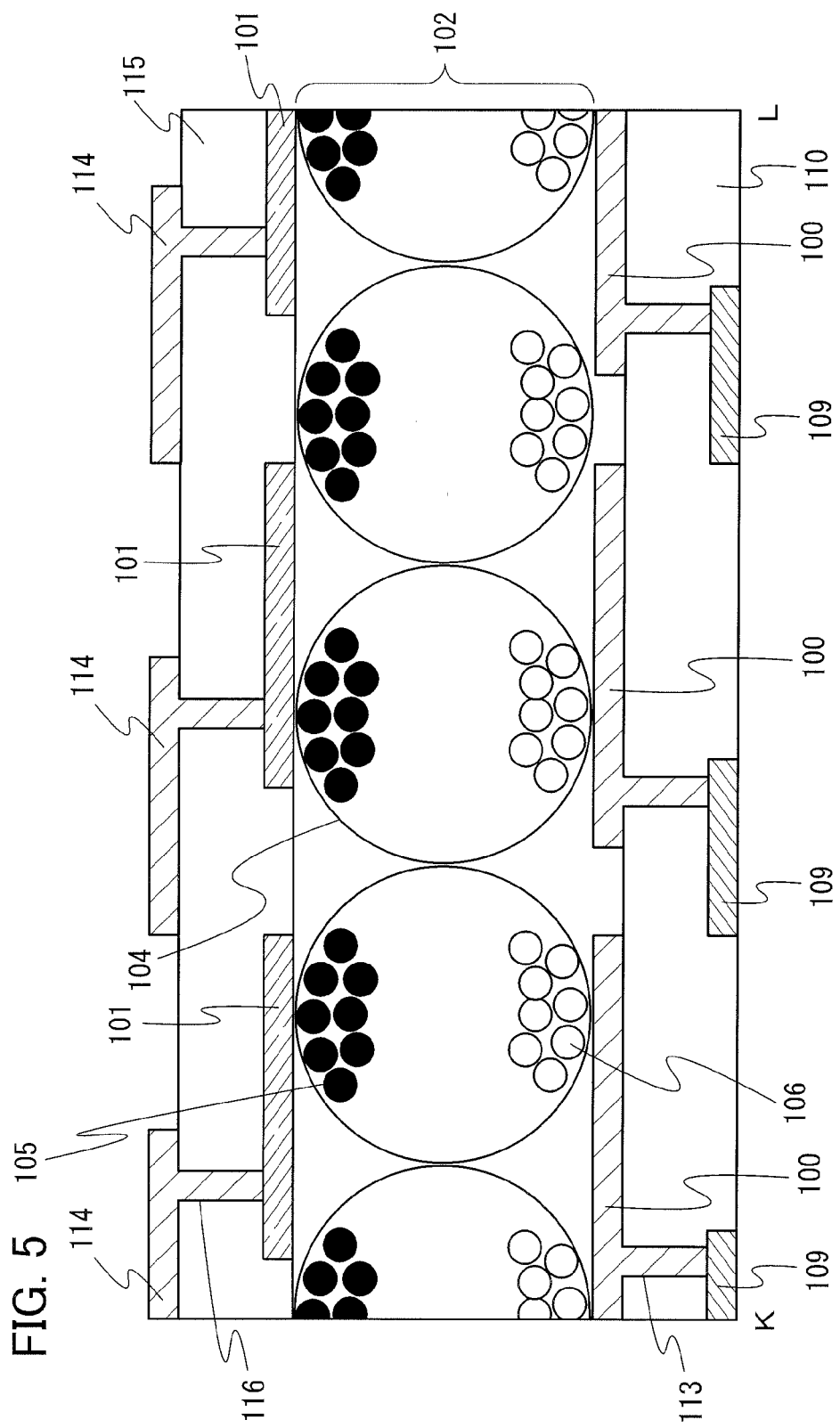
FIG. 5 is a cross-sectional view in accordance with an embodiment of the present invention.

Note that an electrode which can function as an auxiliary electrode can be provided for the electrode 101. FIG. 43C shows an example of a top view of a passive matrix display device for which an electrode 114 electrically connected to the electrode 101 is provided. FIG. 5 is a cross-sectional view taken along a line K-L in FIG. 43C. The insulating film 110 is formed over the electrode 109. The contact hole 113 is formed in the insulating film 110, and the electrode 100 electrically connected to the electrode 109 is formed. The layer 102 including a display medium is formed over the electrode 100. The electrode 101 is formed over the layer 102 including a display medium (under a substrate facing the substrate provided with the electrode 109) (FIG. 5 and FIG. 43B). An insulating film 115 is formed over the electrode 101. The electrode 114 is formed so as to be electrically connected to the electrode 101 through a contact hole 116 formed in the insulating film 115 (FIG. 5 and FIG. 43C). In this manner, a passive matrix display device in which the electrode 101 or the electrode 114 is formed in the whole of the pixel portion is fabricated. In other words, in the entire region facing a region in which the electrode 100 is formed, the electrode 101 or the electrode 114 can be formed. With such a structure, an electric field is almost uniformly applied to the pixel portion; therefore, a display device in which display defects are reduced can be obtained. Note that FIG. 43D is a diagram in which the contact hole 116 and the electrode 114 in FIG. 43C are extracted.

Figure 7:
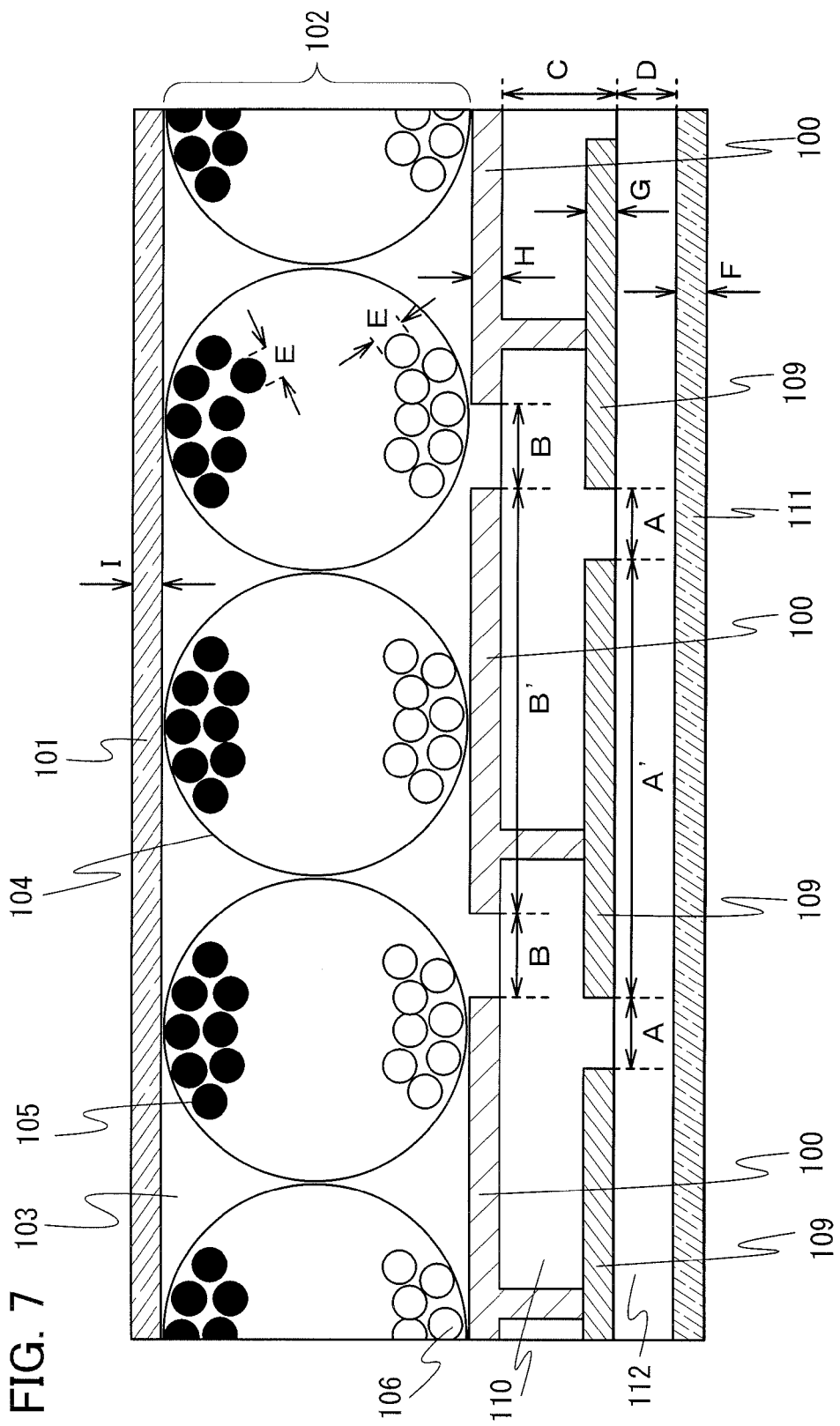
FIG. 7 is a cross-sectional view in accordance with an embodiment of the present invention.

As in FIG. 7, the electrode 109 can function as an electrode of a storage capacitor. FIG. 7 shows a structure in which a wiring 111 and an insulating film 112 are added to the structure in FIG. 1. Note that the wiring 111 may have a function as a capacitor wiring. The other structure is similar to the structure in FIG. 1, and description of the other structure is omitted. In FIG. 7, the electrode 109 is provided to overlap at least part of a region between the adjacent electrodes 100 and to overlap the wiring 111 with the insulating film 112 provided therebetween. In such a structure, the electrode 109 can have a function as an electrode of a storage capacitor and a function as an auxiliary electrode.

The area of the electrode 100 and the area of the electrode 109 may be approximately equal to each other. A cross-sectional view in FIG. 7 shows such a structure by illustrating the width of the electrode 109 (A') and the width of the electrode 100 (B') to be approximately equal to each other. Alternatively, a distance between the adjacent electrodes 109 (A) and a distance between the adjacent electrodes 100 (B) may be approximately equal to each other. With such a structure, the area of the electrode 109 and the area of the electrode 100 can be larger. Therefore, capacitance value can be larger. Note that an example of an embodiment is not limited to the structure.

The thickness of the insulating film 112 (D) is preferably smaller than the thickness of the insulating film 110 (C). Thus, the capacitance can be larger. Alternatively, the evenness of the surface of the electrode 100 can be improved. Note that an example of an embodiment is not limited to the structure.

The distance between the adjacent electrodes 109 (A) is preferably larger than the thickness of the insulating film 112 (D). Thus, the capacitance can be larger. Note that an example of an embodiment is not limited to the structure.

The distance between the adjacent electrodes 100 (B) is preferably larger than the thickness of the insulating film 110 (C). Alternatively, the distance between the adjacent electrodes 100 (B) is preferably larger than the thickness of the electrode 100 (H). Alternatively, the distance between the adjacent electrodes 100 (B) is preferably larger than the thickness of the electrode 109 (G). Alternatively, the distance between the adjacent electrodes 100 (B) is preferably larger than the thickness of the wiring 111 (F). With a large distance between the adjacent electrodes 100 (B), a short circuit can be prevented even when dust is attached between the adjacent electrodes 100. According to an example of this embodiment, an electric field is uniformly applied to the pixel portion even when the distance between the adjacent electrodes 100 (B) is large. Note that an example of an embodiment is not limited to the structure.

The diameter of a particle (E) is preferably smaller than the distance between the adjacent electrodes 109 (A). Alternatively, the diameter of the particle (E) is preferably smaller than the distance between the adjacent electrodes 100 (B). Thus, the high definition display can be realized. Note that an example of an embodiment is not limited to the structure.

The thickness of the wiring 111 (F) is preferably larger than the thickness of the electrode 100 (H). Alternatively, the thickness of the wiring 111 (F) is preferably larger than the thickness of the electrode 101 (I). Thus, the resistance of the wiring 111 can be reduced. Note that an example of an embodiment is not limited to the structure.

The thickness of the electrode 109 (G) is preferably larger than the thickness of the electrode 100 (H). Alternatively, the thickness of the electrode 109 (G) is preferably larger than the thickness of the electrode 101 (I). Thus, the resistance of the electrode 109 can be reduced. Note that an example of an embodiment is not limited to the structure.

The thickness of the electrode 101 (I) is preferably larger than the thickness of the electrode 100 (H). Thus, the resistance of the electrode 101 can be reduced. Note that an example of an embodiment is not limited to the structure.

Figure 8:
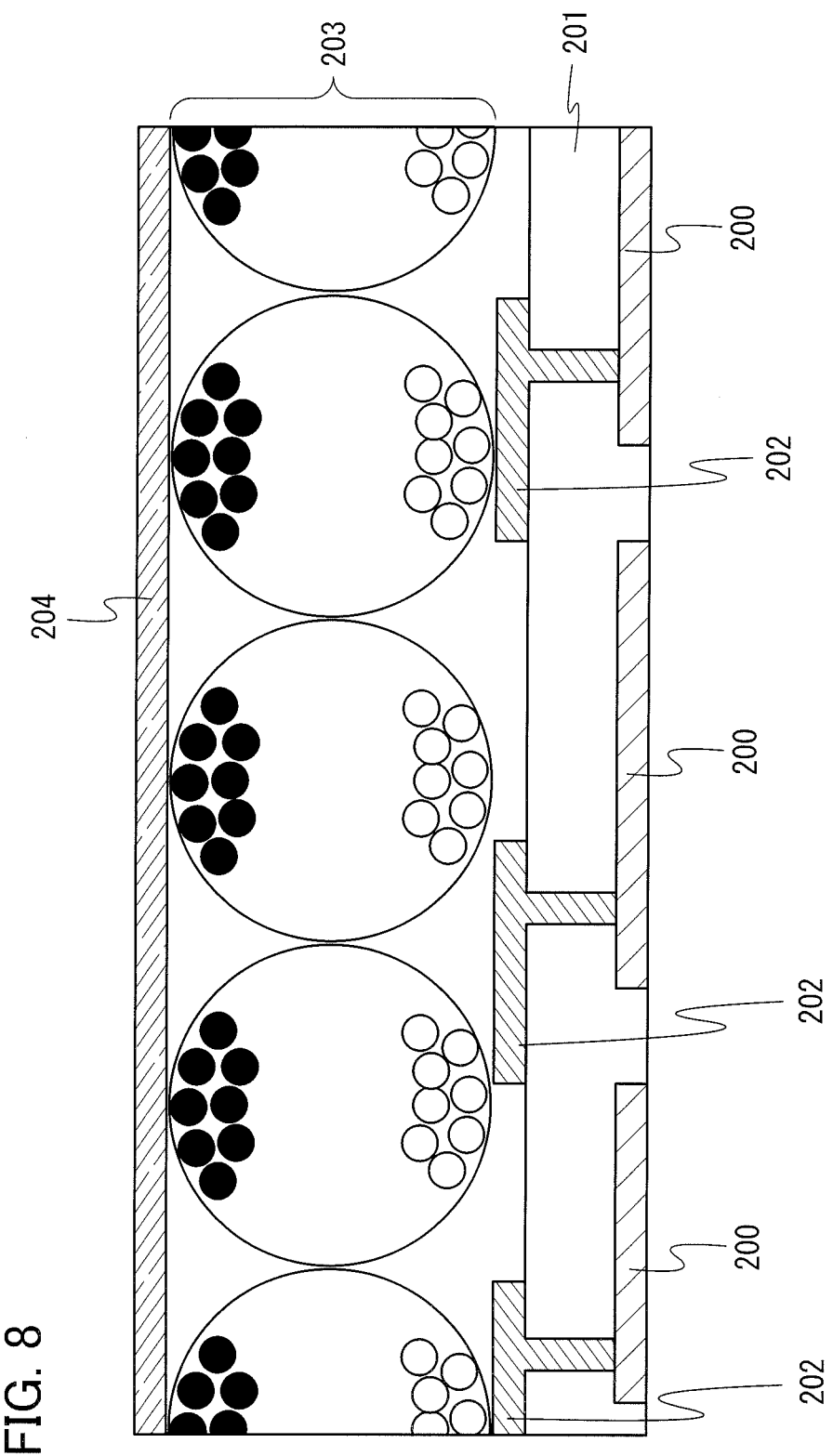
FIG. 8 is a cross-sectional view in accordance with an embodiment of the present invention.

As shown in FIG. 8, an example of an electric field driving display device of the present invention may be a structure as follows: an insulating film is formed over an electrode 200; a contact hole is provided in the insulating film 201; and an electrode 202 formed over the insulating film 201 is connected to the electrode 200. The electrode 202 is provided so as to overlap at least part of a region between adjacent two electrodes 200. In other words, viewing the top and the bottom of the display device, the adjacent two electrodes 200 are provided apart from each other and the electrode 202 is in a space between adjacent two electrodes 200. Here, the electrode 200 can function as a pixel electrode and the electrode 202 can function as an auxiliary electrode. In this specification, the auxiliary electrode has the same or smaller area than that of the pixel electrode.

A layer 203 is formed, provided, or attached between the electrode 202 and an electrode 204. The electrode 204 can function as a counter electrode. The layer 203 includes a display medium. The layer 203 can include a particle when the layer 203 is formed. Alternatively, the particle included in the layer 203 can be electrically charged. Such a particle is referred to as a charged particle. The layer 203 has a structure in which a microcapsule is dispersed in a dispersant and fixed. An adhesive layer, a bonding layer, or the like can be formed between the electrode 202 and the layer 203 or between the electrode 204 and the layer 203, for example.

In FIG. 8, since the electrode 200 is electrically connected to the electrode 202, voltages applied to the electrode 200 and the electrode 202 are equivalent to each other. In addition, because a thickness of the insulating film 110 is a few nm to 2 μm while a thickness of the layer 102 is 40 μm to 200 μm, for example, a distance between the electrode 200 and the electrode 204 and a distance between the electrode 202 and the electrode 204 can be regarded as substantially the same. Therefore, when operation for rewriting a display image is performed, the electric field applied from the electrode 200 to the electrode 204 and the electric field applied from the electrode 202 to the electrode 204 are substantially the same. Therefore, particles in a microcapsule provided over a region between the adjacent two electrodes 200 (over the electrode 202) move and aggregation of particles can be reduced in a display region, as in a microcapsule provided over the electrode 200. In other words, in both a display region of the microcapsule provided over the electrode 200 and a display region of the microcapsule provided over the electrode 202, display reflecting operation for rewriting a display image can be performed. Thus, an electric field driving display device or the like, in which a residual image is less likely to occur, can be fabricated.

Figure 9:
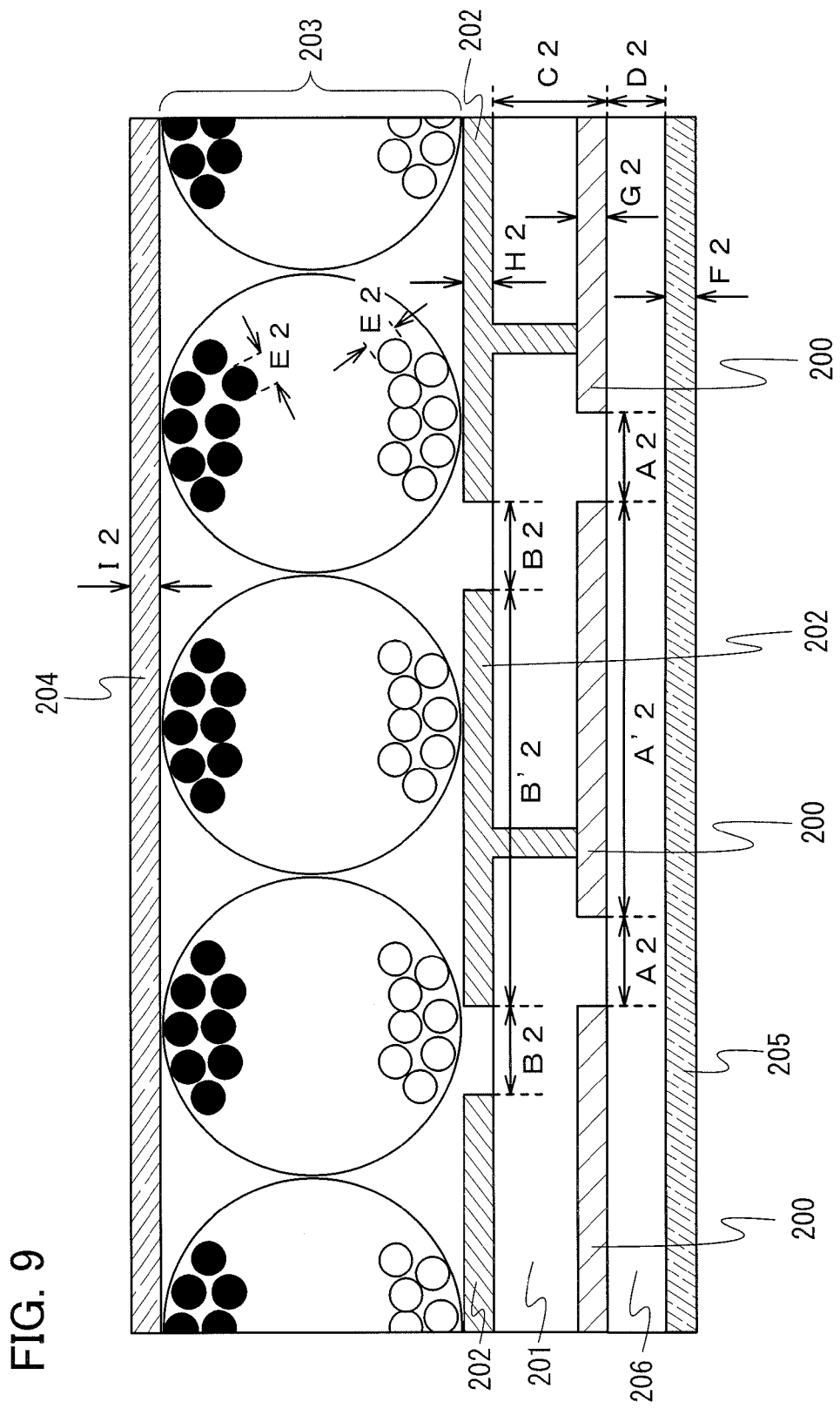
FIG. 9 is a cross-sectional view in accordance with an embodiment of the present invention.

As in FIG. 9, the electrode 202 can function as an electrode of a storage capacitor. FIG. 9 shows a structure in which a wiring 205 and an insulating film 206 are added to the structure in FIG. 8. Note that the wiring 205 may have a function as a capacitor wiring. The other structure is similar to the structure in FIG. 1, and description of the other structure is omitted. In FIG. 9, the electrode 202 is provided to overlap at least part of a region between the adjacent electrodes 200 and to overlap the wiring 205 with the insulating films 201 and 206 provided therebetween. In such a structure, the electrode 202 can have a function as an electrode of a storage capacitor and a function as an auxiliary electrode.

The area of the electrode 200 and the area of the electrode 202 may be approximately equal to each other. A cross-sectional view in FIG. 9 shows such a structure by illustrating the width of the electrode 202 (B'2) and the width of the electrode 200 (A'2) to be approximately equal to each other. Alternatively, a distance between the adjacent electrodes 202 (B2) and a distance between the adjacent electrodes 200 (A2) may be approximately equal to each other. With such a structure, the area of the electrode 202 and the area of the electrode 200 can be larger. Therefore, capacitance value can be larger. Note that an example of an embodiment is not limited to the structure.

The thickness of the insulating film 206 (D2) is preferably smaller than the thickness of the insulating film 201 (C2). Thus, the capacitance can be larger. Alternatively, the evenness of the surface of the electrode 200 can be improved. Note that an example of an embodiment is not limited to the structure.

The distance between the adjacent electrodes 200 (A2) is preferably larger than the thickness of the insulating film 206 (D2). Thus, the capacitance can be larger. Note that an example of an embodiment is not limited to the structure.

The distance between the adjacent electrodes 202 (B2) is preferably larger than the thickness of the insulating film 110 (C2). Alternatively, the distance between the adjacent electrodes 202 (B2) is preferably larger than the thickness of the electrode 202 (H2). Alternatively, the distance between the adjacent electrodes 202 (B2) is preferably larger than the thickness of the electrode 200 (G2). Alternatively, the distance between the adjacent electrodes 202 (B2) is preferably larger than the thickness of the wiring 205 (F2). With a large distance between the adjacent electrodes 202 (B2), a short circuit can be prevented. According to an example of this embodiment, an electric field is uniformly applied to the pixel portion even when the distance between the adjacent electrodes 202 (B2) is large. Note that an example of an embodiment is not limited to the structure.

The diameter of the particle (E2) is preferably smaller than the distance between the adjacent electrodes 200 (A2). Alternatively, the diameter of the particle (E2) is preferably smaller than the distance between the adjacent electrodes 202 (B2). Thus, the high definition display can be realized. Note that an example of an embodiment is not limited to the structure.

The thickness of the wiring 205 (F2) is preferably larger than the thickness of the electrode 202 (H2). Alternatively, the thickness of the wiring 205 (F2) is preferably larger than the thickness of the electrode 204 (I2). Thus, the resistance of the wiring 205 can be reduced. Note that an example of an embodiment is not limited to the structure.

The thickness of the electrode 200 (G2) is preferably larger than the thickness of the electrode 202 (H2). The thickness of the electrode 200 (G2) is preferably larger than the thickness of the electrode 204 (I2). Thus, the resistance of the electrode 200 can be reduced. Note that an example of an embodiment is not limited to the structure.

The thickness of the electrode 204 (I2) is preferably larger than the thickness of the electrode 202 (H2). Thus, the resistance of the electrode 204 can be reduced. Note that an example of an embodiment is not limited to the structure.

Note that this embodiment can be combined with the structure described in any of the other embodiments in this specification as appropriate.

Embodiment 2

In this embodiment, a structure example of an electric field driving display device of the present invention will be described.

An example of display element types of an electric field driving display device is a display element adopting an electrophoresis mode, rotating particle mode, moving particle mode, or the like. In this manner, in the electric field driving display device, a particle, a stick, and a tube moves or rotates in accordance with an electric field, whereby reflectance can be changed, and grayscale is expressed. In Embodiment 1, an electric field driving display device to which a microcapsule electrophoresis mode is applied has been described. In this embodiment, a microcup electrophoresis mode and an Electronic Liquid Powder (registered trademark) mode will be described.

Figure 10A:
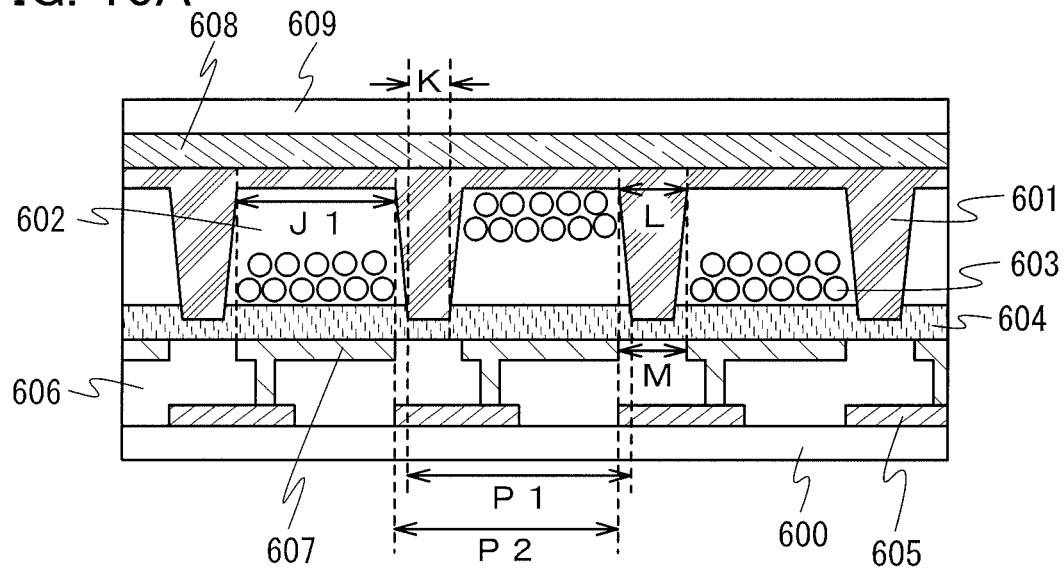
FIGS. 10A and 10B are cross-sectional views in accordance with an embodiment of the present invention.
Figure 10B:
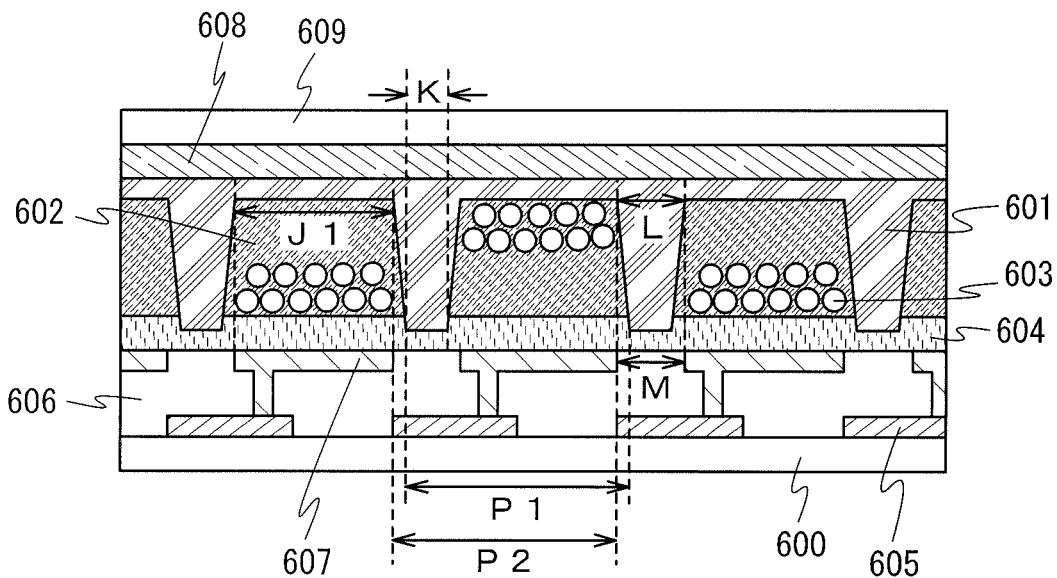

The microcup electrophoresis mode is described with reference to FIGS. 10A and 10B, FIGS. 11A and 11B, FIGS. 12A and 12B, FIGS. 12A and 12B, FIGS. 13A and 13B, FIGS. 14A and 14B, and FIGS. 15A and 15B. A microcup array can be formed in the following manner: a microcup 601 that is formed using a UV curable resin or the like and has a plurality of recessed portions is filled with charged pigment particles 603 dispersed in a dielectric solvent 602, and sealing is performed with a sealing layer 604. FIGS. 10A and 10B show a display device in which an electrode 605 is formed over a substrate 600, an insulating film 606 is formed over the electrode 605, a contact hole is formed in the insulating film 606, an electrode 607 electrically connected to the electrode 605 is formed, a microcup array is formed over the electrode 607, an electrode 608 is formed over the microcup array, and a substrate 609 is formed over the electrode 608. The electrode 607 can function as a pixel electrode. The electrode 605 can function as an auxiliary electrode. In FIG. 10A, the dielectric solvent 602 is an unpigmented solvent. In FIG. 10B, the dielectric solvent 602 is a pigmented solvent colored in red, blue, or the like. FIGS. 10A and 10B show the case where one kind of charged pigment particles is used; alternatively, two or more kinds of charged pigment particles may be used.

The microcup has a wall by which cells are separated, and thus has sufficiently high resistance to shock and pressure. Moreover, since the components of the microcup are tightly sealed, adverse effects due to change in environment can be reduced. In an electric field driving display device employing the microcup electrophoresis mode, an electrically charged pigment particle moves in accordance with change in an electric field between an electrode which can function as a pixel electrode and an electrode which can function as a counter electrode; therefore, particles aggregates in a corner of a microcup in some cases, and a residual image might occur.

The electric field driving display device each illustrated in FIGS. 10A and 10B has a structure in which a pitch P1 of a microcup and a pitch P2 of electrodes which can function as the pixel electrode are almost equal to each other. Here, in this embodiment, the sum of the length of an upper side of a microcup and the thickness of the upper part of a wall corresponds to a pitch of the microcup. For example, in FIGS. 10A and 10B, the pitch P2 of the microcup corresponds to the sum of the length J1 of the upper side of the microcup and the thickness L of the upper part of a wall. Note that in the case where a microcup array is formed by repeatedly providing a plurality of structure units, the longitude length or the horizontal length of the structure unit is sometimes referred to as a pitch of a microcup. In that case, the structure unit includes one of a plurality of recessed portions.

The electrode 607 is formed to have the size corresponding to the upper surface of the microcup. In other words, the electrode 607 is formed to overlap the upper surface of the microcup and to be approximately equal to the length J1 of an upper side of the microcup in the cross-sectional view. The electrode 605 electrically connected to the electrode 607 is formed. With such a structure, an electric field is uniformly applied to a wall of the microcup and around the wall. Thus, an electric field is uniformly applied to the entire region in which particles move, whereby aggregation of particles can be reduced.

The thickness of the upper wall L of the microcup is larger than the thickness of the lower wall K of the microcup. Thus, the strength of the wall of the microcup is increased.

The thickness of the upper wall L of the microcup and a distance M between the electrodes 607 adjacent to each other are approximately equal. Thus, an electric field is uniformly applied to the entire region in which particles move.

Figure 11A:
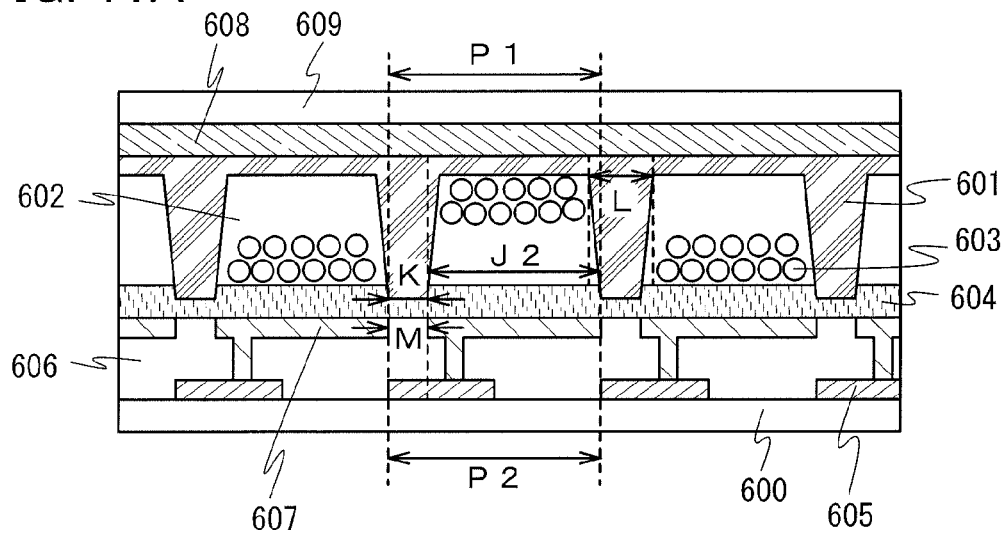
FIGS. 11A and 11B are cross-sectional views in accordance with an embodiment of the present invention.
Figure 11B:
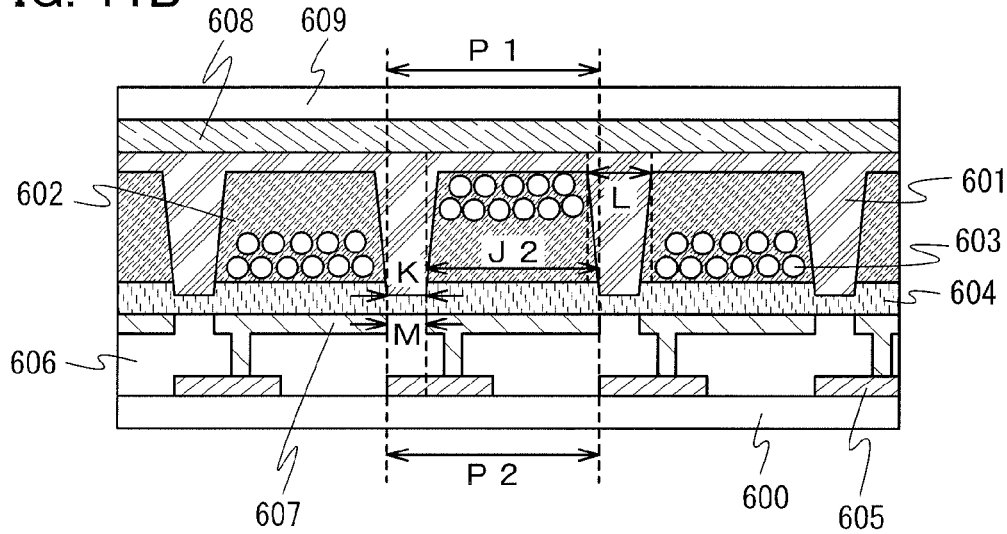

The electric field driving display device each illustrated in FIGS. 11A and 11B has a structure in which the pitch P1 of the microcup and the pitch P2 of the electrodes which can function as the pixel electrode are almost equal to each other. Note that the structures in FIGS. 11A and 11B are different from those in FIGS. 10A and 10B.

In FIG. 11A, the dielectric solvent 602 is an unpigmented solvent. In FIG. 11B, the dielectric solvent 602 is a pigmented solvent colored in red, blue, or the like.

The electrode 607 is formed to have the size corresponding to the bottom surface of the microcup. In other words, the electrode 607 is formed to overlap the bottom surface of the microcup and to be approximately equal to the length J2 of a bottom side of the microcup in the cross-sectional view. The electrode 605 electrically connected to the electrode 607 is formed. With such a structure, an electric field is uniformly applied to a wall of the microcup. Therefore, aggregation of particles can be reduced.

The distance M between the electrodes 607 adjacent to each other is smallser than the thickness of the upper wall L of the microcup. Therefore, an electric field is uniformly applied to the wall of the microcup. Therefore, aggregation of particles can be reduced. Alternatively, the strength of the wall of the microcup is increased.

The thickness of the upper wall L of the microcup is larger than the thickness of the lower wall K of the microcup. Thus, the strength of the wall of the microcup is increased.

The thickness of the lower wall K of the microcup and the distance M between the electrodes 607 adjacent to each other are approximately equal to each other. Thus, an electric field can be applied effectively.

Figure 12A:
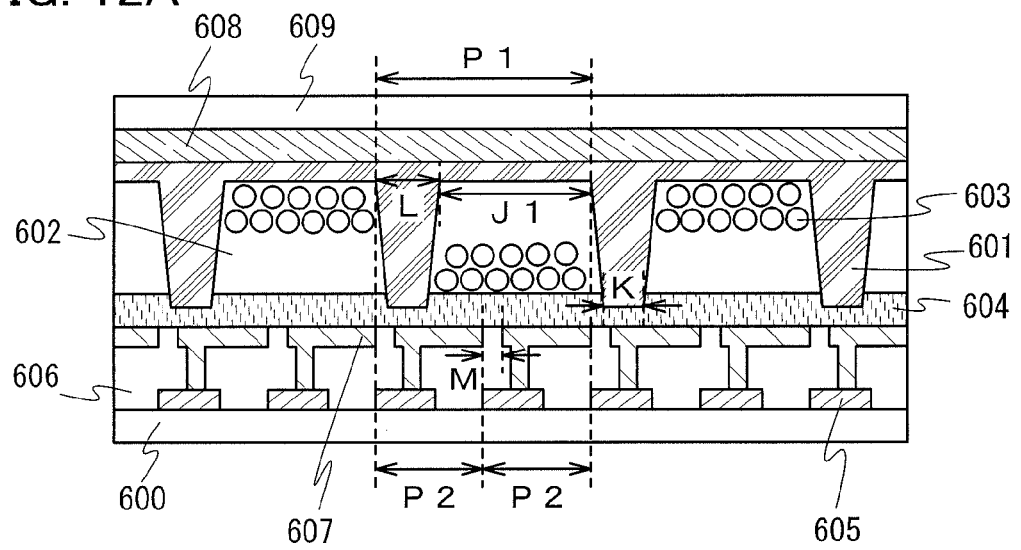
FIGS. 12A and 12B are cross-sectional views in accordance with an embodiment of the present invention.
Figure 12B:
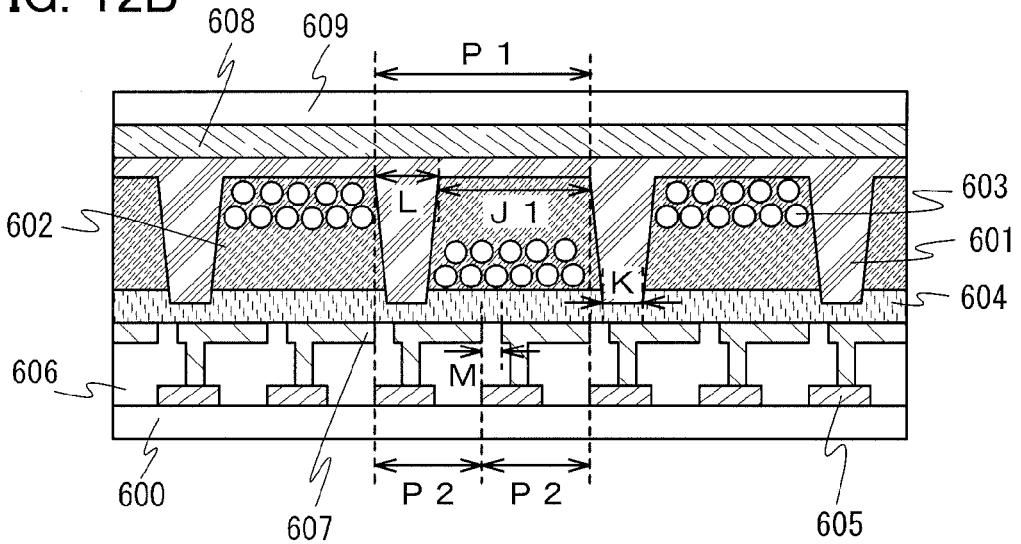

In FIGS. 10A and 10B and FIGS. 11A and 11B, an electric field driving display device has a structure in which the pitch P1 of the microcup and the pitch P2 of the electrodes which can function as the pixel electrode are almost equal to each other. FIGS. 12A and 12B illustrate an electric field driving display device in which the pitch P1 of the microcup is twice as large as the pitch P2 of the electrodes which can function as the pixel electrode. Note that FIGS. 12A and 12B illustrate the structure in which the pitch P1 is twice as large as the pitch P2, but the pitch P1 can be an integral multiple (double or more) of the pitch P2; accordingly, uniform display can be performed more easily.

In FIG. 12A, the dielectric solvent 602 is an unpigmented solvent. In FIG. 12B, the dielectric solvent 602 is a pigmented solvent colored in red, blue, or the like.

In FIGS. 12A and 12B, the electrode 607 is formed so that the end to the electrode 607 corresponds to the end of the upper wall of the microcup.

The thickness of the upper wall L of the microcup is larger than the thickness of the lower wall K of the microcup. Thus, the strength of the wall of the microcup is increased.

The thickness of the upper wall L of the microcup is smaller than the distance M between the electrodes 607 adjacent to each other. Thus, an electric field is uniformly applied to the entire region in which particles move.

The distance M between the electrodes 607 adjacent to each other is smaller than the thickness of the lower wall K of the microcup. Thus, an electric field is uniformly applied to the entire region in which particles move.

The electric field driving display device each illustrated in FIGS. 12A and 12B has a structure in which the pitch P1 of the microcup is twice as large as the pitch P2 of the electrodes which can function as the pixel electrode. Note that the structures in FIGS. 13A and 13B are different from those in FIGS. 12A and 12B.

Figure 13A:
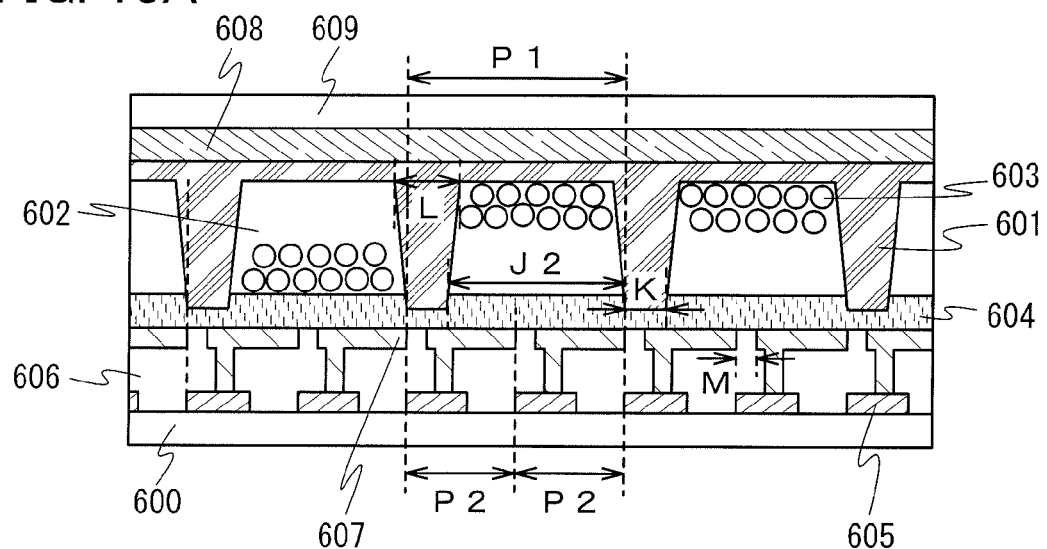
FIGS. 13A and 13B are cross-sectional views in accordance with an embodiment of the present invention.

In FIG. 13A, the dielectric solvent 602 is an unpigmented solvent. In FIG. 13B, the dielectric solvent 602 is a pigmented solvent colored in red, blue, or the like.

Figure 13B:
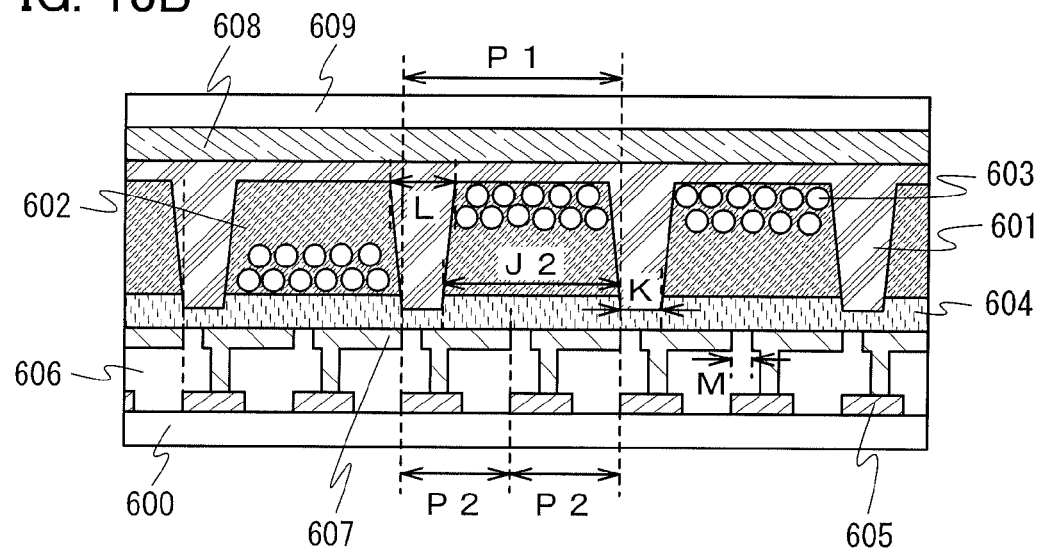

In FIGS. 13A and 13B, the electrode 607 is formed so that the end to the electrode 607 corresponds to the end of the lower wall of the microcup.

The thickness of the upper wall L of the microcup is larger than the thickness of the lower wall K of the microcup. Thus, the strength of the wall of the microcup is increased.

The thickness of the upper wall L of the microcup is smaller than the distance M between the electrodes 607 adjacent to each other. Thus, an electric field is uniformly applied to the entire region in which particles move.

The distance M between the electrodes 607 adjacent to each other is smaller than the thickness of the lower wall K of the microcup. Thus, an electric field is uniformly applied to the entire region in which particles move.

Figure 14A:
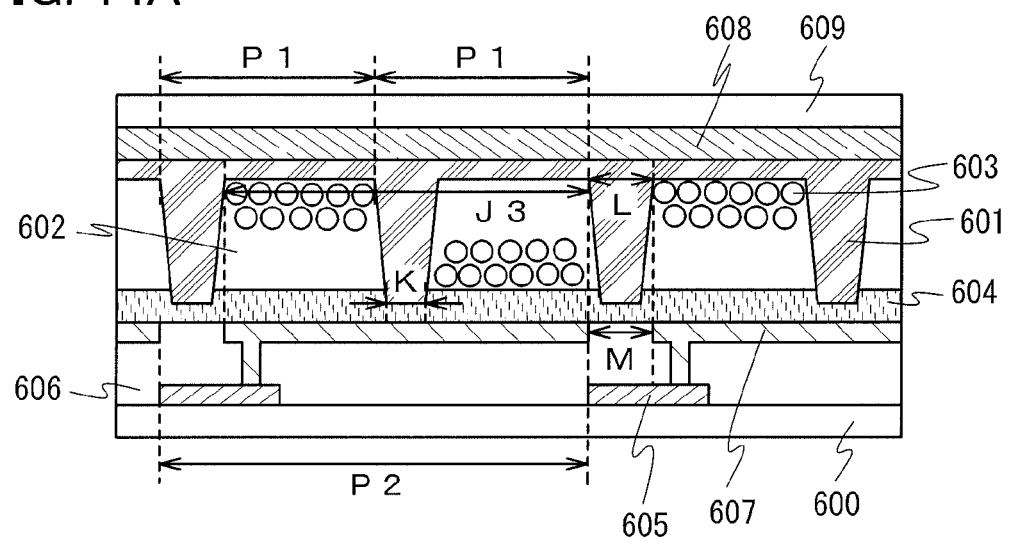
FIGS. 14A and 14B are cross-sectional views in accordance with an embodiment of the present invention.
Figure 14B:
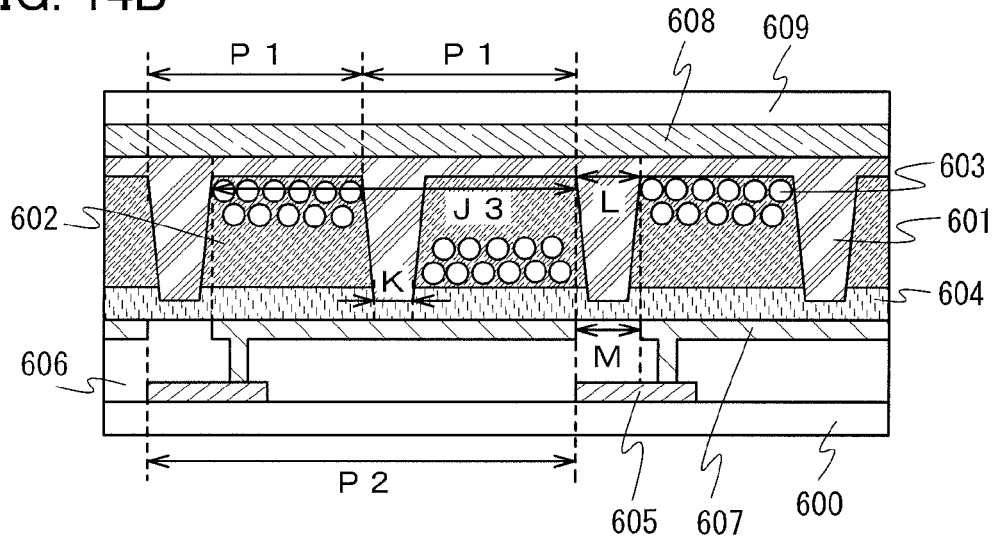

An electric field driving display device illustrated each in FIGS. 14A and 14B has a structure in which the pitch P1 of the microcup is half of the pitch P2 of the electrodes which can function as the pixel electrode. Note that FIGS. 14A and 14B illustrate the structure in which the pitch P1 is half of the pitch P2, but the pitch P1 can be 1/n (n is an integer over 2) of the pitch P2; accordingly, uniform display can be performed more easily.

In FIG. 14A, the dielectric solvent 602 is an unpigmented solvent. In FIG. 14B, the dielectric solvent 602 is a pigmented solvent colored in red, blue, or the like.

The electrode 607 is formed to have the size corresponding to the upper surface of two microcups. In other words, the electrode 607 is formed to be approximately equal to the length J3 of the sum of an upper side of two microcups and the width of the upper side of the wall existing between two microcups in the cross-sectional view. With such a structure, an electric field is uniformly applied to a wall of the microcup and around the wall. Thus, an electric field is uniformly applied to the entire region in which particles move, whereby aggregation of particles can be reduced.

The thickness of the upper wall L of the microcup is larger than the thickness of the lower wall K of the microcup. Thus, the strength of the wall of the microcup is increased.

The thickness of the upper wall L of the microcup and a distance M between the electrodes 607 adjacent to each other are approximately equal. Thus, an electric field is uniformly applied to the entire region in which particles move.

Figure 15A:
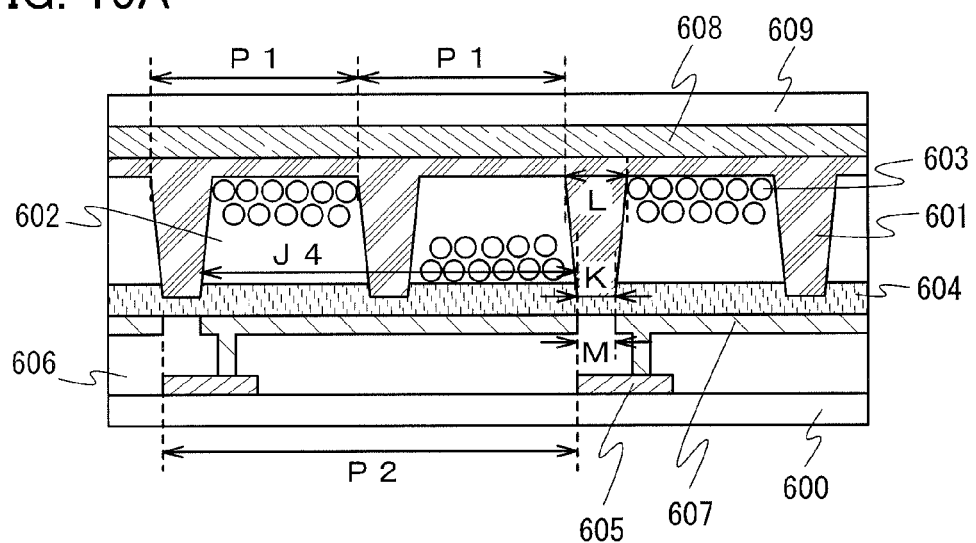
FIGS. 15A and 15B are cross-sectional views in accordance with an embodiment of the present invention.
Figure 15B:
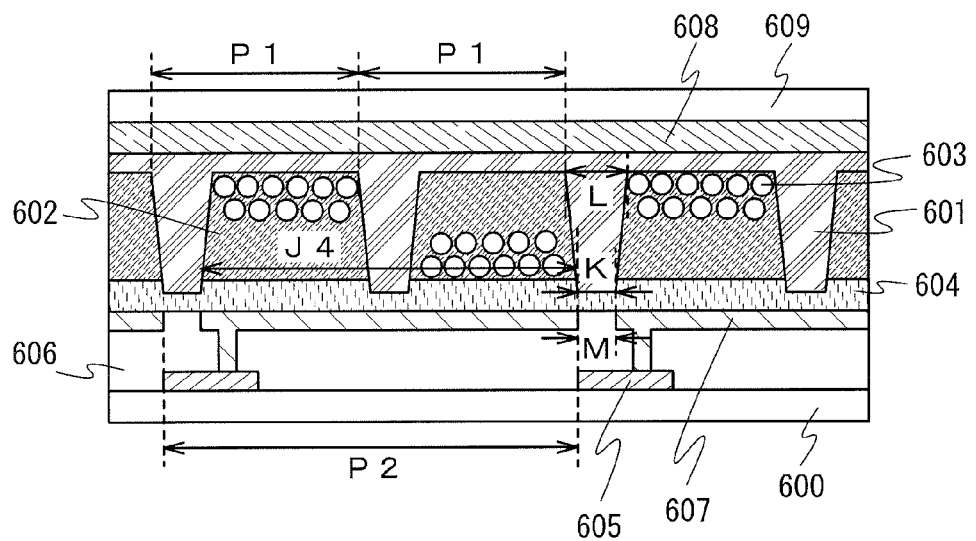

The electric field driving display device each illustrated in FIGS. 15A and 15B has a structure in which the pitch P1 of the microcup is half of the pitch P2 of the electrodes which can function as the pixel electrodes. Note that the structures in FIGS. 15A and 15B are different from those in FIGS. 14A and 14B.

The electrode 607 is formed to have the size corresponding to the bottom surface of two microcups. In other words, the electrode 607 is formed to be approximately equal to the length J4 of the sum of the bottom side of two microcups and the width of the bottom side of the wall existing between two microcups in the cross-sectional view. With such a structure, an electric field is uniformly applied to a wall of the microcup and around the wall. Thus, an electric field is uniformly applied to the entire region in which particles move, whereby aggregation of particles can be reduced.

The thickness of the lower wall K of the microcup is smaller than the thickness of the upper wall L of the microcup. Thus, the strength of the wall of the microcup is increased.

The thickness of the lower wall K of the microcup and the distance M between the electrodes 607 adjacent to each other are equal to each other. Thus, an electric field can be applied effectively.

As shown in FIGS. 10A and 10B, FIGS. 11A and 11B, FIGS. 12A and 12B, FIGS. 13A and 13B, FIGS. 14A and 14B, and FIGS. 15A and 15B, the electrode 605 is formed to overlap at least part of a region between the adjacent electrodes 607. Therefore, aggregation of the charged pigment particles 603 in the corner of the microcup 601 can be reduced and an electric field driving display device in which a residual image is less likely to occur can be fabricated. Note that an electrophoresis mode electric field driving display device to which an embodiment of the present invention can be applied does not necessarily use a microcup; anything can be used as long as movement of particles from side to side and up and down is blocked by a given object so that movement of particles is limited.

The Electronic Liquid Powder mode will be described with reference to FIGS. 16A and 16B, FIGS. 17A and 17B, and FIGS. 18A and 18B. Electronic Liquid Powder is a very powdery solid with fluidity and is a substance having properties of fluid and properties of a particle. In this method, cells are separated by partitions 701, and the Electronic Liquid Powder 702 and Electronic Liquid Powder 703 are placed in the cell.

Figure 16A:
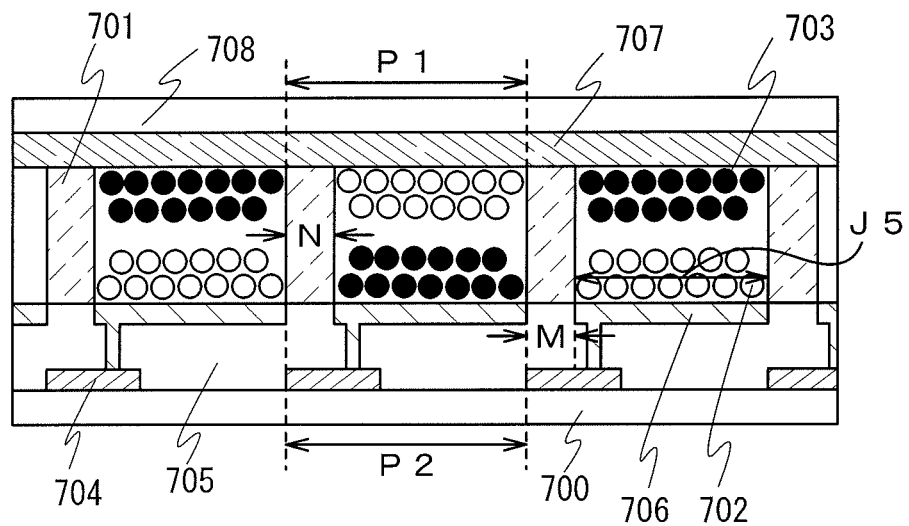
FIGS. 16A and 16B are cross-sectional views in accordance with an embodiment of the present invention.
Figure 16B:
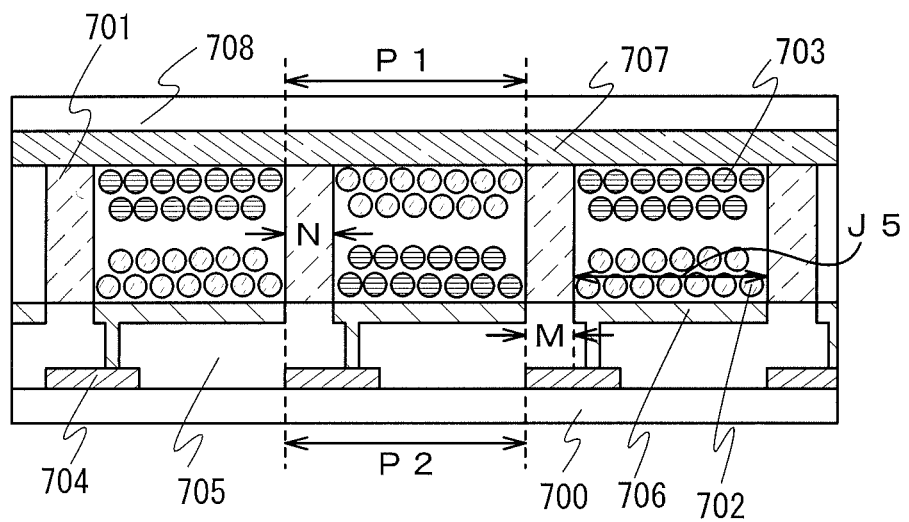

Electric field driving display devices in FIGS. 16A and 16B each have a structure in which the pitch P1 of the cell and the pitch P2 of the electrodes which can function as the pixel electrode are almost equal to each other. Here, in this embodiment, the sum of the length (width) of a cell and the length (width) of a partition corresponds to a pitch of the cell. For example, in FIGS. 16A and 16B, the pitch P1 of the cell corresponds to the sum of the length (width) J5 of the cell and the length (width) N of a partition corresponds to a pitch of the cell.

FIGS. 16A and 16B are display devices each of which is formed as follows: an electrode 704 is formed over a substrate 700, an insulating film 705 is formed over the electrode 704, a contact hole is formed in the insulating film 705, an electrode 706 electrically connected to the electrode 704 is formed, a cell including Electronic Liquid Powder is provided over the electrode 706, an electrode 707 is formed over the cell, and a substrate 708 is formed over 707. As the Electronic Liquid Powder 702 and the Electronic Liquid Powder 703, white particles and black particles are used in FIG. 16A and particles of two colors other than white and black are used in FIG. 16B; however, the structure is not limited to this and only one kind of particle may be used.

The electrode 706 is formed to have the size corresponding to the cell. In other words, the electrode 706 is formed to be approximately equal to the length (width) J5 of the cell in the cross-sectional view. The electrode 704 electrically connected to the electrode 706 is formed. With such a structure, an electric field is uniformly applied to around the partition of the cell. Thus, an electric field is uniformly applied to the entire region in which particles move, whereby aggregation of particles can be reduced.

The length of the partition (width) N and the distance M between the electrodes 706 adjacent to each other are approximately equal. Thus, an electric field is uniformly applied to the entire region in which Electronic Liquid Powder moves.

Figure 17A:
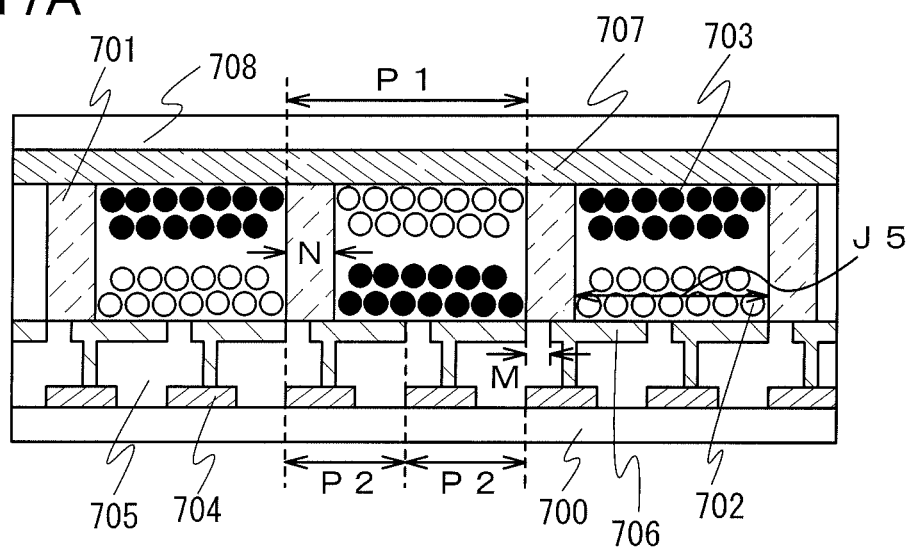
FIGS. 17A and 17B are cross-sectional views in accordance with an embodiment of the present invention.
Figure 17B:
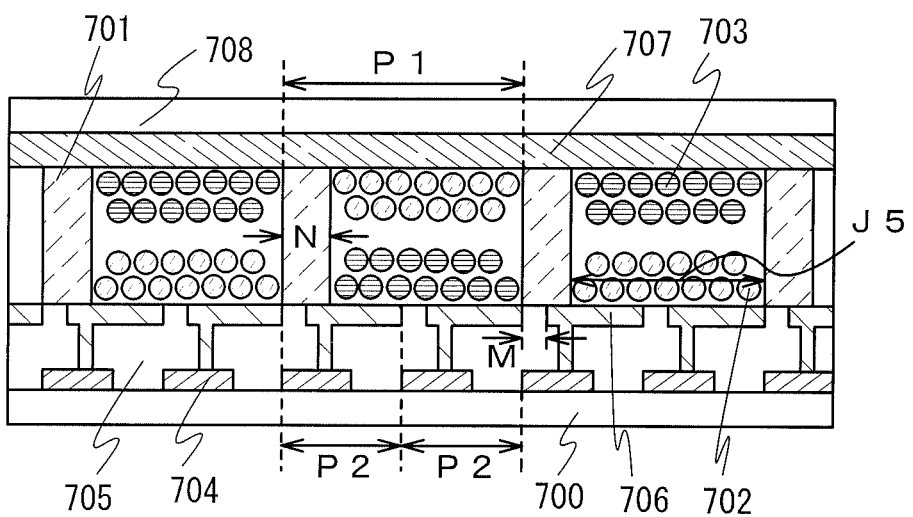

Electric field driving display devices in FIGS. 17A and 17B has a structure in which the pitch P1 of the cell is twice as large as the pitch P2 of the electrodes which can function as the pixel electrode. In other words, the length (width) J5 of the cell is twice as large as the width of the pitch P2 of the electrodes which can function as the pixel electrode. Note that FIGS. 17A and 17B illustrate the structure in which the pitch P1 is twice as large as the pitch P2, but the pitch P1 can be an integral multiple (double or more) of the pitch P2; accordingly, uniform display can be performed more easily.

As the Electronic Liquid Powder 702 and the Electronic Liquid Powder 703, white particles and black particles are used in FIG. 17A and particles of two colors other than white and black are used in FIG. 17B; however, the structure is not limited to this and only one kind of particle may be used.

The distance M between the electrodes 706 adjacent to each other is smaller than the length of the partition (width) N. Thus, an electric field is uniformly applied to the entire region in which Electronic Liquid Powder moves.

Figure 18A:
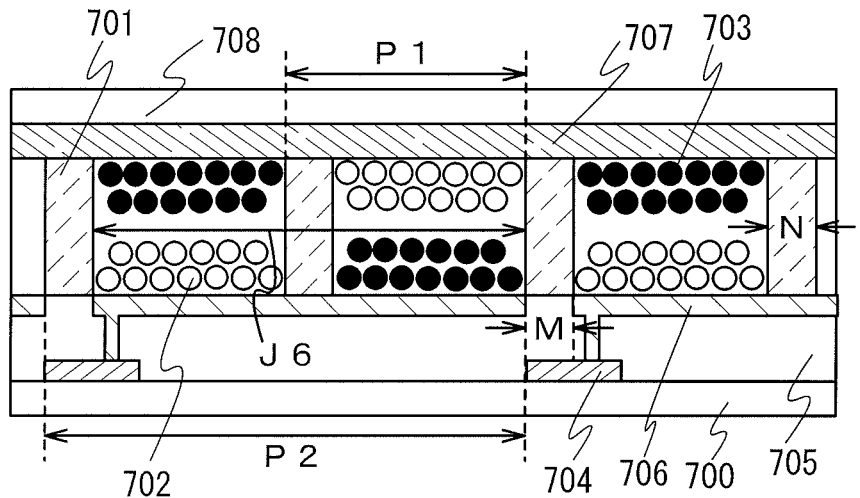
FIGS. 18A and 18B are cross-sectional views in accordance with an embodiment of the present invention.
Figure 18B:
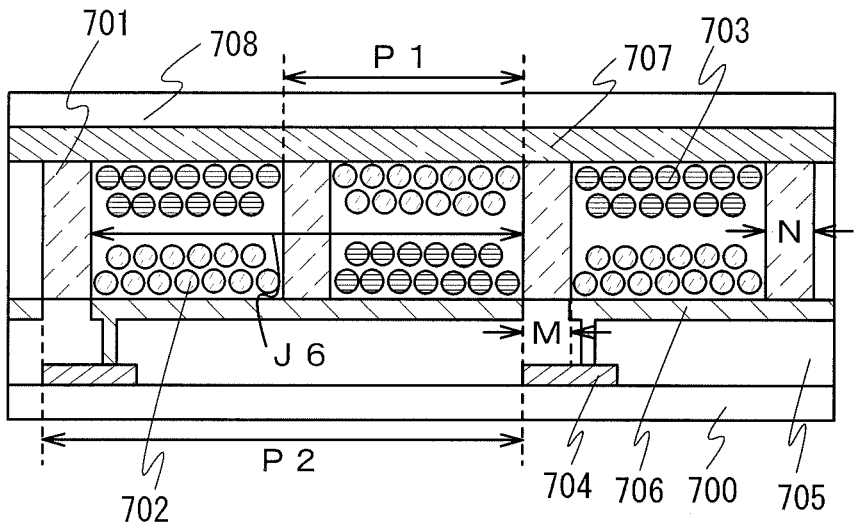

En electric field driving display devices in FIGS. 18A and 18B has a structure in which the pitch P1 of the cell is half of the pitch P2 of the electrodes which can function as the pixel electrode. In other words, the length of the electrode 706 is formed to be equal to the length (J6) of the sum of the length of two cells and the length of the partition between the two cells. Note that FIGS. 18A and 18B illustrate the structure in which the pitch P1 is half of the pitch P2, but the pitch P1 can be equivalent to 1 over an integer, which is two or more, of the pitch P2; accordingly, uniform display can be performed easily.

As the Electronic Liquid Powder 702 and the Electronic Liquid Powder 703, white particles and black particles are used in FIG. 18A and particles of two colors other than white and black are used in FIG. 18B; however, the structure is not limited to this and only one kind of particle may be used.

The length of the partition (width) N and the distance M between the electrodes 706 adjacent to each other are approximately equal. Thus, an electric field is uniformly applied to the entire region in which Electronic Liquid Powder moves.

In an electric field driving display device employing the Electronic Liquid Powder mode, Electronic Liquid Powder moves in accordance with change in electric field between a pixel electrode and a counter electrode; therefore, a residual imgage is likely to occur when a cell is provided over the pixel electrode. As shown in FIGS. 16A and 16B, FIGS. 17A and 17B, and FIGS. 18A and 18B, the electrode 704 is formed to overlap at least part of a region between the electrodes 706 adjacent to each other. Consequently, the electric field driving display device in which a residual image is less likely to occur can be fabricated by uniform application of an electric field to Electronic Liquid Powder in the cell.

This embodiment describes the microcup electrophoresis mode and the Electronic Liquid Powder (registered trademark) mode, but a mode which can be applied to an embodiment of the present invention is not limited thereto. For example, an electrowetting mode, a toner mode, and a twist ball mode can be used.

Note that this embodiment can be combined with the structure described in any of the other embodiments in this specification as appropriate.

Embodiment 3

In this embodiment, an example of an electric field driving display device of the present invention will be described with reference to drawings.

Figure 19:
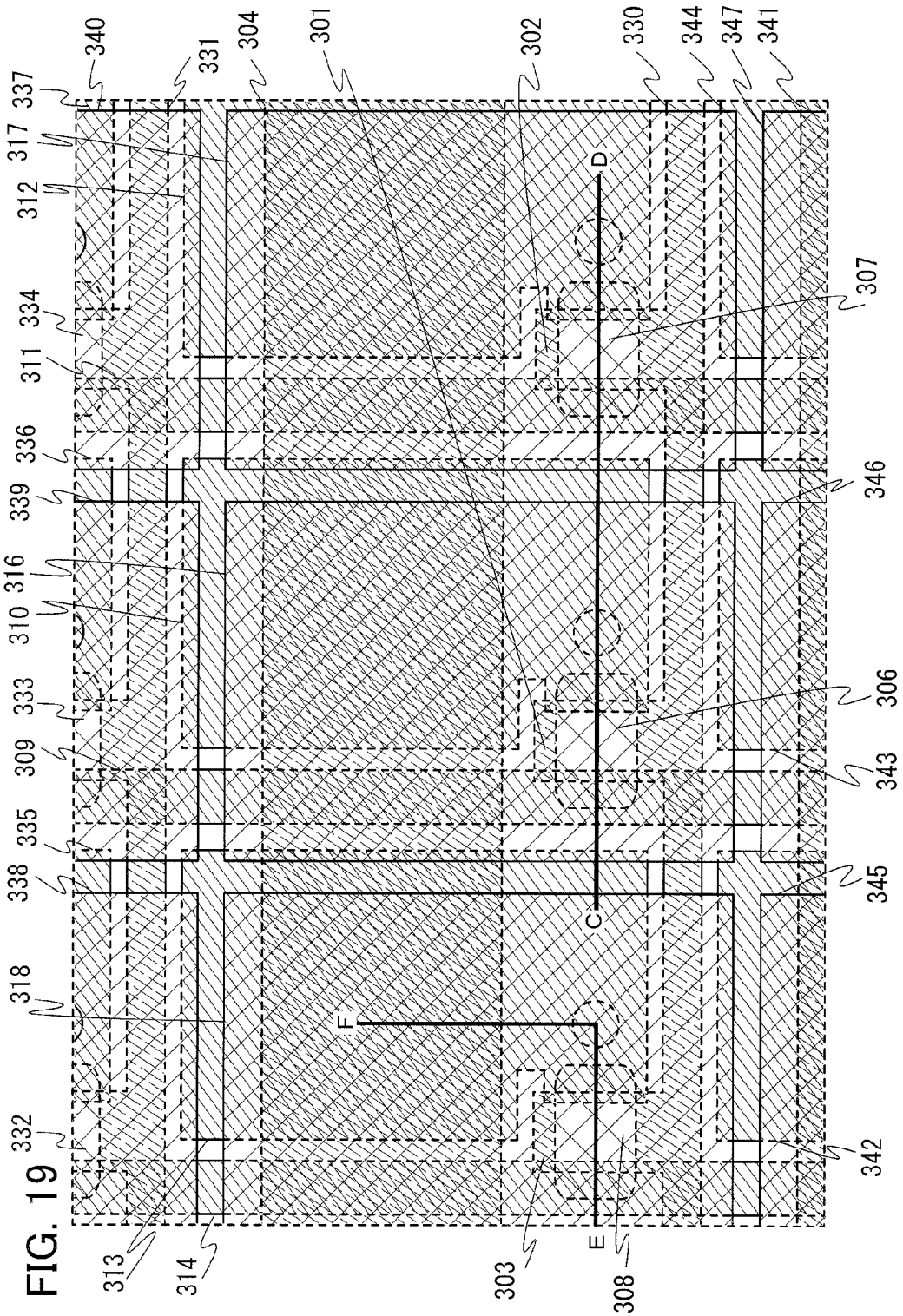
FIG. 19 is a top view in accordance with an embodiment of the present invention.

FIG. 19 is an example of a top view of an active-matrix electric field driving display device with the structure shown in FIG. 7. FIG. 20A shows a cross section C-D of FIG. 19, and FIG. 20B shows a cross section E-F of FIG. 19. Note that FIG. 19 shows electrodes 301 to 303, a wiring 304, conductive layers 309 to 314, conductive layers 335 to 337, a wiring 341, conductive layers 342 to 344, semiconductor layers 306 to 308, semiconductor layers 332 to 334, electrodes 316 to 318, electrodes 338 to 340, electrodes 345 to 347, and gate lines 330 and 331; elements other than them are omitted.

Note that the electrodes 301 to 303 can function as gate electrodes. The wiring 304 and the wiring 341 can function as capacitor wirings. The conductive layer 310, the conductive layer 312, the conductive layer 313, the conductive layers 335 to 337, and the conductive layers 342 to 344 can function as auxiliary electrodes. The electrodes 316 to 318, the electrodes 338 to 340, and the electrodes 345 to 347 can function as pixel electrodes. The conductive layer 309, the conductive layer 311, and the conductive layer 314 can function as source lines.

Structures shown in FIGS. 20A and 20B will be described. First, a conductive film is formed over a substrate 300. The conductive film is patterned to have a desired shape, so that the electrodes 301 to 303 and the wiring 304 are formed. The substrate 300 can be a glass substrate, a plastic substrate, or the like. The conductive film to be the electrodes 301 to 303 and the wiring 304 can be formed as a single layer or a multi-layer using titanium, molybdenum, tantalum, chrome, tungsten, aluminum, neodymium, copper, silver, gold, platinum, niobium, silicon, zinc, iron, barium, germanium, indium tin oxide (hereinafter, ITO), indium oxide and zinc oxide (hereinafter, IZO), zinc oxide (ZnO), and tin oxide (SnO) by sputtering, CVD, or the like. A base film may be formed over the substrate 300 before the conductive film is formed. The base film can be formed to be a single layer or stacked layers of an insulating film such as a silicon oxide-based material film or a silicon nitride-based material. Note that the silicon oxide-based material refers to silicon oxide containing oxygen and silicon as main components, or silicon oxynitride which is silicon oxide containing nitrogen, in which the content of oxygen is higher than that of nitrogen. The silicon nitride-based material refers to silicon nitride containing nitrogen and silicon as main components, or silicon nitride oxide which is silicon nitride containing oxygen, in which the content of nitrogen is higher than that of oxygen. Note that the gate line 330, the gate line 331, and the wiring 341 which are shown in FIG. 19 are formed in the same process as the electrodes 301 to 303 and the wiring 304.

An insulating film 305 is formed over the electrodes 301 to 303, the wiring 304, and the substrate 300. The insulating film 305 can be formed using a silicon oxide-based material, a silicon nitride-based material, or the like by plasma-enhanced CVD, sputtering, or the like. The insulating film 305 can function as a gate insulating film or an insulating film of a capacitor.

The semiconductor layer 306 (a semiconductor layer 306a and a semiconductor layer 306b), the semiconductor layer 307 (a semiconductor layer 307a and a semiconductor layer 307b), and the semiconductor layer 308 (a semiconductor layer 308a and a semiconductor layer 308b) are formed over the insulating film 305. The semiconductor layer 306 is formed to overlap the electrode 301 with the insulating film 305 provided therebetween. The semiconductor layer 307 is formed to overlap the electrode 302 with the insulating film 305 provided therebetween. The semiconductor layer 308 is formed to overlap the electrode 303 with the insulating film 305 provided therebetween. Note that the semiconductor layers 332 to 334 in FIG. 19 are formed in the same process as the semiconductor layers 306 to 308.

The semiconductor layers 306 to 308 may be an amorphous semiconductor layer such as amorphous silicon; microcrystalline silicon; polycrystalline silicon; single crystal silicon; a compound semiconductor such as gallium arsenide (GaAs); an oxide semiconductor such as zinc oxide (ZnO) and an In—Ga—Zn—O-based material; an organic semiconductor material; or the like. Here, an example of using amorphous silicon will be described.

The semiconductor layer 306a, the semiconductor layer 307a, and the semiconductor layer 308a can be formed using amorphous silicon by a photolithography, inkjet, printing, or the like. Note that the semiconductor layer 306a, the semiconductor layer 307a, and the semiconductor layer 308a can each include a portion functioning as a channel region of a transistor.

When amorphous silicon is used for the semiconductor layer 306a, the semiconductor layer 307a, and the semiconductor layer 308a, there are advantages that uniformity of the transistor characteristics is high and manufacturing cost is low. In particular, the advantages are effective in forming transistors over a large substrate whose diagonal length exceeds 500 mm.

For the semiconductor layer 306b, the semiconductor layer 307b, and the semiconductor layer 308b, silicon including phosphorus or the like, a semiconductor material with conductivity higher than the semiconductor layer 306a, the semiconductor layer 307a, and the semiconductor layer 308a, or the like can be used. The semiconductor layer 306b, the semiconductor layer 307b, and the semiconductor layer 308b can each be expressed as a buffer layer or an $n^+$ layer because of their functions. Note that the semiconductor layer 306b, the semiconductor layer 307b, and the semiconductor layer 308b can each include a portion which functions as a source and a drain.

Next, the conductive layers 309 to 314 are formed. The conductive layer 309 can include a portion which functions as one of a source and a drain. The conductive layer 310 can include a portion which functions as the other of the source and the drain. The conductive layer 311 can include a portion which functions as one of a source and a drain. The conductive layer 312 can include a portion which functions as the other of the source and the drain. The conductive layer 313 can include a portion which functions as one of a source and a drain. The conductive layer 314 can include a portion which functions as the other of the source and the drain. The conductive layers 309 to 314 can be formed as a single layer or a multi-layer using titanium, molybdenum, tantalum, chromium, tungsten, aluminum, neodymium, copper, silver, gold, platinum, niobium, silicon, zinc, iron, barium, ITO, IZO, zinc oxide (ZnO), and tin oxide (SnO) by sputtering, CVD, or the like. Note that the conductive layers 335 to 337 and the conductive layers 342 to 344 which are shown in FIG. 19 are formed in the same process as the conductive layers 309 to 314.

An insulating film 315 is formed as a single layer or a multi-layer over the conductive layers 309 to 314. The insulating film 315 can be formed using a silicon oxide-based material, a silicon nitride-based material, or the like by plasma-enhanced CVD, sputtering, or the like. The insulating film 315 may be formed as a single layer or a multi-layer using an organic material; for example acrylic, polyimide, polyamide, polyimide amide, benzocyclobutene, and epoxy can be used. The insulating film 315 may be a stacked layer of an organic material and an inorganic material. The insulating film 315 may include a material with a light-proof property or a color filter. An example of a material with a light-proof property is a carbon black and organic resin including a black pigment.

Contact holes are provided in the insulating film 315. Then, the electrode 316 electrically connected to the conductive layer 310, the electrode 317 electrically connected to the conductive layer 312, and the conductive layer 313 electrically connected to the electrode 318 are formed. Note that the electrodes 338 to 340 and the electrodes 345 to 347 which are shown in FIG. 19 are formed in the same process as the electrodes 316 to 318.

In the case where an image is displayed on the counter electrode side, the electrodes 316 to 318 are preferably formed using a material absorbing light; for example, a low reflectance material such as chromium, titanium, titanium nitride, molybdenum, tungsten, tantalum, and tantalum nitride is preferable. Alternatively, the electrodes 316 to 318 can be formed using a transparent material and the insulating film 315 can be formed using a material absorbing light.

In the case where an image is displayed on the pixel electrode side, the electrodes 316 to 318 are preferably formed as a single layer or a multi-layer using titanium, molybdenum, tantalum, chromium, tungsten, aluminum, neodymium, copper, silver, gold, platinum, niobium, silicon, zinc, iron, barium, ITO, IZO, zinc oxide (ZnO), and tin oxide (SnO).

Here, viewing the top and the bottom of the display device, the conductive layer 310 which can function as an auxiliary electrode is overlapped with a space between the electrode 316 and the electrode 317. With such a structure, an electric field driving display device in which display defects are reduced can be obtained.

A layer 319 is formed over the electrodes 316 to 318. The layer 319 is a layer including a display medium. As the layer 319, a dispersant 321 in which microcapsules 320 are dispersed and fixed is formed over the electrodes 316 to 318. An electrode 322 and a substrate 323 are formed over the layer 319. The electrode 322 can function as a counter electrode. A bonding layer can be sandwiched between the layer 319 and the electrodes 316 to 318. A bonding layer can be sandwiched between the layer 319 and the electrode 322.

In the case where an image is displayed on the counter electrode side, a light-transmitting material such as ITO or IZO is used for the electrode 322.

In the case where an image is displayed on the pixel electrode side, a metal material is preferably used as the electrode 322 because wiring resistance can be reduced. As a metal material, titanium, molybdenum, tantalum, chromium, tungsten, aluminum, neodymium, copper, silver, gold, platinum, niobium, silicon, zinc, iron, barium, germanium, or the like can be used.

The substrate 323 is provided over the electrode 322. The substrate 323 can have a function of protecting the layer 319. Further, a plastic substrate, a resin substrate, a film substrate, a glass substrate, a ceramic substrate, a stainless steel substrate, a stainless steel foil substrate, or the like can be used for the substrate 323.

In FIG. 19, the conductive layer 313 is provided so as to partly overlap the electrode 316, the electrode 318, the electrode 338, and the electrode 339. Viewing the electric field driving display device, which is an example in this embodiment, from the top and the bottom, the conductive layer 313 is provided so as to embed a space between the electrode 318 and the electrode 316 and a space between the electrode 318 and the electrode 338.

In FIG. 19, the conductive layer 310 is provided so as to partly overlap the electrode 316, the electrode 317, the electrode 339, and the electrode 340. Viewing the electric field driving display device, which is an example in this embodiment, from the top and the bottom, the conductive layer 310 is provided so as to embed a space between the electrode 316 and the electrode 317 and a space between the electrode 316 and the electrode 339.

In FIG. 19, the conductive layer 312 provided so as to partly overlap the electrode 317, and the electrode 340. Viewing the electric field driving display device, which is an example in this embodiment, from the top and the bottom, the conductive layer 312 is provided so as to embed a space between the electrode 317 and the electrode 340.

In FIG. 19, the conductive layer 342 is provided so as to partly overlap the electrode 316, the electrode 318, the electrode 345, and the electrode 346. Viewing the electric field driving display device, which is an example in this embodiment, from the top and the bottom, the conductive layer 342 is provided so as to embed a space between the electrode 345 and the electrode 346 and a space between the electrode 345 and the electrode 318.

In FIG. 19, the conductive layer 343 is provided so as to partly overlap the electrode 316, the electrode 317, the electrode 346, and the electrode 347. Viewing the electric field driving display device, which is an example in this embodiment, from the top and the bottom, the conductive layer 343 is provided so as to embed a space between the electrode 346 and the electrode 347 and a space between the electrode 346 and the electrode 316.

In FIG. 19, the conductive layer 344 provided so as to partly overlap the electrode 317, and the electrode 347. Viewing the electric field driving display device, which is an example in this embodiment, from the top and the bottom, the conductive layer 344 is provided so as to embed a space between the electrode 317 and the electrode 347.

Alternatively, in order to prevent a short circuit between the adjacent pixel electrodes and the adjacent auxiliary electrodes of the adjacent pixel, a region in which no pixel electrode and no auxiliary electrode are provided can be slightly presented.

FIGS. 21A and 21B are magnified views of one pixel of FIG. 19 and a periphery of the pixel. Note that for simplification of FIGS. 21A and 21B, the wiring 304 and the wiring 341 are omitted, and further, in FIGS. 21A and 21B, the area of one pixel is set based on a pitch (a region between the adjacent conductive layers which can function as auxiliary electrodes) among the conductive layer 310, the conductive layer 312, the conductive layer 313, the conductive layers 335 to 337, and the conductive layers 342 to 344, each of which can function as an auxiliary electrode. A region including the area of one pixel is defined as an area 350 in FIGS. 21A and 21B.

In FIG. 21A, a region 351 is surrounded by the electrode 339, the conductive layer 310, the electrode 316, and the conductive layer 313 and does not include an electrode which can function as a pixel electrode and a conductive layer which can function as an auxiliary electrode. A region 352 is surrounded by the conductive layer 310, the electrode 317, the conductive layer 343, and the electrode 316 and does not include an electrode which can function as a pixel electrode and a conductive layer which can function as an auxiliary electrode.

In FIG. 21B, a region 353 does not include the electrode 339, the electrode 340, the electrode 316, and the electrode 317, and includes the conductive layer 310.

Regions (the region 351 and the region 352) which do not include the electrode 339, the electrode 340, the electrode 316, the electrode 317, and the conductive layer 310 are regions for preventing a short circuit between adjacent pixels.

However, in order to obtain a display device in which display defects are reduced, a pixel electrode or a conductive layer which can function as an auxiliary electrode needs to be provided in a wider region. From this reason, it is preferable that the area of the region which does not include the electrode 339, the electrode 340, the electrode 316, the electrode 317, and the conductive layer 310 be smaller than the area of the region which does not include the electrode 339, the electrode 340, the electrode 316, and the electrode 317 and includes the conductive layer 310. That is to say, the sum of the areas of the region 351 and the region 352 is preferably smaller than the area of the region 353. Note that this embodiment describes an example of the region 353 including the conductive layer 310 which can function as an auxiliary electrode; however, the region 353 may include a conductive layer which can function as a pixel electrode, a conductive layer which can function as an auxiliary electrode, and a conductive layer other than a conductive layer which is a wiring functioning as a source line.

Note that the conductive layer 310, the conductive layer 312, the conductive layer 313, the conductive layers 335 to 337, and the conductive layers 342 to 344, are provided between the layer of the gate lines 330 and 331 and the layer of the electrodes 316 to 318, the electrodes 338 to 340, and the electrodes 345 to 347, which can function as pixel electrodes. At that time, the gate line is preferably provided so that the area of the gate line which overlaps the conductive layer 310, the conductive layer 312, the conductive layer 313, the conductive layers 335 to 337, and the conductive layers 342 to 344 is larger than the area of the gate line which overlaps the electrodes 316 to 318 the electrodes 338 to 340, and the electrodes 345 to 347, which can function as pixel electrodes. Because the pixel electrodes are formed over the insulating film provided over the auxiliary electrode, parasitic capacitance can be reduced by forming the gate line so as to overlap the pixel electrode.

By the structure shown in FIG. 19, FIG. 20A, and FIG. 20B, aggregation of particles can be reduced, so that display reflecting operation for rewriting a display image can be performed; thus, an electric field driving display device in which a residual image is less likely to occur can be fabricated.

Although the case of using a TFT having a channel-etched structure is described as an example in this embodiment, a TFT having a channel-protective structure, a top-gate structure, or the like can also be used.

Figure 22:
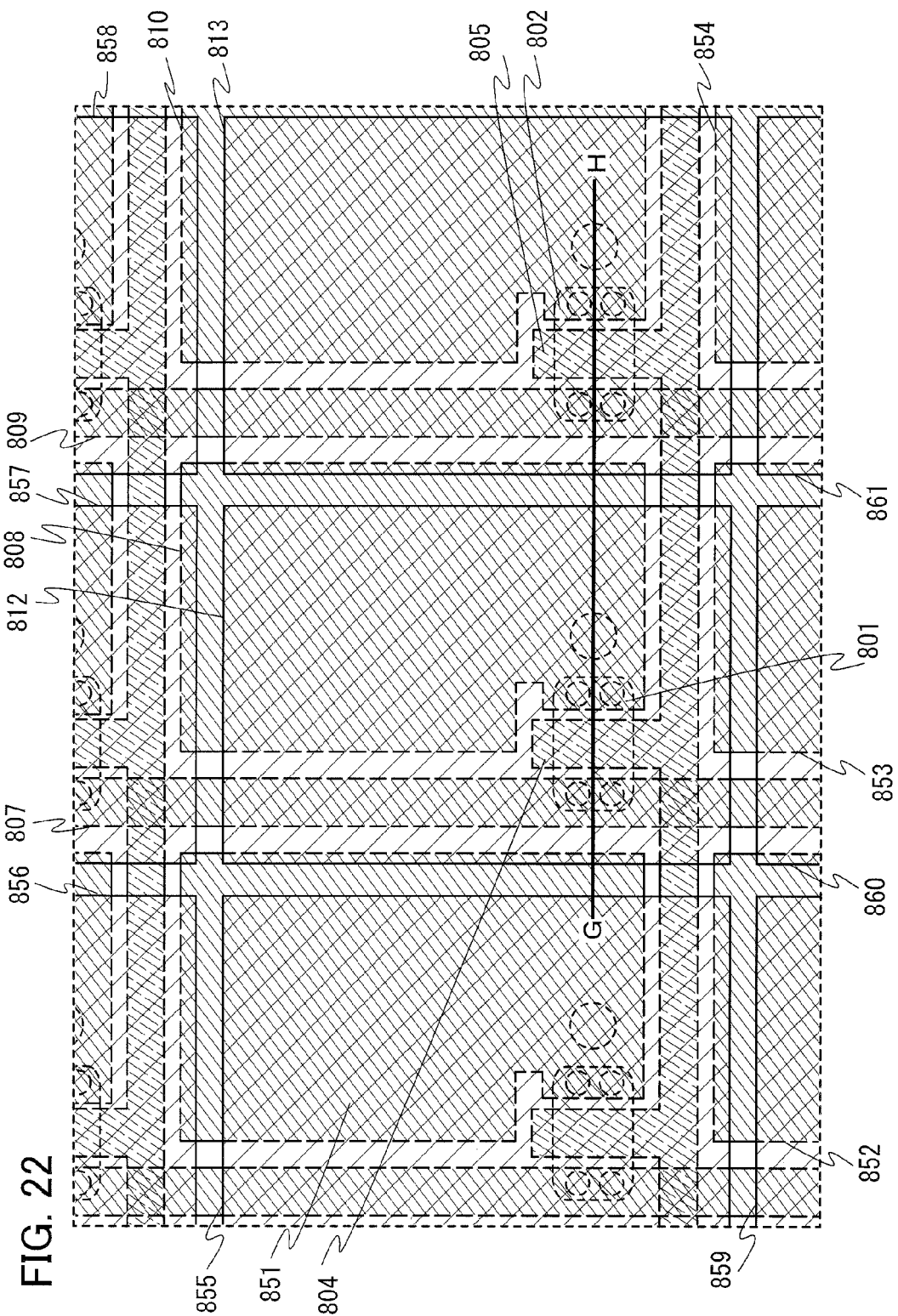
FIG. 22 is a top view in accordance with an embodiment of the present invention.
Figure 23:
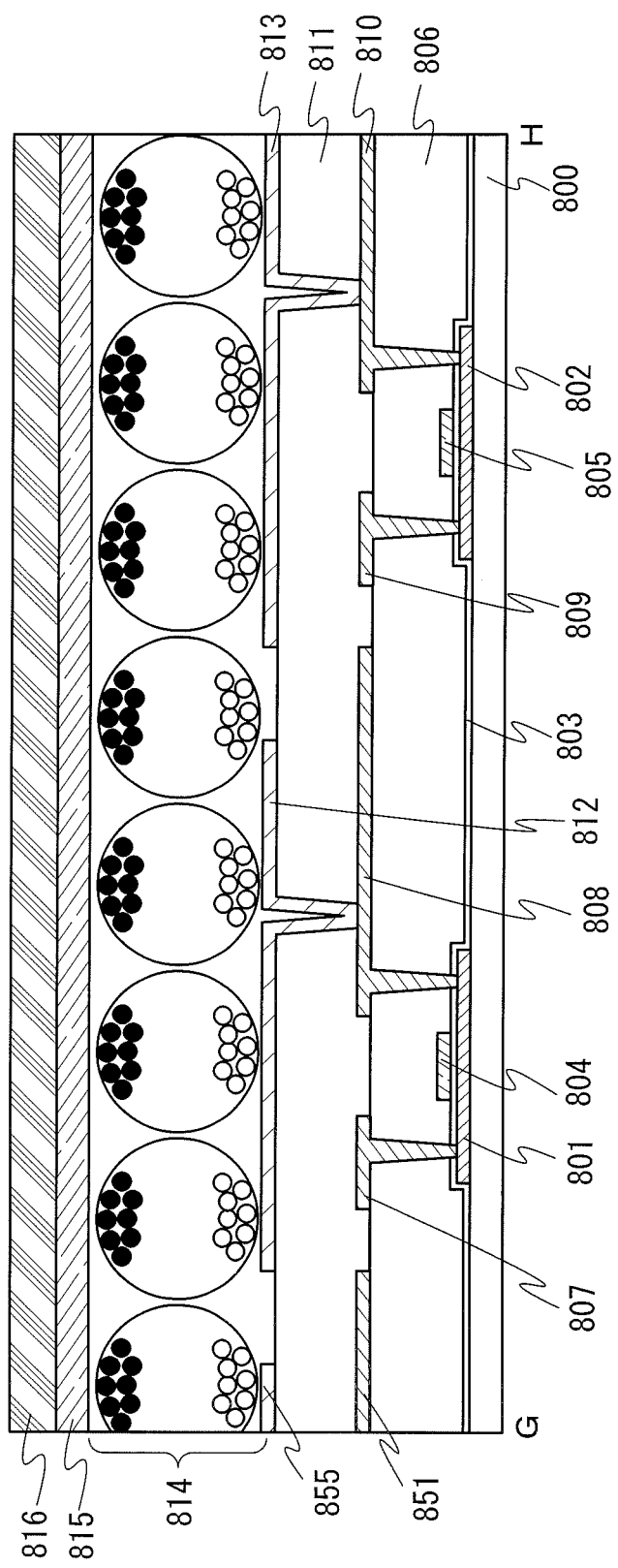
FIG. 23 is a cross-sectional view in accordance with an embodiment of the present invention.

FIG. 22 is an example of a top view of an electric field driving display device including a TFT having a top-gate structure. FIG. 23 shows a cross section G-H of FIG. 22.

A semiconductor layer 801 and a semiconductor layer 802 are formed over the substrate 800. A base insulating film may be formed over the substrate 800. The semiconductor layer 801 and the semiconductor layer 802 can be formed using polycrystalline silicon by a photolithography, inkjet, printing, or the like.

An insulating film 803 is formed over the semiconductor layer 801 and the semiconductor layer 802. The insulating film 803 can function as a gate insulating film. The insulating film 803 can be formed using a silicon oxide-based material, a silicon nitride-based material, or the like by plasma-enhanced CVD, sputtering, or the like.

A gate electrode 804 and a gate electrode 805 are formed over the insulating film 803. The gate electrode 804 and the gate electrode 805 can be formed as a single layer or a multi-layer using titanium, molybdenum, tantalum, chromium, tungsten, aluminum, neodymium, copper, silver, gold, platinum, niobium, silicon, zinc, iron, barium, ITO, IZO, zinc oxide (ZnO), and tin oxide (SnO) by sputtering, CVD, or the like.

An insulating film 806 is formed over the gate electrode 804, the gate electrode 805, and the insulating film 803. The insulating film 806 can be formed using a silicon oxide-based material, a silicon nitride-based material, or the like by plasma-enhanced CVD, sputtering, or the like. The insulating film 806 may be formed as a single layer or a multi-layer using an organic material; for example acrylic, polyimide, polyamide, polyimide amide, benzocyclobutene, and epoxy can be used. The insulating film 806 may be a stacked layer of an organic material and an inorganic material. The insulating film 806 may include a material with a light-proof property or a color filter. An example of a material with a light-proof property is a carbon black and organic resin including a black pigment.

Contact holes are formed in the insulating film 803 and the insulating film 806. An electrode 807 and an electrode 808 which are electrically connected to the semiconductor layer 801, and an electrode 809 and an electrode 810 which are electrically connected to the semiconductor layer 802 are formed. The electrodes 807 to 810 can be formed as a single layer or a multi-layer using titanium, molybdenum, tantalum, chromium, tungsten, aluminum, neodymium, copper, silver, gold, platinum, niobium, silicon, zinc, iron, barium, germanium, ITO, IZO, zinc oxide (ZnO), and tin oxide (SnO). The electrode 807 and the electrode 809 can each function as a source line. The electrode 808 and the electrode 810 can each function as an auxiliary electrode. Note that electrodes 851 to 854 shown in FIG. 22 are formed in the same process as the electrodes 807 to 810.

An insulating film 811 is formed over the electrodes 807 to 810. The insulating film 811 can be formed using a silicon oxide-based material, a silicon nitride-based material, or the like by plasma-enhanced CVD, sputtering, or the like. The insulating film 811 may be formed as a single layer or a multi-layer using an organic material; for example acrylic, polyimide, polyamide, polyimide amide, benzocyclobutene, and epoxy can be used. The insulating film 811 may be a stacked layer of an organic material and an inorganic material. The insulating film 811 may include a material with a light-proof property or a color filter. An example of a material with a light-proof property is a carbon black and organic resin including a black pigment.

Contact holes are formed in the insulating film 811. An electrode 812 electrically connected to the electrode 808 and an electrode 813 electrically connected to the electrode 810. The electrode 812 and the electrode 813 can be formed as a single layer or a multi-layer using titanium, molybdenum, tantalum, chromium, tungsten, aluminum, neodymium, copper, silver, gold, platinum, niobium, silicon, zinc, iron, barium, germanium, ITO, IZO, zinc oxide (ZnO), and tin oxide (SnO). The electrode 812 and the electrode 813 can each function as a pixel electrode. Electrodes 855 to 861 shown in FIG. 22 are formed in the same process as the electrode 812 and the electrode 813. The electrode 855 is electrically connected to the electrode 851. The electrode 859 is electrically connected to the electrode 852. The electrode 860 is electrically connected to the electrode 853. The electrode 861 is electrically connected to the electrode 854.

A layer 814, an electrode 815, and a substrate 816 are formed, provided, or attached over the electrode 812 and the electrode 813. The layer 814 includes a display medium. Here, as an example of the layer 814, a layer including a microcapsule is illustrated.

The electrode 815 can include a metal material such as titanium, molybdenum, tantalum, chromium, tungsten, aluminum, neodymium, copper, silver, gold, platinum, niobium, silicon, zinc, iron, barium, or germanium. The electrode 815 can function as a counter electrode.

A plastic substrate, a resin substrate, a film substrate, a glass substrate, a ceramic substrate, a stainless steel substrate, a stainless steel foil substrate, or the like can be used for the substrate 816.

Figure 24:
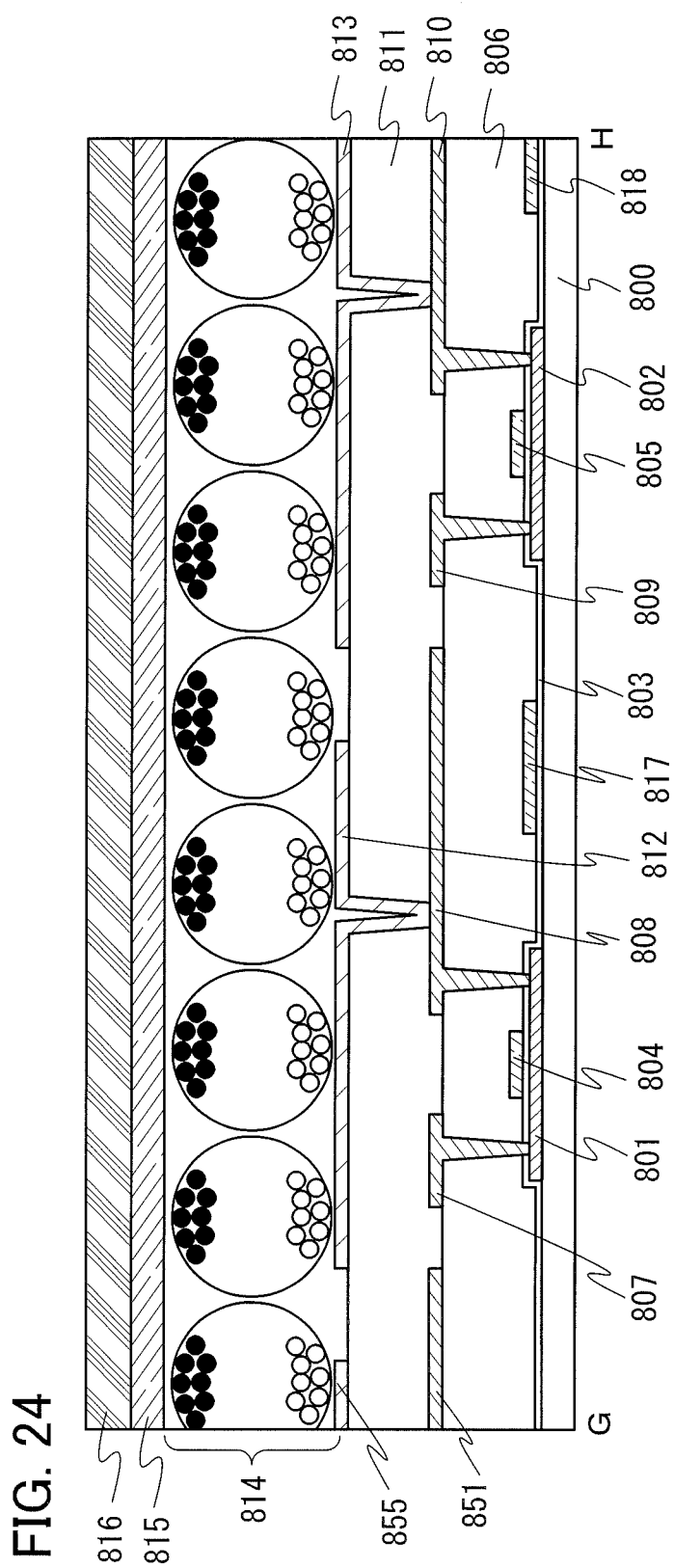
FIG. 24 is a cross-sectional view in accordance with an embodiment of the present invention.

FIG. 24 is an example of a cross sectional view of an electric field driving display device with a structure in which a conductive layer 817 and a conductive layer 818, which are formed of the same material and in the same process as the gate electrode 804, are added to the structure in FIG. 23. The conductive layer 817 overlaps at least part of the electrode 808 with the insulating film 806 provided therebetween and can function as one of electrodes of a capacitor. The conductive layer 818 overlaps at least part of the electrode 810 with the insulating film 806 provided therebetween and can function as one of electrodes of a capacitor.

FIG. 25 is an example of a cross sectional view of an electric field driving display device with a structure in which a conductive layer 819 and a conductive layer 820, which are formed of the same material and in the same process as the gate electrode 804, are added to the structure in FIG. 23. The conductive layer 819 overlaps at least part of the semiconductor layer 801 with the insulating film 803 provided therebetween and can function as one of electrodes of a capacitor. The conductive layer 820 overlaps at least part of the semiconductor layer 802 with the insulating film 803 provided therebetween and can function as one of electrodes of a capacitor.

In FIG. 22, the electrode 808 is provided so as to partly overlap the electrode 812, the electrode 813, the electrode 857, and the electrode 858. Viewing the electric field driving display device, which an example in this embodiment, from the top and the bottom, the electrode 808 is provided so as to embed a space between the electrode 812 and the electrode 813 and a space between the electrode 857 and the electrode 812.

In FIG. 22, the electrode 810 is provided so as to partly overlap the electrode 858 and the electrode 813. Viewing the electric field driving display device, which an example in this embodiment, from the top and the bottom, the electrode 810 is provided so as to embed a space between the electrode 858 and the electrode 813.

In FIG. 22, the electrode 851 is provided so as to partly overlap the electrode 856, the electrode 855, the electrode 857, and the electrode 812. Viewing the electric field driving display device, which an example in this embodiment, from the top and the bottom, the electrode 851 is provided so as to embed a space between the electrode 855 and the electrode 812 and a space between the electrode 855 and the electrode 851.

In FIG. 22, the electrode 852 is provided so as to partly overlap the electrode 855, the electrode 859, the electrode 812, and the electrode 860. Viewing the electric field driving display device, which an example in this embodiment, from the top and the bottom, the electrode 852 is provided so as to embed a space between the electrode 859 and the electrode 860 and a space between the electrode 859 and the electrode 860.

In FIG. 22, the electrode 853 is provided so as to partly overlap the electrode 812, the electrode 860, the electrode 813, and the electrode 861. Viewing the electric field driving display device, which is an example in this embodiment, from the top and the bottom, the electrode 853 is provided so as to embed a space between the electrode 860 and the electrode 861 and a space between the electrode 812 and the electrode 860.

In FIG. 22, the electrode 854 is provided so as to partly overlap the electrode 813 and the electrode 861. Viewing the electric field driving display device, which an example in this embodiment, from the top and the bottom, the electrode 854 is provided so as to embed a space between the electrode 813 and the electrode 861.

With such a structure, an electric field driving display device in which display defects are reduced can be obtained.

Further, polycrystalline silicon is used for the semiconductor layer 801 and the semiconductor layer 802 in the electric field driving display devices shown in FIG. 22, FIG. 23, FIG. 24, and FIG. 25; accordingly, there are advantages in that mobility of the transistor is high and manufacturing cost is low. Moreover, since little deterioration in characteristics over time occurs, a highly reliable device can be obtained.

Note that the electrodes 807 to 810 and the electrodes 851 to 854 are provided between the layer of gate line including the gate electrode 804 and the gate electrode 805 and the layer of the electrode 812, the electrode 813, and the electrodes 855 to 861 which can function as pixel electrodes. At that time, the gate line is preferably provided so that the area of the gate line which overlaps the electrodes 807 to 810, and the electrodes 851 to 854 is larger than the area of the gate line which overlap an electrode the electrode 812, the electrode 813, and the electrodes 855 to 861, which can function as pixel electrodes. Because the pixel electrode is formed over the insulating film provided over the auxiliary electrode, when the gate line is formed to overlap the pixel electrode, parasitic capacitance can be reduced.

Figure 26A:
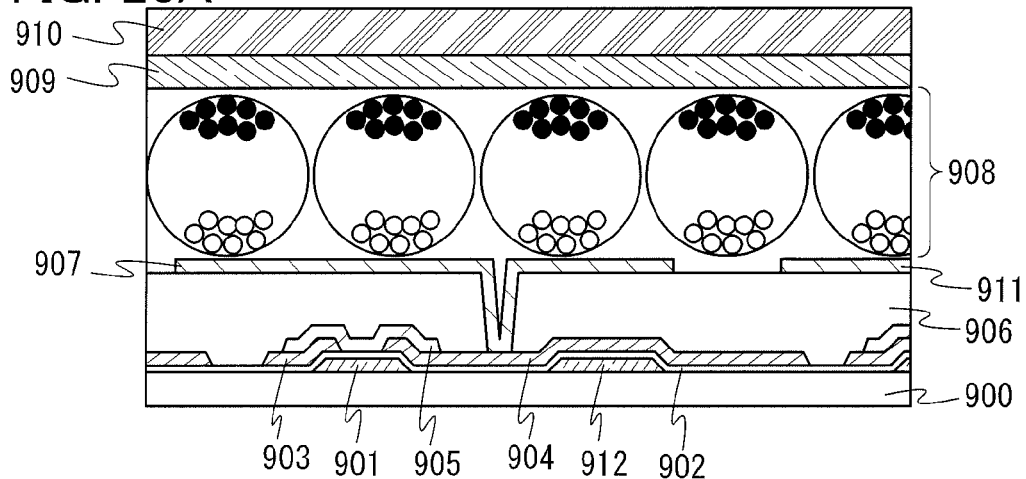
FIGS. 26A to 26C are cross-sectional views in accordance with an embodiment of the present invention.
Figure 26B:
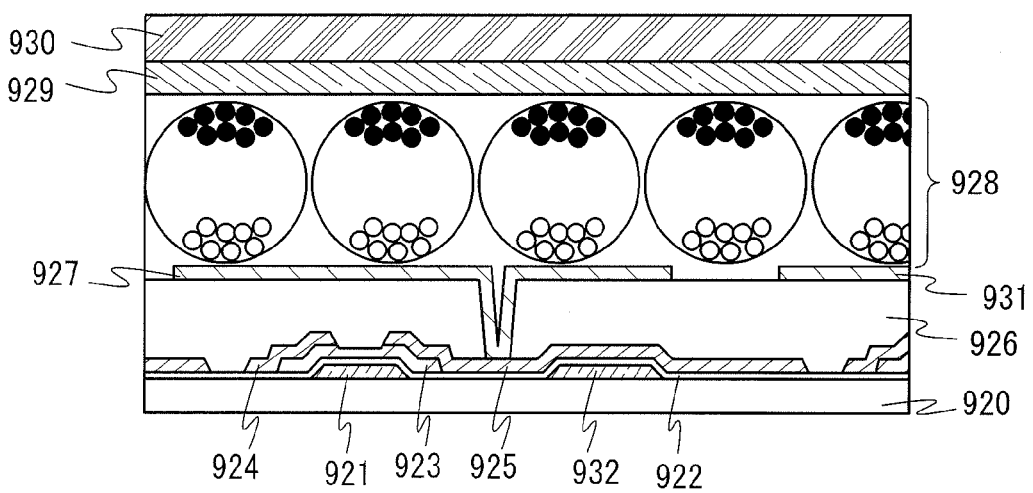
Figure 26C:
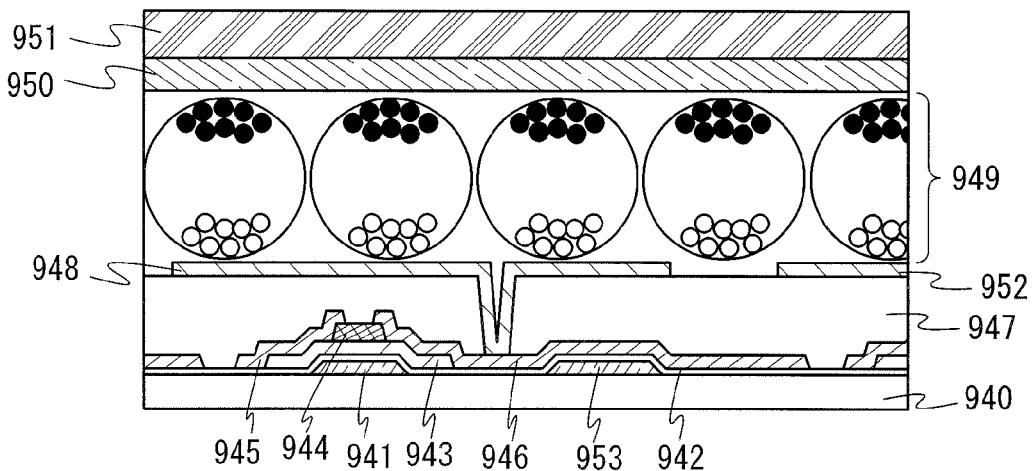

Further, an electric field driving display device may include a TFT including an oxide semiconductor. FIGS. 26A to 26C show an example of a TFT having a bottom gate structure and including an oxide semiconductor.

In FIG. 26A, a gate electrode 901 and a conductive layer 912 are formed over a substrate 900. A base insulating film may be formed over the substrate 900. The gate insulating film 902 is formed over the gate electrode 901 and the conductive layer 912. An electrode 903 and an electrode 904 are formed over the gate insulating film 902. The electrode 903 can function as a source electrode or a drain electrode. The electrode 904 can function as an auxiliary electrode. A semiconductor layer 905 including an oxide semiconductor is formed over the electrode 903, the electrode 904, and the gate insulating film 902. An insulating film 906 is formed over the semiconductor layer 905. A contact hole is formed in the insulating film 906 and an electrode 907 electrically connected to the electrode 904 is formed. The electrode 907 can function as a pixel electrode. A layer 908 is formed over the electrode 907 and includes a display medium. An electrode 909 is formed over the layer 908. The electrode 909 can function as a counter electrode. A protector 910 is formed over the electrode 909. The electrode 904 is formed to overlap at least part of the electrode 907 and part of a region between the electrode 907 and an electrode 911 which is formed in the same process as the electrode 907. The conductive layer 912 overlaps the electrode 904 with the gate insulating film 902 provided therebetween and can function as one of electrodes of a capacitor.

This embodiment can employ a TFT structure shown in FIG. 26A, that is, a TFT having a bottom contact structure in which a source electrode or a drain electrode is formed below a semiconductor layer including an oxide semiconductor.

In FIG. 26B, a gate electrode 921 and a conductive layer 912 are formed over a substrate 932. A base insulating film may be formed over the substrate 920. The gate insulating film 922 is formed over the gate electrode 921 and the conductive layer 932. A semiconductor layer 923 including an oxide semiconductor is formed over a gate insulating film 922. An electrode 924 and an electrode 925 are formed over the semiconductor layer 923. The electrode 924 can function as a source electrode or a drain electrode. The electrode 925 can function as an auxiliary electrode. An insulating film 926 is formed over the electrode 924 and the electrode 925. A contact hole is formed in the insulating film 926 and an electrode 927 electrically connected to the electrode 925 is formed. The electrode 927 can function as a pixel electrode. A layer 928 is formed over the electrode 927 and includes a display medium. An electrode 929 is formed over the layer 928. The electrode 929 can function as a counter electrode. A protector 930 is formed over the electrode 929. The electrode 925 is formed to overlap at least part of the electrode 927 and part of a region between the electrode 927 and an electrode 931 which is formed in the same process as the electrode 927. The conductive layer 932 overlaps the electrode 925 with the gate insulating film 922 provided therebetween and can function as one of electrodes of a capacitor.

This embodiment can employ a TFT structure shown in FIG. 26B, that is, a TFT having a top contact structure in which a source electrode or a drain electrode is formed over a semiconductor layer including an oxide semiconductor.

In FIG. 26C, a gate electrode 941 and a conductive layer 953 are formed over a substrate 940. A base insulating film may be formed over the substrate 940. The gate insulating film 942 is formed over the gate electrode 941 and the conductive layer 953. A semiconductor layer 943 including an oxide semiconductor is formed over a gate insulating film 942. A channel protective film 944 is formed over the semiconductor layer 943 so as to overlap the gate electrode 941. An electrode 945 and an electrode 946 are formed over the channel protective film 944 and the semiconductor layer 943. The electrode 945 can function as a source electrode or a drain electrode. The electrode 946 can function as an auxiliary electrode. An insulating film 947 is formed over the electrode 945 and the electrode 946. A contact hole is formed in the insulating film 947 and an electrode 948 electrically connected to the electrode 946 is formed. The electrode 948 can function as a pixel electrode. A layer 949 is formed over the electrode 948 and includes a display medium. An electrode 950 is formed over the layer 949. The electrode 950 can function as a counter electrode. A protector 951 is formed over the electrode 950. The electrode 946 is formed to overlap at least part of the electrode 948 and part of a region between the electrode 948 and an electrode 952 which is formed in the same process as the electrode 948. The conductive layer 953 overlaps the electrode 946 with the gate insulating film.

This embodiment can employ a TFT structure shown in FIG. 26C, that is, a TFT having a channel protective structure in which a channel protective film is formed over a semiconductor layer including an oxide semiconductor.

As shown in FIGS. 26A to 26C, when an oxide semiconductor is used as the semiconductor layer, field effect mobility can be higher than that of a thin film transistor using amorphous silicon. An oxide semiconductor film can be formed by sputtering or the like at a temperature of 300° C. or lower, and a manufacturing process thereof is simpler than that of a semiconductor film of a thin film transistor, which includes polycrystalline silicon.

Note that an example of oxide semiconductors which can be used in this specification includes $InMO_3(ZnO)_m$ (m>0). Here, M denotes one or more metal elements selected from gallium (Ga), iron (Fe), nickel (Ni), manganese (Mn), and cobalt (Co). For example, when M is Ga, only Ga is included, or the above metal element is included in addition to Ga, for example, M includes Ga and Na, Ga and Fe, or the like. Further, the above oxide semiconductor may contain Fe or Ni, another transitional metal element, or an oxide of the transitional metal as an impurity element in addition to the metal element contained as M. In this specification, among the above oxide semiconductors, an oxide semiconductor including at least gallium as M is referred to as an In—Ga—Zn—O based oxide semiconductor, and a thin film using the material is referred to as an In—Ga—Zn—O based non-single-crystal film in some cases.

In addition, although an active-matrix electric field driving display device is described in this embodiment, the display device in this embodiment may be a passive-matrix electric field driving display device.

A cross sectional views of a passive-matrix electric field driving display device is shown in FIG. 4 and FIG. 5, and the top view thereof is shown in FIGS. 6A to 6D. The electrode 109 and the electrode 100 are formed as stripes. The electrode 101 is formed as stripes to be orthogonal to the electrode 109 and the electrode 100. The electrode 109 can function as an auxiliary electrode. The electrode 100 can function as a pixel electrode. The electrode 101 can function as a counter electrode.

Viewing the passive-matrix electric field driving display device from the top or the bottom, the electrode 109 or the electrode 100 is formed in the whole of a pixel portion. In other words, the electrode 109 or the electrode 100 is formed in the region facing to the region in which the electrode 101 is formed (FIG. 6B). That is to say, with such a structure, an electric field driving display device in which display defects are reduced can be obtained.

Note that this embodiment can be combined with the structure described in any of the other embodiments in this specification as appropriate.

Embodiment 4

In this embodiment, a structure example of an electric field driving display device of the present invention will be described.

Figure 27:
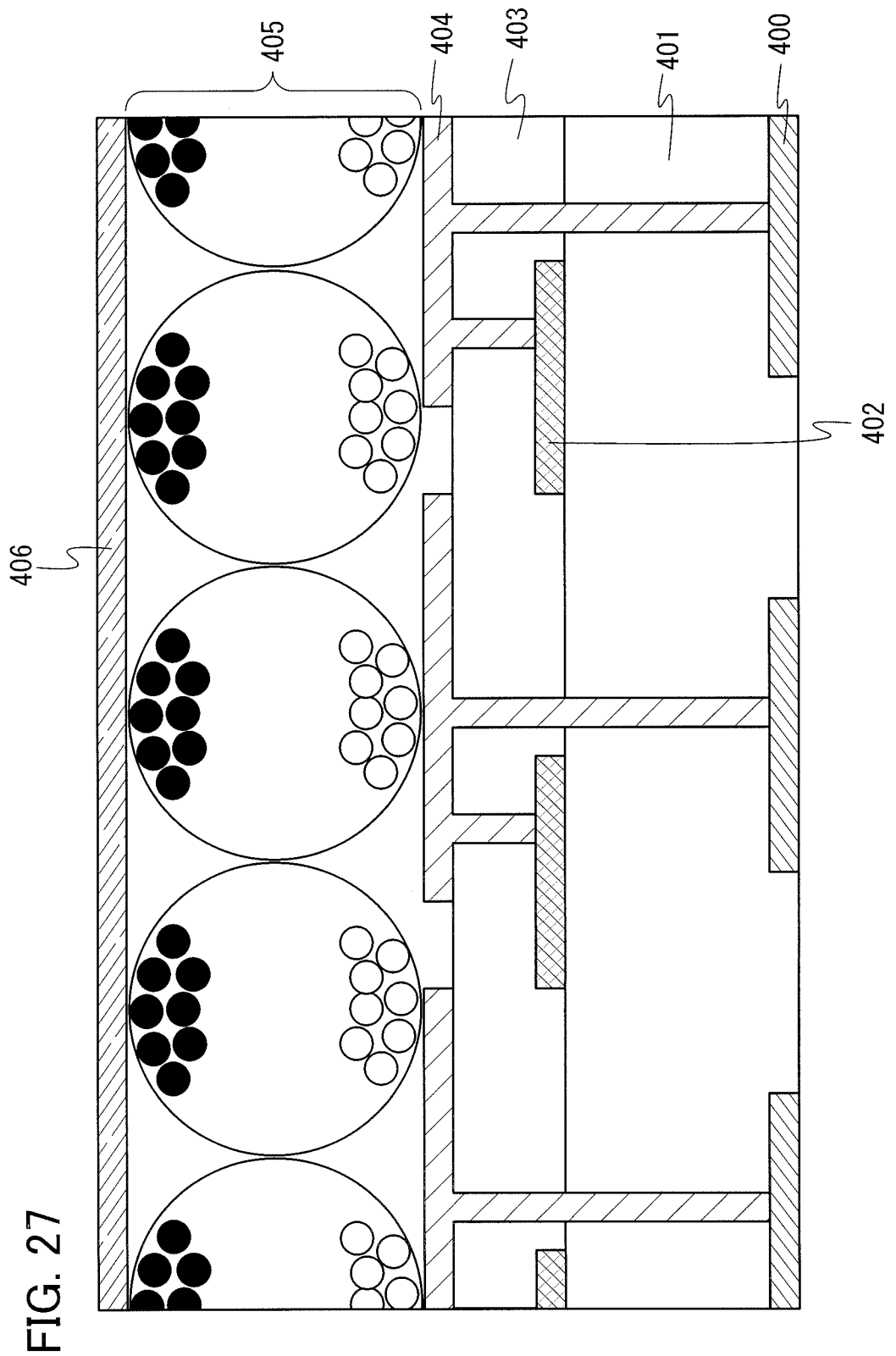
FIG. 27 is a cross-sectional view in accordance with an embodiment of the present invention.

FIG. 27 is a schematic cross sectional view of an example of this embodiment. A conductive layer 400 is formed of the same material and in the same process as a source and a drain of a transistor. The conductive layer 400 can function as a capacitor electrode. The conductive layer 400 can be formed as a single layer or a multi-layer using titanium, molybdenum, tantalum, chromium, tungsten, aluminum, neodymium, copper, silver, gold, platinum, niobium, silicon, zinc, iron, barium, germanium, ITO, IZO, zinc oxide (ZnO), or tin oxide (SnO) by sputtering, CVD, or the like.

An insulating film 401 is formed over the conductive layer 400. The insulating film 401 can function as a planarization film. The insulating film 401 preferably includes a material with a light-proof property such as black resin or a carbon black, a resin material such as acrylic, polyimide, or polyamide, or the like. Further, photosensitive acrylic or the like can be used for the insulating film 401. Furthermore, the insulating film 401 may be a stack of a material with a light-proof property or a resin material and an inorganic material such as silicon nitride.

A conductive layer 402 is formed over the insulating film 401. The conductive layer 402 can function as an auxiliary electrode. The conductive layer 402 can include a conductive material such as titanium, molybdenum, tantalum, chromium, tungsten, aluminum, neodymium, copper, silver, gold, platinum, niobium, silicon, zinc, iron, barium, germanium, ITO, IZO, zinc oxide (ZnO), or tin oxide (SnO).

The conductive layer 400 or the conductive layer 402 is provided to embed the region 351 and the region 352 in FIG. 21A. As a result, electrodes such as a pixel electrode and an auxiliary electrode can be provided with no space for the entire region of a pixel portion in a plane parallel to a substrate.

An insulating film 403 is formed over the conductive layer 402. The insulating film 403 can be formed as a single layer or a multi-layer using a silicon oxide-based material, a silicon nitride-based material, or the like by plasma CVD, sputtering, or the like.

Contact holes are formed in the insulating film 401 and the insulating film 403 at the same time.

An electrode 404 is formed to be electrically connected to the conductive layer 400 and the conductive layer 402. The electrode 404 can function as a pixel electrode. The electrode 404 preferably includes a material absorbing light; for example, the low reflectance material such as chromium, titanium, titanium nitride, molybdenum, tungsten, tantalum, and tantalum nitride is preferably used. Note that the conductive layer 402 and the electrode 404 can be formed of the same material. Therefore, manufacturing process can be simplified.

The thickness of the insulating film 401 which can function as a planarization film is 1 μm to 2 μm. The thickness of the insulating film 403 is a few nm to 2 μm. The insulating film 401 is formed over the conductive layer 400, so that the roughness of a surface over which the conductive layer 402 and the electrode 404 which function as auxiliary electrodes are formed can be reduced. By forming the insulating film 401, capacitance between the conductive layer 400 and the conductive layer 402 and capacitance between the electrode 404 and the conductive layer 400 can be reduced; therefore, noise and crosstalk can be prevented.

A layer 405 and an electrode 406 are formed over the electrode 404. The layer 405 includes a display medium. Here, the layer 405 includes a microcapsule, for example; however, a microcup or Electronic Liquid Powder can be used. A light-transmitting material such as ITO and IZO is used for the electrode 406.

In this embodiment, the number of masks is increased because a process of forming the conductive layer 402 functioning as an auxiliary electrode is added. On the other hand, the number of masks needed for a process of forming contact holes is not increased because the contact holes are formed by etching the insulating film 401 and the insulating film 403 at the same time.

Another example of this embodiment is described with reference to FIG. 28.

Figure 28:
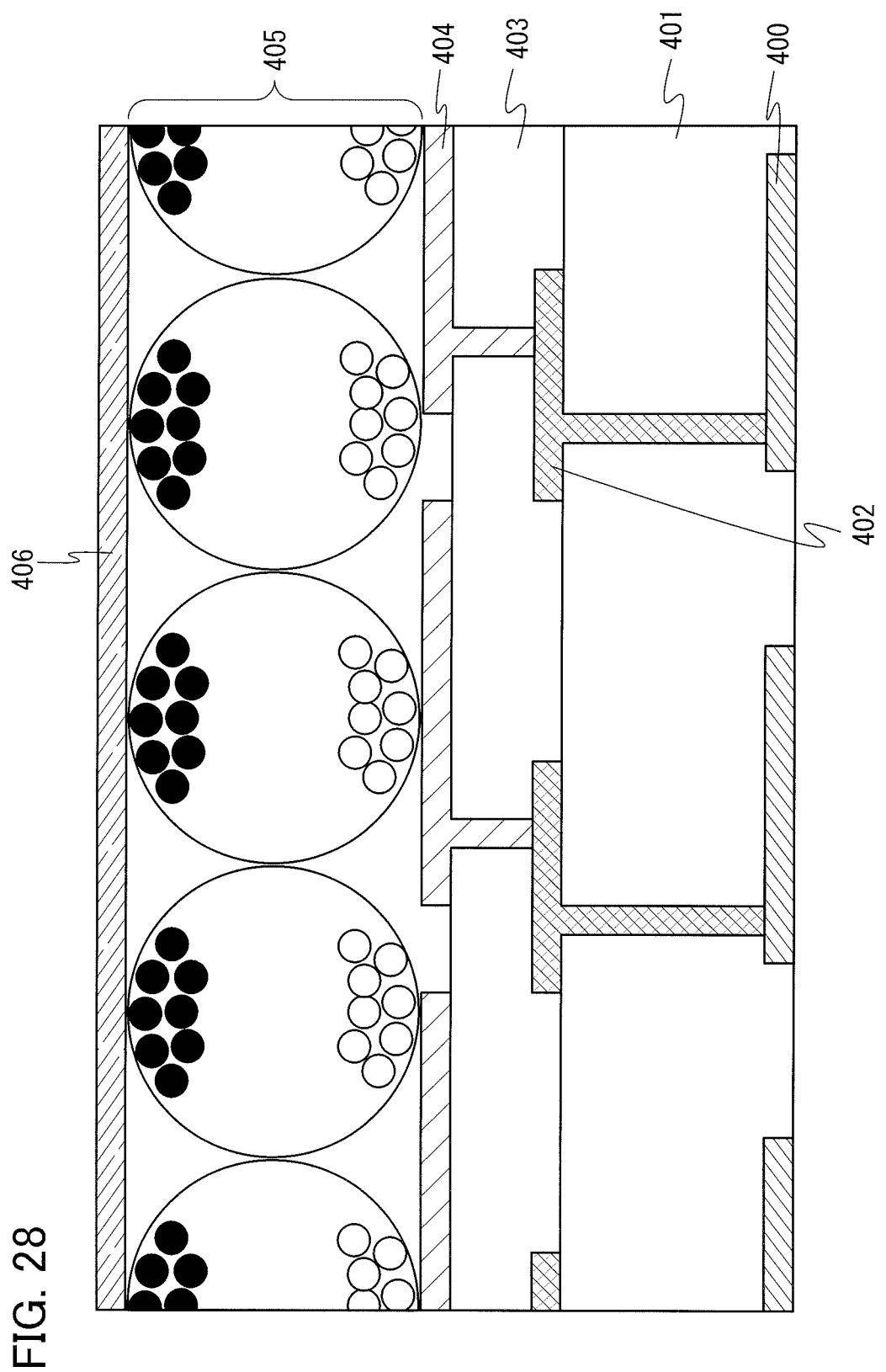
FIG. 28 is a cross-sectional view in accordance with an embodiment of the present invention.

In a structure shown in FIG. 28, electrical connection among the conductive layer 400, the conductive layer 402, and the electrode 404 is different from that in FIG. 27. Except for this, FIG. 28 is similar to FIG. 27, and the description is omitted here.

In FIG. 27, after the conductive layer 400 and the conductive layer 402 are formed, contact holes are formed to expose parts of conductive layer 400 and the conductive layer 402. On the other hand, in FIG. 28, a contact hole is formed in the insulating film 401 which is formed over the conductive layer 400, and the conductive layer 402 is formed. Here, the conductive layer 402 and the conductive layer 400 are electrically connected to each other. Sequentially, the insulating film 403 is formed over the conductive layer 402, and a contact hole is formed. The electrode 404 is formed to be electrically connected to the conductive layer 402 in the contact hole.

The conductive layer 400 or the conductive layer 402 is provided to embed the region 351 and the region 352 in FIG. 21A. As a result, electrodes such as a pixel electrode and an auxiliary electrode can be provided with no space for the entire region of a pixel portion in a plane parallel to a substrate.

Another example of this embodiment is described with reference to FIG. 29.

Figure 29:
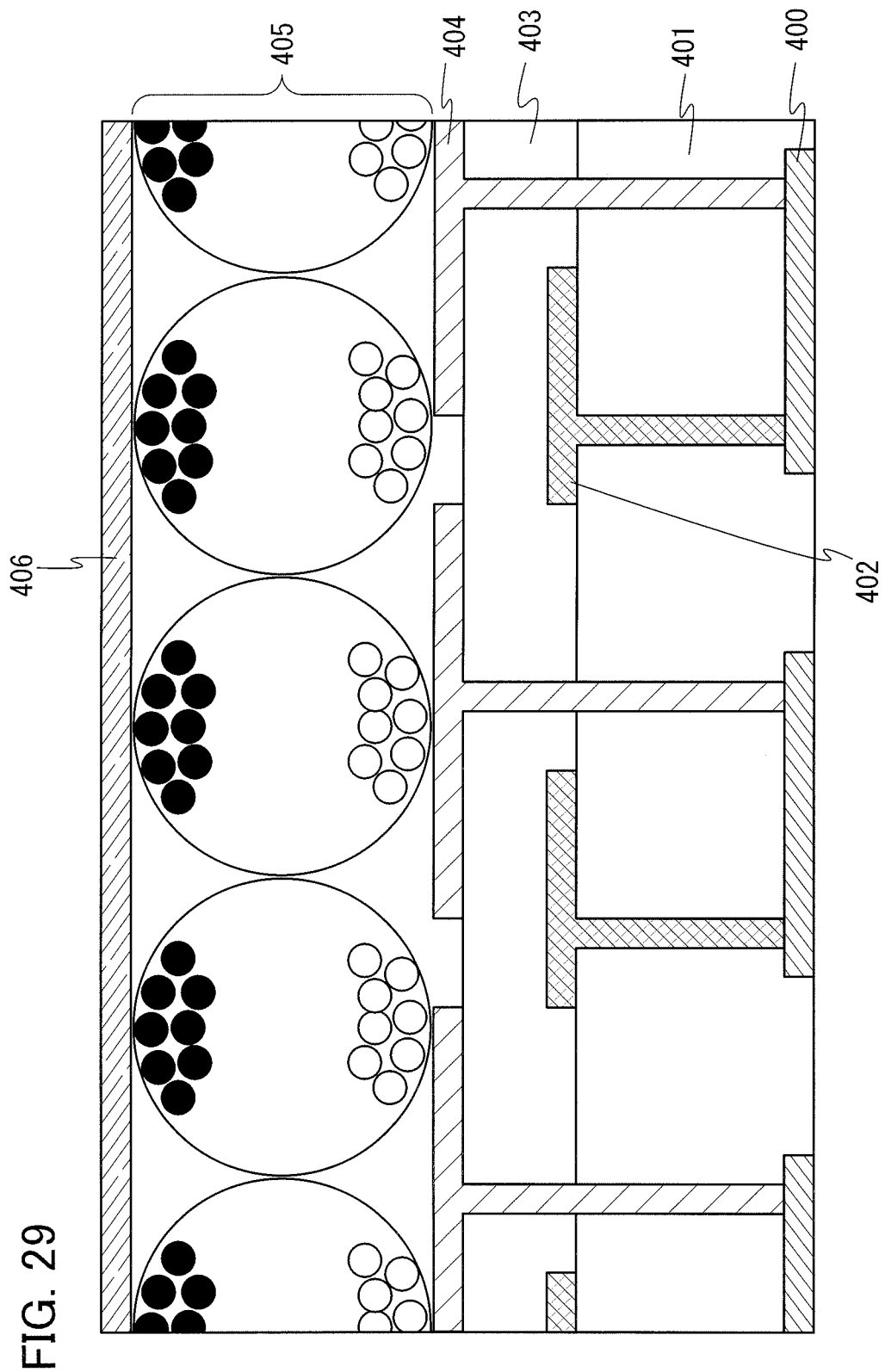
FIG. 29 is a cross-sectional view in accordance with an embodiment of the present invention.

In a structure shown in FIG. 29, electrical connection among the conductive layer 400, the conductive layer 402, and the electrode 404 is different from that in FIG. 27 and FIG. 28. Except this, FIG. 29 is similar to FIG. 27 and FIG. 28, and the description is omitted here.

In FIG. 29, a contact hole is formed in the insulating film 401 which is formed over the conductive layer 400, and the conductive layer 402 is formed. Here, the conductive layer 402 and the conductive layer 400 are electrically connected to each other. Sequentially, the insulating film 403 is formed over the conductive layer 402, and a contact hole reaching the conductive layer 400 is formed in the insulating film 401 and the insulating film 403. The electrode 404 is formed to be electrically connected to the conductive layer 400 in the contact hole.

The conductive layer 400 or the conductive layer 402 is provided to embed the region 351 and the region 352 in FIG. 21A. As a result, electrodes such as a pixel electrode and an auxiliary electrode can be provided with no space for the entire region of a pixel portion in a plane parallel to a substrate.

An example of this embodiment is described with reference to FIG. 30 and FIG. 31.

Figure 30:
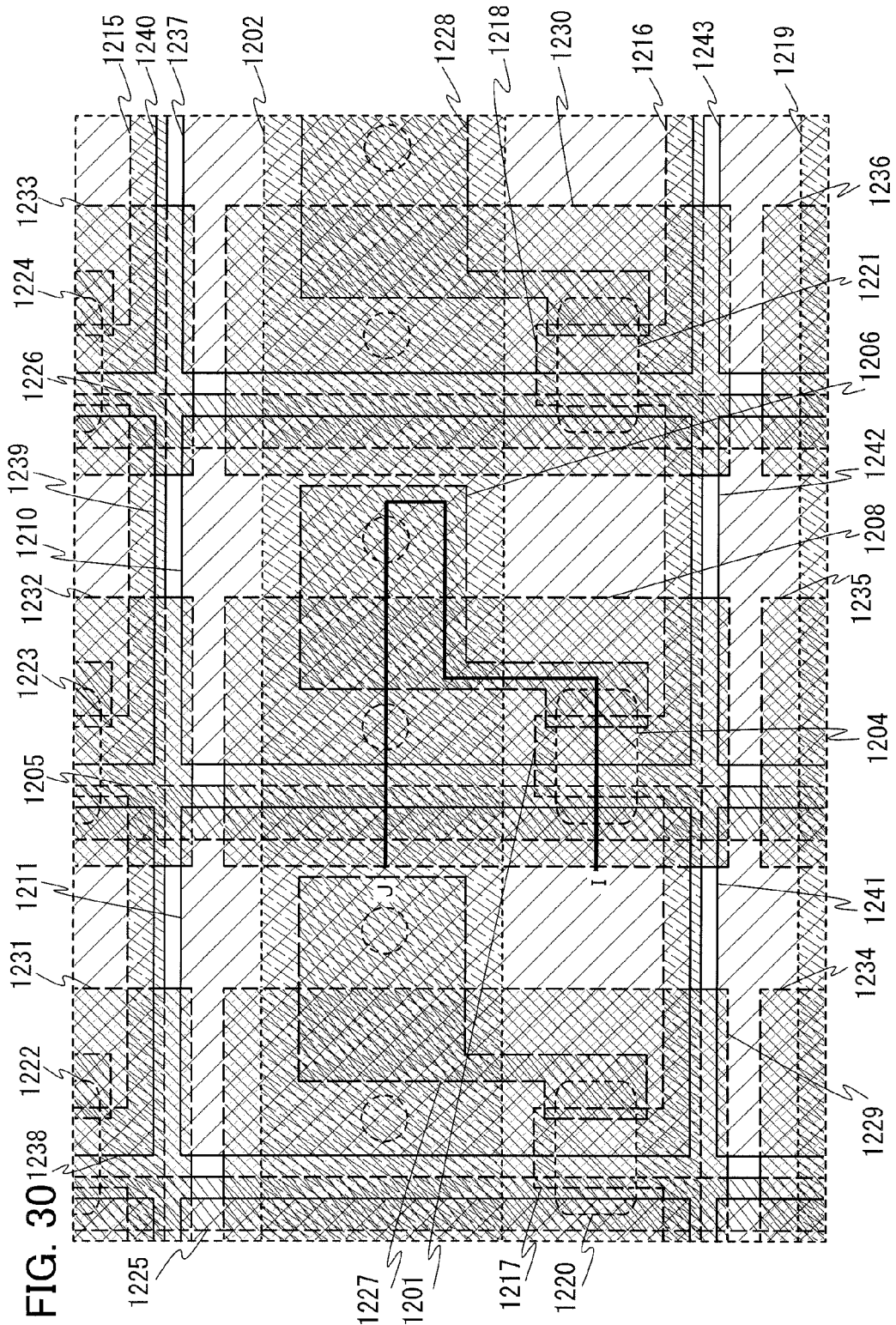
FIG. 30 is a top view in accordance with an embodiment of the present invention.
Figure 31:
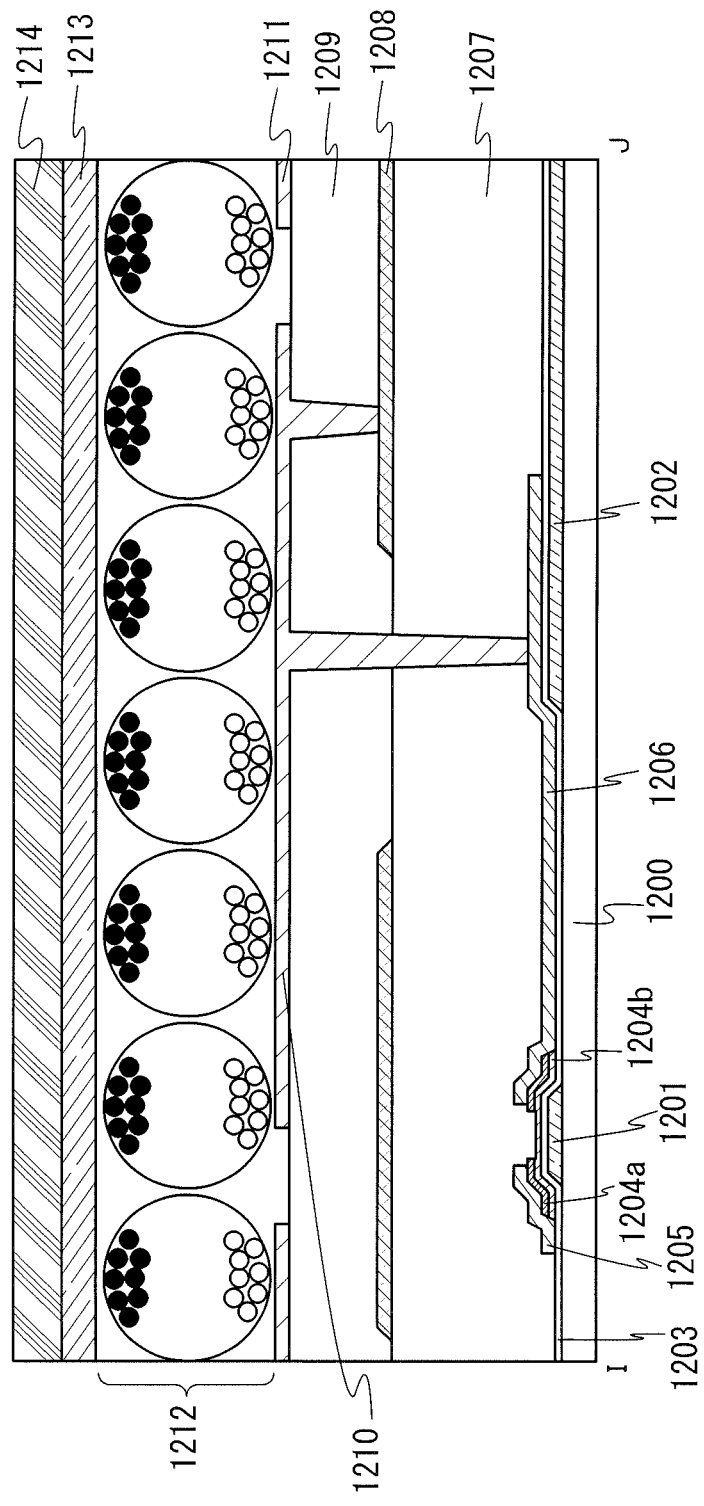
FIG. 31 is a cross-sectional view in accordance with an embodiment of the present invention.

FIG. 30 is a top view of an example of this embodiment. FIG. 31 shows a cross section I-J of FIG. 30. Note that FIG. 30 shows a gate line 1215, a gate line 1216, an electrode 1201, an electrode 1217, an electrode 1218, a wiring 1202, a wiring 1219, a semiconductor layer 1204, semiconductor layers 1220 to 1224, a conductive layer 1205, a conductive layer 1206, a conductive layer 1208, a conductive layer 1210, a conductive layer 1211, and conductive layers 1225 to 1243; elements other than them are omitted.

The electrode 1201, the electrode 1217, and the electrode 1218 can function as gate electrodes. The wiring 1202 and the wiring 1219 can function as capacitor wirings. The conductive layer 1205, the conductive layer 1225, and the conductive layer 1226 can function as source lines. The conductive layer 1206, the conductive layer 1227, and the conductive layer 1228 can function as drain electrodes or capacitor wirings. The conductive layer 1208, the conductive layers 1229 to 1236 can function as auxiliary electrodes. The conductive layer 1210, the conductive layer 1211, and the conductive layers 1237 to 1243 can function as pixel electrodes.

A conductive film is formed over a substrate 1200. The conductive film is patterned to have a desired shape, so that the electrode 1201 and the wiring 1202 are formed. The substrate 1200 can be a glass substrate, a plastic substrate, or the like. The conductive film to be the electrode 1201 and the wiring 1202 can be formed as a single layer or a multi-layer using titanium, molybdenum, tantalum, chrome, tungsten, aluminum, neodymium, copper, silver, gold, platinum, niobium, silicon, zinc, iron, barium, germanium, indium tin oxide (hereinafter, ITO), indium oxide and zinc oxide (hereinafter, IZO), zinc oxide (ZnO), and tin oxide (SnO) by sputtering, CVD, or the like. A base film may be formed over the substrate 1200 before the conductive film is formed. The base film can be formed to be a single layer or stacked layers of an insulating film such as a silicon oxide-based material film or a silicon nitride-based material. Note that the silicon oxide-based material refers to silicon oxide containing oxygen and silicon as main components, or silicon oxynitride which is silicon oxide containing nitrogen, in which the content of oxygen is higher than that of nitrogen. The silicon nitride-based material refers to silicon nitride containing nitrogen and silicon as main components, or silicon nitride oxide which is silicon nitride containing oxygen, in which the content of nitrogen is higher than that of oxygen. Note that the electrode 1217, the electrode 1218, the gate line 1215, the gate line 1216, and the wiring 1219 which are shown in FIG. 30 are formed in the same process as the electrode 1201 and the wiring 1202.

An insulating film 1203 is formed over the electrode 1201 and the wiring 1202. The insulating film 1203 can be formed using a silicon oxide-based material, a silicon nitride-based material, or the like by plasma-enhanced CVD, sputtering, or the like. The insulating film 1203 can function as a gate insulating film or an insulating film of a capacitor.

The semiconductor layer 1204 (a semiconductor layer 1204*a* and a semiconductor layer 1204*b*), is formed over the insulating film 1203. The semiconductor layer 1204*a* and the semiconductor layer 1204*b* are formed to overlap the electrode 1201 with the insulating film 1203 provided therebetween. Note that the semiconductor layers 1220 to 1224 in FIG. 30 are formed in the same process as the semiconductor layer 1204*a* and the semiconductor layer 1204*b*.

The semiconductor layer 1204 may be an amorphous semiconductor such as amorphous silicon; microcrystalline silicon; polycrystalline silicon; single crystal silicon; a compound semiconductor such as gallium arsenide (GaAs); an oxide semiconductor such as zinc oxide (ZnO) and an In—Ga—Zn—O-based material; an organic semiconductor material; or the like. Here, a case of using amorphous silicon will be described.

The semiconductor layer 1204*a* can be formed using amorphous silicon by a photolithography, inkjet, printing, or the like. Note that the semiconductor layer 1204*a* can each include a portion functioning as a channel region of a transistor.

When amorphous silicon is used for the semiconductor layer 1204*a*, there are advantages that uniformity of the transistor characteristics is high and manufacturing cost is low. In particular, the advantages are effective in forming transistors over a large substrate whose diagonal length exceeds 500 mm.

For the semiconductor layer 1204*b*, silicon including phosphorus or the like, a semiconductor material with conductivity higher than the semiconductor layer 1204*a*, or the like can be used. The semiconductor layer 1204*b* can each be expressed as a buffer layer or an n$^+$ layer because of their functions. Note that the semiconductor layer 1204*b* can each include a portion which functions as a source and a drain.

Next, the conductive layer 1205 and the conductive layer 1206 are formed. The conductive layer 1205 can include a portion which functions as one of a source and a drain. The conductive layer 1206 can include a portion which functions as the other of the source and the drain. The conductive layer 1206 is formed to partly overlap the wiring 1202. The conductive layer 1205 and the conductive layer 1206 can be formed as a single layer or a multi-layer using titanium, molybdenum, tantalum, chromium, tungsten, aluminum, neodymium, copper, silver, gold, platinum, niobium, silicon, zinc, iron, barium, ITO, IZO, zinc oxide (ZnO), and tin oxide (SnO) by sputtering, CVD, or the like. Note that the conductive layers 1225 to 1228 which are shown in FIG. 30 are formed in the same process as the conductive layer 1205 and the conductive layer 1206.

An insulating film 1207 is formed as a single layer or a multi-layer over the conductive layer 1205 and the conductive layer 1206. The insulating film 1207 can be formed using a silicon oxide-based material, a silicon nitride-based material, or the like by plasma-enhanced CVD, sputtering, or the like. The insulating film 1207 may be formed as a single layer or a multi-layer using an organic material; for example acrylic, polyimide, polyamide, polyimide amide, benzocyclobutene, and epoxy can be used. The insulating film 1207 may be a stacked layer of an organic material and an inorganic material. The insulating film 1207 may include a material with a light-proof property or a color filter. An example of a material with a light-proof property is a carbon black and organic resin including a black pigment.

Next, the conductive layer 1208 are formed over the insulating film 1207. The conductive layer 1208 can be formed as a single layer or a multi-layer using titanium, molybdenum, tantalum, chromium, tungsten, aluminum, neodymium, copper, silver, gold, platinum, niobium, silicon, zinc, iron, barium, ITO, IZO, zinc oxide (ZnO), and tin oxide (SnO) by sputtering, CVD, or the like. The conductive layers 1229 to 1236 which are shown in FIG. 30 are formed in the same process as the conductive layer 1208.

An insulating film 1209 is formed over the conductive layer 1208. The insulating film 1209 can be formed using a silicon oxide-based material, a silicon nitride-based material, or the like by plasma-enhanced CVD, sputtering, or the like. The insulating film 1209 may be formed as a single layer or a multi-layer using an organic material; for example acrylic, polyimide, polyamide, polyimide amide, benzocyclobutene, and epoxy can be used. The insulating film 1209 may be a stacked layer of an organic material and an inorganic material. The insulating film 1209 may include a material with a light-proof property. An example of a material with a light-proof property is a carbon black and organic resin including a black pigment.

Then, the insulating film 1207 and the insulating film 1209 are etched to form a contact hole reaching the conductive layer 1206 and a contact hole reaching the conductive layer 1208 at the same time. Sequentially, the conductive layer 1210 electrically connected to the conductive layer 1206 and the conductive layer 1208 is formed. The conductive layer 1211, the conductive layers 1237 to 1243 shown in FIG. 30 are formed in the same process as the conductive layer 1210.

Here, viewing the top and the bottom of the display device, the conductive layer 1208 which can function as an auxiliary electrode is provided a space between the conductive layer 1210 and the conductive layer 1211. With such a structure, an electric field driving display device in which display defects are reduced can be obtained.

A layer 1212 is formed over the conductive layer 1210 and the conductive layer 1211. The layer 1212 includes a display medium. An example of a structure of the layer 1212 is a structure in which microcapsules are dispersed and fixed.

Sequentially, a conductive layer 1213 is formed over the layer 1212. The conductive layer 1213 can include a metal material such as titanium, molybdenum, tantalum, chromium, tungsten, aluminum, neodymium, copper, silver, gold, platinum, niobium, silicon, zinc, iron, barium, or germanium, a light-transmitting material such as ITO or IZO, or the like.

A protector 1214 is formed over the conductive layer 1213. For the protector 1214, a plastic substrate, a resin substrate, a film substrate, a glass substrate, or the like can be used.

The thickness of the insulating film 1207 which can function as a planarization film is 1 μm to 2 μm. The thickness of the insulating film 1209 is a few nm to 2 μm. The insulating film 1207 is formed over the conductive layers 1205 and 1206, so that the roughness of a surface over which the conductive layer 1208 which function as auxiliary electrodes are formed can be reduced. By forming the insulating film 1207, capacitance between the conductive layer 1206 and the conductive layer 1208 and capacitance between the conductive layer 1206 and the conductive layer 1210 can be reduced; therefore, noise and crosstalk can be prevented.

In FIG. 30, the conductive layer 1231 is formed to partly overlap the conductive layer 1238 and the conductive layer 1211. The conductive layer 1232 is formed to partly overlap the conductive layer 1238, the conductive layer 1239, the conductive layer 1211, and the conductive layer 1210. The conductive layer 1233 is formed to partly overlap the conductive layer 1239, the conductive layer 1240, the conductive layer 1210, and the conductive layer 1237. The conductive layer 1229 is formed to partly overlap the conductive layer 1211 and the conductive layer 1241. The conductive layer 1208 is formed to partly overlap the conductive layer 1211, the conductive layer 1210, the conductive layer 1241, and the conductive layer 1242. The conductive layer 1230 is formed to partly overlap the conductive layer 1210, the conductive layer 1237, the conductive layer 1242, and the conductive layer 1243. The conductive layer 1234 is formed to partly overlap the conductive layer 1241. The conductive layer 1235 is formed to partly overlap the conductive layer 1241 and the conductive layer 1242. The conductive layer 1236 is formed to partly overlap the conductive layer 1242 and the conductive layer 1243.

By employing such a structure, a display device in which in which display defects are reduced can be obtained.

Note that this embodiment can be combined with the structure described in any of the other embodiments in this specification as appropriate.

Embodiment 5

FIGS. 40A and 40B are top views of an electric field driving display device of one example of the present invention. In this embodiment, position of an electrode functioning as an auxiliary electrode is described.

As shown in FIG. 40A, a gate electrode 1401, a gate electrode 1402, a gate line 1403, and a gate line 1404 are formed. A semiconductor layer 1405 is formed over the gate electrode 1401. A semiconductor layer 1406 is formed over the gate electrode 1402. A source electrode 1407 and a drain electrode 1408 are formed over the semiconductor layer 1405. A source electrode 1409 and a drain electrode (not shown) are formed over the semiconductor layer 1406. The source electrode 1407 and the source electrode 1409 are also referred to as source lines. An electrode 1410 electrically connected to the drain electrode 1408 with an insulating film provided therebetween is formed over the drain electrode 1408. Electrodes 1411 to 1413 are formed in the same process as the electrode 1410. An electrode 1414 electrically connected to the electrode 1410 with the insulating film provided therebetween is formed over the electrode 1410. Electrodes 1415 to 1417 are formed in the same process as the electrode 1414. The electrodes 1410 to 1413 can function as pixel electrodes. The electrodes 1414 to 1417 can function as auxiliary electrodes.

A space between the adjacent pixel electrodes is provided along a gate line and a source line. For example, in the case of the electrode 1410, a space between the electrode 1410 and the electrode 1412 is provided along the gate line and a space between the electrode 1410 and the electrode 1413 is provided along the source line. As shown in FIG. 40A, an auxiliary electrode may be provided in a space between the adjacent pixel electrodes which is provided along the source line. In FIG. 40A, the electrode 1414 is provided in the space between the electrode 1410 and the electrode 1413, and the electrode 1415 is provided in a space between the electrode 1411 and the electrode 1412. The electrode 1416 is provided in a space between the electrode 1412 and an electrode (not shown) which is formed to the immediate right of the electrode 1412. The electrode 1417 is provided in a space between the electrode 1410 and an electrode (not shown) which is formed to the immediate right of the electrode 1410.

FIG. 40B shows an example of the case where an auxiliary electrode is provided in a space provided along a gate line.

As shown in FIG. 40A, a gate electrode 1451, a gate electrode 1452, a gate line 1453, and a gate line 1454 are formed. A semiconductor layer 1455 is formed over the gate electrode 1451. A semiconductor layer 1456 is formed over the gate electrode 1452. A source electrode 1457 and a drain electrode 1458 are formed over the semiconductor layer 1455. A source electrode 1459 and a drain electrode (not shown) are formed over the semiconductor layer 1456. The source electrode 1457 and the source electrode 1459 are also referred to as source lines. An electrode 1460 electrically connected to the drain electrode 1458 with an insulating film provided therebetween is formed over the drain electrode 1458. Electrodes 1461 to 1463 are formed in the same process as the electrode 1460. An electrode 1464 electrically connected to the electrode 1460 with the insulating film provided therebetween is formed over the electrode 1460. Electrodes 1465 to 1467 are formed in the same process as the electrode 1464. The electrodes 1460 to 1463 can function as pixel electrodes. The electrodes 1464 to 1467 can function as auxiliary electrodes. The electrode 1465 is provided in a space between the electrode 1460 and the electrode 1462.

By employing such a structure, a display device in which in which display defects are reduced can be obtained.

Note that this embodiment can be combined with the structure described in any of the other embodiments in this specification as appropriate.

Embodiment 6

FIGS. 32A and 32B, FIGS. 33A and 33B, and FIGS. 34A and 34B are each a schematic cross sectional view of an example of an electric field driving display device of the present invention.

Figure 32A:
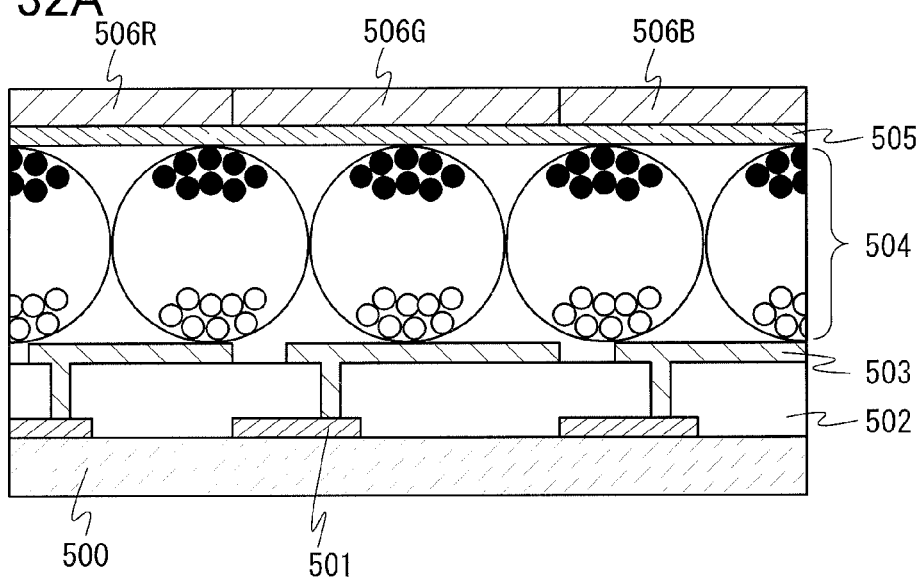
FIGS. 32A and 32B are cross-sectional views in accordance with an embodiment of the present invention.
Figure 32B:
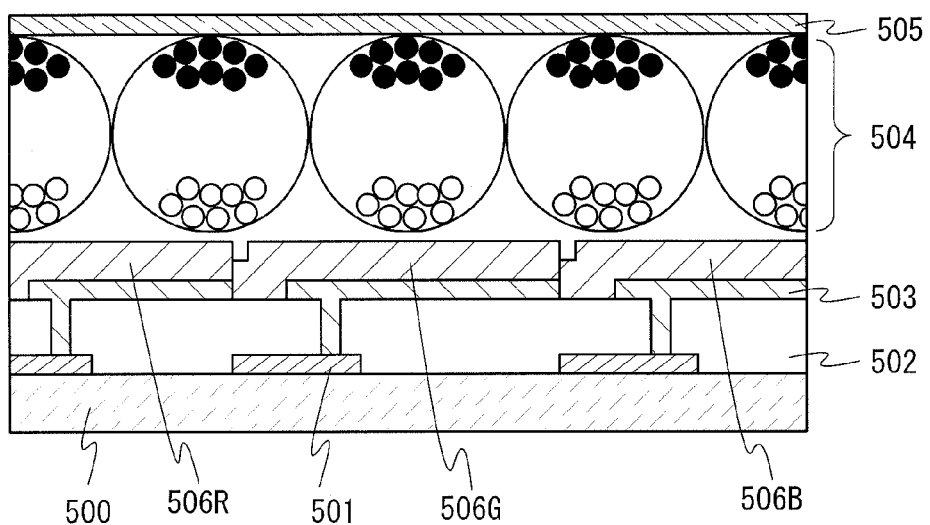

FIGS. 32A and 32B show structures in which an image is displayed on an electrode 505 side. The electrode 505 can function as a counter electrode.

The structure shown in FIG. 32A is described. An electrode 501 is formed over an insulating film 500. An insulating film 502 is formed over the electrode 501. A contact hole is formed in the insulating film 502, and an electrode 503 electrically connected to the electrode 501 is formed. A layer 504 is formed over the electrode 503 and includes a display medium. The electrode 505 is formed over the layer 504. An insulating film 506R, an insulating film 506G, and an insulating film 506B are formed over the electrode 505. Note that the electrode 501 can function as an auxiliary electrode. The electrode 503 can function as a pixel electrode. The electrode 505 can function as a counter electrode.

In FIG. 32A, one of or both of the insulating film 500 and the insulating film 502 may include a material with a light-proof property. An example of a material with a light-proof property is a carbon black and organic resin including a black pigment. The insulating film 506R can function as a red color filter. The insulating film 506G can function as a green color filter. The insulating film 506B can function as a blue color filter.

In FIG. 32B, position of the insulating film 506R, the insulating film 506G, and the insulating film 506B is different from that in FIG. 32A. In FIG. 32B, the insulating film 506R, the insulating film 506G, and the insulating film 506B are provided over the electrode 503.

Figure 33A:
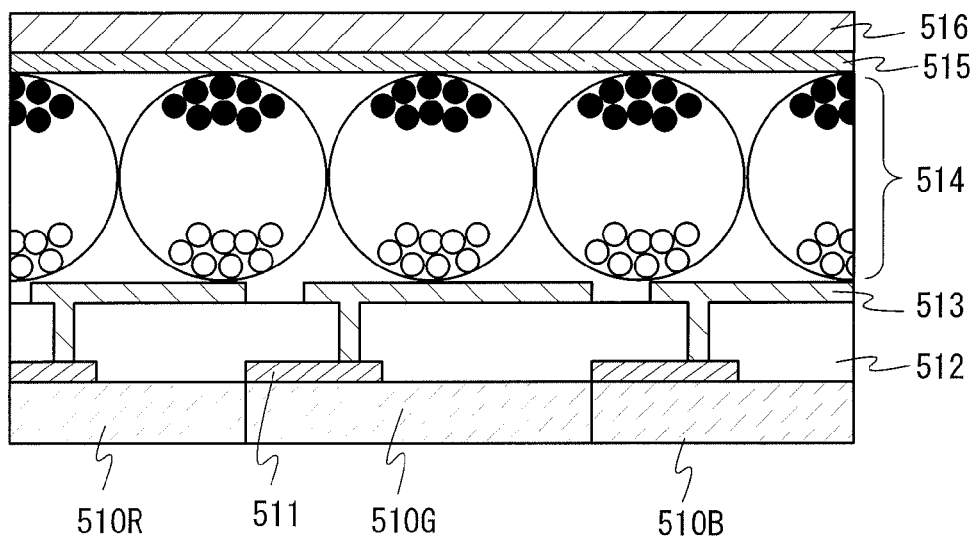
FIGS. 33A and 33B are cross-sectional views in accordance with an embodiment of the present invention.
Figure 33B:
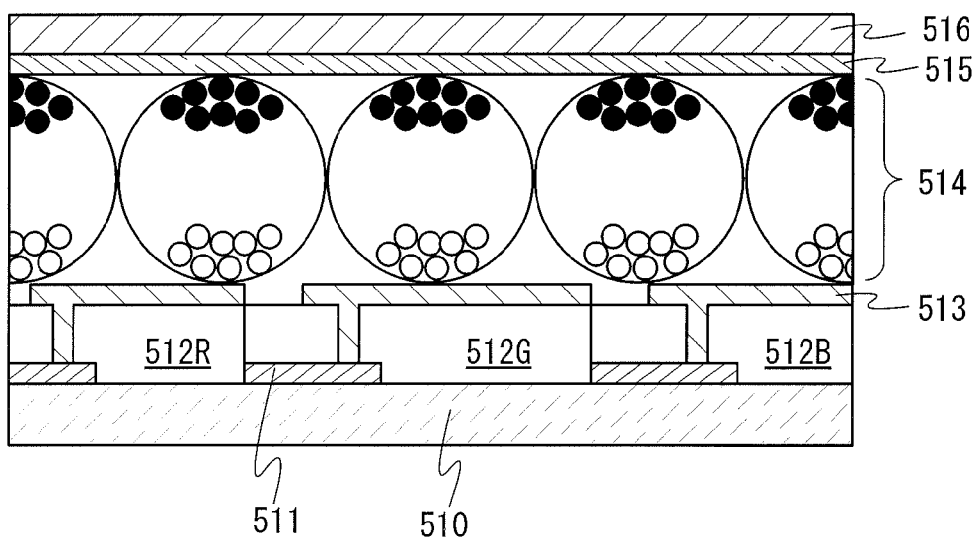

FIGS. 33A and 33B show structures in which an image is displayed on an electrode 513 side. The electrode 513 can faction as a pixel electrode.

The structure shown in FIG. 33A is described. An electrode 511 is formed over an insulating film 510R, an insulating film 510 and an insulating film 510B. An insulating film 512 is formed over the electrode 511. A contact hole is formed in the insulating film 512, and the electrode 513 electrically connected to the electrode 511 is formed. A layer 514 is formed over the electrode 513 and includes a display medium. An electrode 515 is formed over the layer 514. An insulating film 516 is formed over the electrode 515. Note that the electrode 511 can fiction as an auxiliary electrode. The electrode 513 can function as a pixel electrode. The electrode 515 can function as a counter electrode. The insulating film 510R can function as a red color filter. The insulating film 510G can function as a green color filter. The insulating film 510B can function as a blue color filter. The insulating film 516 may include a material with a light-proof property. An example of a material with a light-proof property is a carbon black and organic resin including a black pigment.

The structure shown in FIG. 33B is described. The electrode 511 is formed over an insulating film 510. An insulating film 512R, an insulating film 512G, and an insulating film 512B are formed over the electrode 511. A contact hole is formed in each of the insulating film 512R, the insulating film 512G, and the insulating film 512B, and the electrode 513 electrically connected to the electrode 511 is formed. A layer 514 is formed over the electrode 513 and includes a display medium. An electrode 515 is formed over the layer 514. An insulating film 516 is formed over the electrode 515. Note that the electrode 511 can function as an auxiliary electrode. The electrode 513 can function as a pixel electrode. The electrode 515 can function as a counter electrode. The insulating film 512R can function as a red color filter. The insulating film 512G can function as a green color filter. The insulating film 512B can function as a blue color filter. The insulating film 516 may include a material with a light-proof property. An example of a material with a light-proof property is a carbon black and organic resin including a black pigment.

Figure 34A:
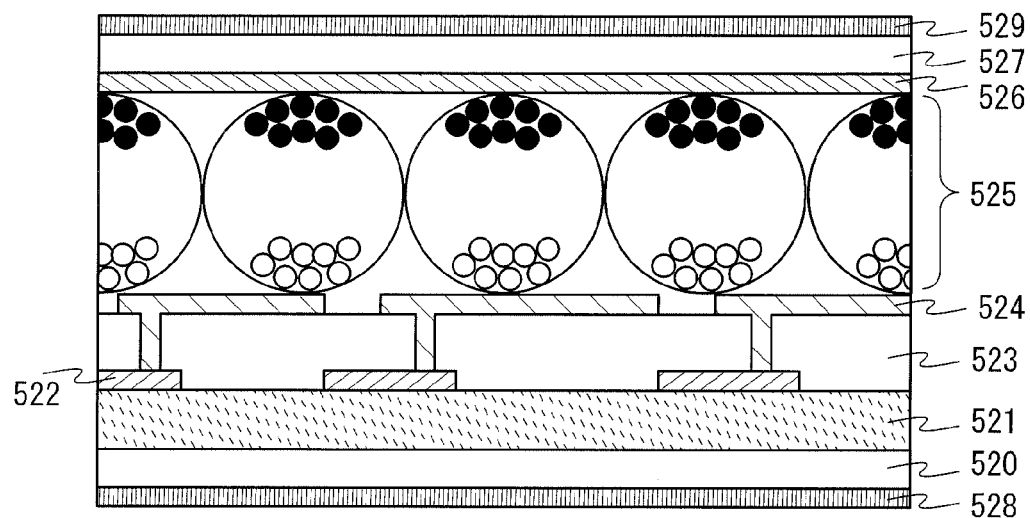
FIGS. 34A and 34B are cross-sectional views in accordance with an embodiment of the present invention.
Figure 34B:
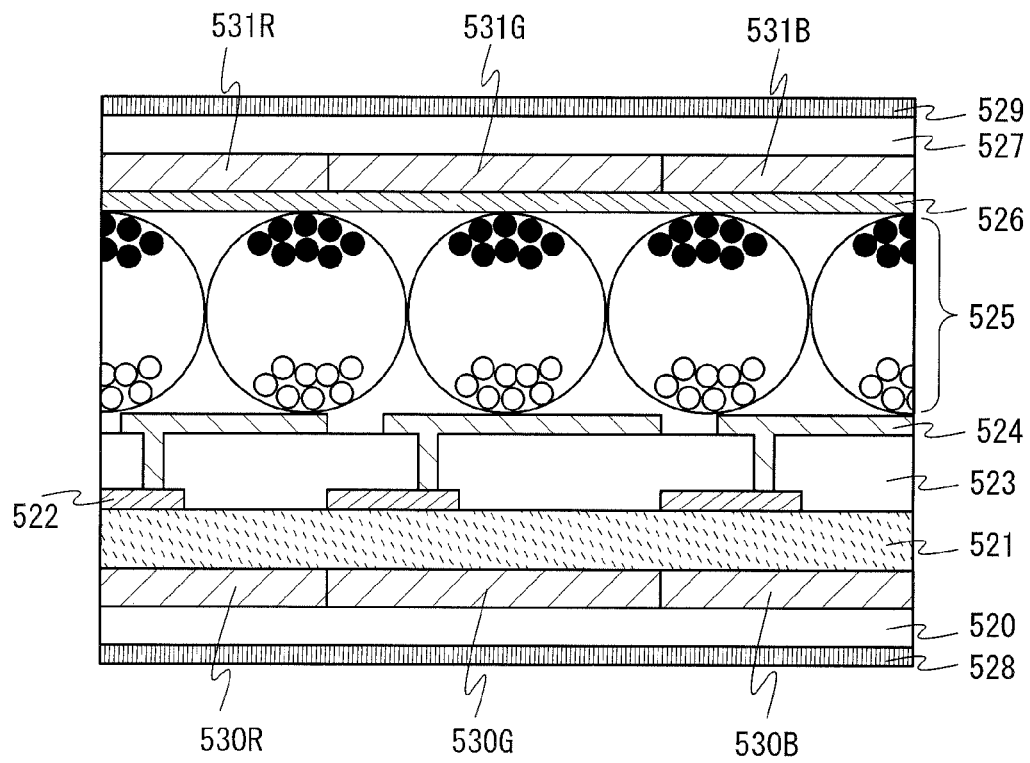

FIGS. 34A and 34B show structures in which images are displayed on an electrode 526 side and an electrode 524 side. The electrode 526 can function as a counter electrode and the electrode 524 can function as a pixel electrode. Polarizing plates can be provided over both surfaces of the display device in order that a view may not be seen through the display device when the display device is seen from any one of sides.

The structure shown in FIG. 34A is described. A layer 521 is formed over a substrate 520. The layer 521 includes TFT and the like. An electrode 522 is formed over the layer 521. Note that in FIG. 34A, the electrode 522 is formed over the layer 521; however, the electrode 522 may be a source electrode or a drain electrode of a TFT included in the layer 521. The electrode 522 is electrically connected to a source electrode or a drain electrode of a TFT included in the layer 521. An insulating film 523 is formed over the electrode 522. A contact hole is formed in the insulating film 523, and the electrode 524 electrically connected to the electrode 522 is formed. A layer 525 is formed over the electrode 524 and includes a display medium. The electrode 526 is formed over the layer 525. A substrate 527 is formed over the electrode 526. The substrate 520 and the substrate 527 may be a glass substrate, a plastic substrate, or the like. The electrode 522 can function as an auxiliary electrode. The electrode 524 can function as a pixel electrode. The electrode 526 can function as a counter electrode. A polarizing plate 528 is provided in contact with the substrate 520. A polarizing plate 529 is provided in contact with the substrate 527. The polarization axis of the polarizing plate 528 and the polarization axis of the polarizing plate 529 are orthogonal to each other (crossed Nichols).

FIG. 34B shows a structure in which a color filter is added to the structure shown in FIG. 34A. In FIG. 34B, a color filter 530R, a color filter 530G, and a color filter 530B are formed between the substrate 520 and the layer 521. A color filter 531R, a color filter 531G, and a color filter 531B are provided between the substrate 527 and the electrode 526. The color filter 530R and the color filter 531R are red color filters. The color filter 530G and the color filter 531G are green color filters. The color filter 530B and the color filter 531B are blue color filters.

Polarizing plates are provided for both substrates as described above, whereby a display device through which a view is not seen can be obtained.

Note that this embodiment can be combined with the structure described in any of the other embodiments in this specification as appropriate. Note that description in this embodiment is an example and is not the all description of the embodiment of the present invention.

Embodiment 7

In this embodiment, a positional relation between a pixel electrode and an auxiliary electrode of an electric field driving display device of the present invention will be described with reference to drawings.

Figure 35A:
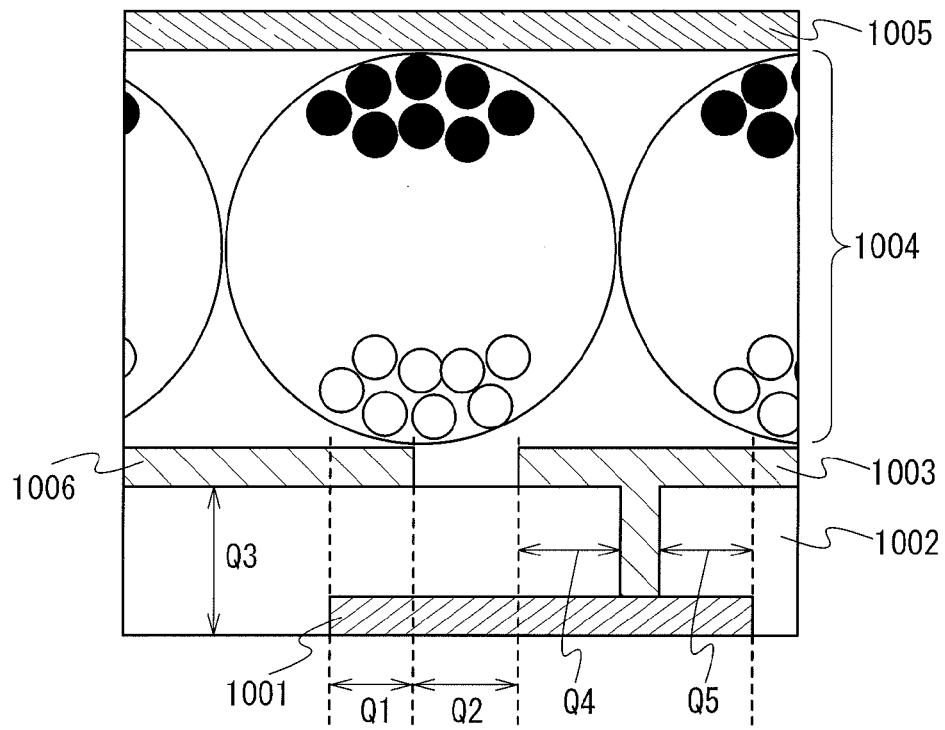
FIGS. 35A and 35B are cross-sectional views in accordance with an embodiment of the present invention.

In FIG. 35A, an insulating film 1002 is formed over the electrode 1001. A contact hole is formed in the insulating film 1002, and an electrode 1003 electrically connected to the electrode 1001 is formed. A layer 1004 is formed over the electrode 1003 and includes a display medium. An electrode 1005 is formed over the layer 1004. An electrode 1006 is formed in the same process of the electrode 1003 and these electrodes are electrodes included in adjacent pixels. The electrode 1001 is provided to overlap a region between the electrode 1003 and the electrode 1006 and to partly overlap the electrode 1006. The electrode 1001 can function as an auxiliary electrode. The electrode 1003 and the electrode 1006 can function as pixel electrodes. The electrode 1005 can function as a counter electrode. In this specification, the auxiliary electrode has the same or smaller area than that of the pixel electrode.

The length of the region in which the electrode 1001 and the electrode 1006 are overlapped with each other is denoted by Q1. The length of a region between the electrode 1006 and the electrode 1003 is denoted by Q2. The thickness of the insulating film 1002 is denoted by Q3. At that time, it is possible to provide a region in which the electrode 1001 and the electrode 1006 are overlapped with each other (Q1>0) and a region which satisfies Q1<Q2. Thus, manufacturing variation can be reduced. Further, an electric field can be almost uniformly applied to a display medium included in the layer 1004; therefore, an electric field driving display device in which a residual image is less likely to occur can be fabricated. Note that an example of this embodiment is not limited to the structure. Note that in consideration of an influence of parasitic capacitance caused by overlapping the electrode 1001 with the electrode 1006, it is preferable to provide a region which satisfies Q1<Q3.

The length obtained by substraction of the length of a region in which the electrode 1001 does not overlap the electrode 1003 (the length between the electrode 1006 and the electrode 1003 is referred to as Q2) from a length between a contact portion (a region in which a wiring electrically connecting the electrode 1003 and the electrode 1001 is provided) and the electrode 1006, that is, the length of a region in which the electrode 1001 overlaps the electrode 1003 is denoted by Q4. A distance from the contact portion of the electrode 1003 to an end of the electrode 1001 is denoted by Q5. As for Q4 and Q5, in consideration of mask misalignment, a region in which Q4>0 and Q5>0 are preferably satisfied is preferably provided. At that time, it is preferable to provide a region in which Q1<Q4 and Q1<Q5 are satisfied. Note that an example of this embodiment is not limited to the structure.

Figure 35B:
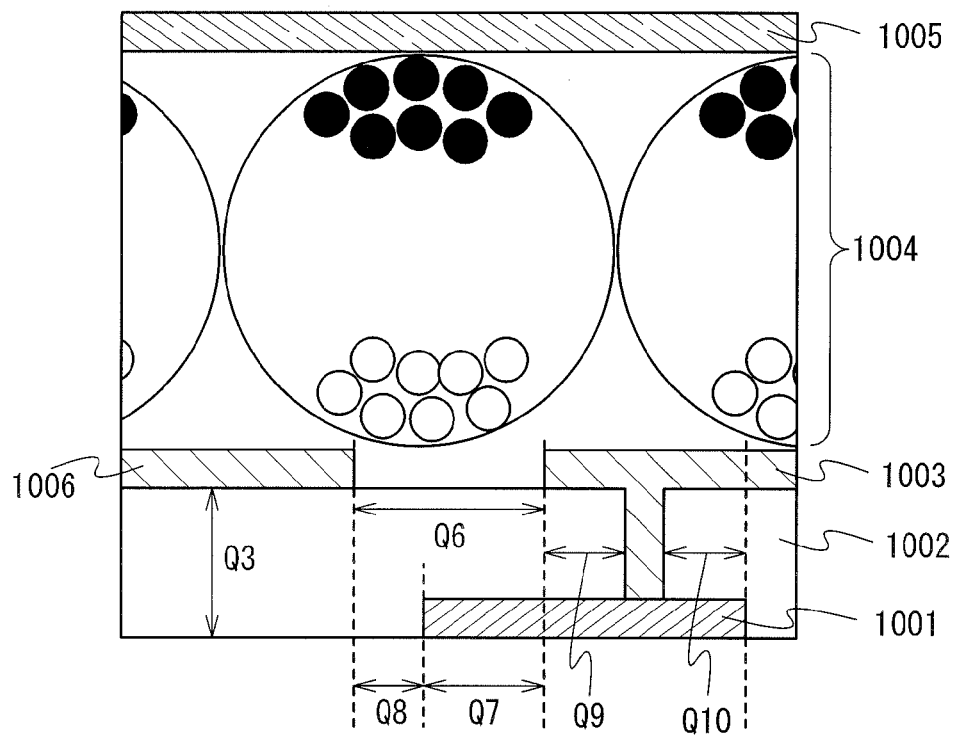

Another example is described with reference to FIG. 35B. FIG. 35B is different from FIG. 35A in a position of the electrode 1001. The electrode 1001 is electrically connected to the electrode 1003. The electrode 1001 is provided to partly overlap a region between the electrode 1003 and the electrode 1006 and not to overlap the electrode 1006. In FIG. 35B, the electrode 1001 can function as an auxiliary electrode, the electrode 1003 and the electrode 1006 can function as pixel electrodes, and the electrode 1005 can function as a counter electrode.

The length of the region between the electrode 1003 and the electrode 1006 is denoted by Q6. The length of a region in which the electrode 1001 overlaps the region between the electrode 1003 and the electrode 1006 is denoted by Q7 and the length of a region in which the electrode 1001 does not overlap the region is denoted by Q8. Note that Q6>Q7 and Q6>Q8 are satisfied. In order to almost uniformly apply an electric field to a display medium included in the layer 1004, it is preferable to provide a region in which Q7>Q8 is satisfied; but an embodiment of the present invention is not limited thereto. In addition, it is possible to provide a region in which the electrode 1001 does not overlap the region (Q8>0) between the electrode 1003 and the electrode 1006 and a region satisfying Q3>Q8 is provided. Thus, the influence of crosstalk between a pixel (a pixel including the electrode 1003) and an adjacent pixel (the pixel including the electrode 1006) can be reduced.

The length obtained by substraction of the length of the region between the electrode 1003 and the electrode 1006 (Q6) is subtracted from the length of the region between a contact portion (a region in which a wiring electrically connecting the electrode 1003 and the electrode 1001 is provided) and the electrode 1006, that is, the length of a region in which the electrode 1001 overlaps the electrode 1003 is denoted by Q9. A distance from the contact portion of the the electrode 1003 to an end of the electrode 1001 is denoted by Q10. As for Q9 and Q10, in consideration of mask misalignment, a region in which Q9>0 and Q10>0 are satisfied is preferably provided; however, an embodiment of the present invention is not limited thereto. At that time, it is preferable to provide a region in which Q8<Q9, Q8<Q10, Q7<Q9, and Q7<Q10 are satisfied; however, an example of this embodiment is not limited to the structure.

As described above, the electrode 1001 may be provided to overlap all of or part of the region between the electrode 1003 and the electrode 1006 adjacent to each other. Even when the electrode 1001 is formed to overlap part of the region between the electrode 1003 and the electrode 1006, an electric field is generated between the electrode 1003 and the electrode 1006 by the electrode 1001. Therefore, in comparison with the case where the electrode 1001 is not provided, an electric field driving display device in which a residual is less likely to occur can be fabricated.

Note that this embodiment can be combined with the structure described in any of the other embodiments in this specification as appropriate.

Embodiment 8

In this embodiment, a process of manufacturing a display device using a TFT including amorphous silicon is described.

Figure 36A:
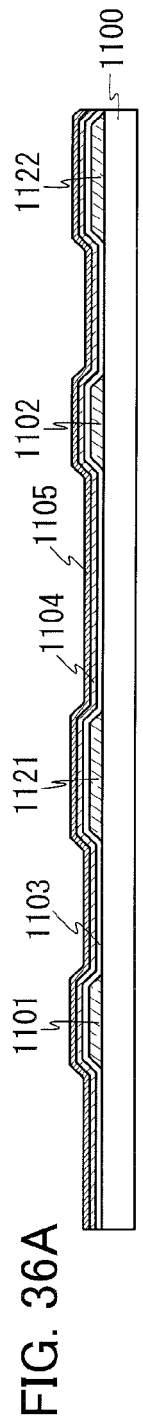
FIGS. 36A to 36E are cross-sectional views in accordance with an embodiment of the present invention.

As shown in FIG. 36A, a conductive film is formed over a substrate 1100 and then the conductive film is processed (patterned) to have a desired shape, so that an electrode 1101, an electrode 1102, a conductive layer 1121, and a conductive layer 1122 are formed. The substrate 1100 may be, for example, a glass substrate such as barium borosilicate glass substrate and an aluminoborosilicate glass substrate, a ceramic substrate, and a plastic substrate. The electrode 1101 and the electrode 1102 can function as gate electrodes. The conductive film which is to be the electrode 1101, the electrode 1102, the conductive layer 1121, and the conductive layer 1122 may be formed as a single layer or a multi-layer using titanium, molybdenum, tantalum, chromium, tungsten, aluminum, neodymium, copper, silver, gold, platinum, niobium, silicon, zinc, iron, barium, germanium, indium tin oxide (hereinafter, ITO), indium oxide and zinc oxide (hereinafter, IZO), zinc oxide (ZnO), and tin oxide (SnO) by sputtering, CVD, or the like.

An insulating film 1103 is formed to cover the electrode 1101, the electrode 1102, the conductive layer 1121, and the conductive layer 1122. The insulating film 1103 can be formed as a single layer or a multi-layer using a silicon oxide-based material, a silicon nitride-based material, or the like by plasma CVD, sputtering, or the like. The insulating film 1103 can function as a gate insulating film. In the case where the conductive layer 1121 and the conductive layer 1122 function as electrodes of a capacitor, the insulating film 1103 formed in contact with the conductive layer can function as an insulating film of the capacitor.

A semiconductor film 1104 is formed over the insulating film 1103. The semiconductor film 1104 has a thickness of 20 nm to 200 nm (preferably, 50 nm to 150 nm). The semiconductor film 1104 is formed using amorphous silicon by photolithography, ink jet, printing, or the like.

Then, a semiconductor film 1105 is formed over the semiconductor film 1104. For the semiconductor film 1105, silicon including phosphorus or the like, a semiconductor material with conductivity higher than the semiconductor film 1104, or the like can be used.

The insulating film 1103, the semiconductor film 1104, and the semiconductor film 1105 can be formed successively without exposing to the air. That is, since each interface of the stack can be formed without being polluted by an air component or by an impurity element floating in the air, variation of characteristics of a transistor can be reduced.

Figure 36B:
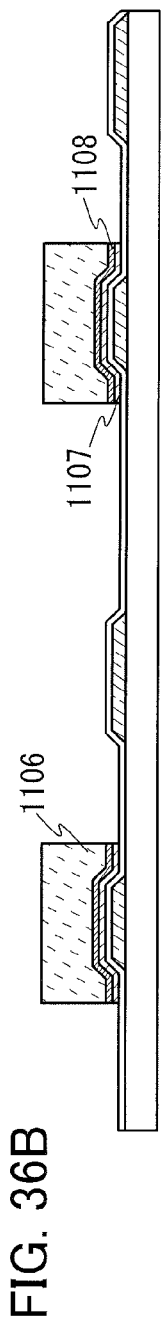

As shown in FIG. 36B, a mask 1106 is formed and the semiconductor film 1104 and the semiconductor film 1105 are processed (patterned) to have a desired shape. The semiconductor film 1104 and the semiconductor film 1105 are divided and island-shaped, so that a semiconductor layer 1107 and a semiconductor layer 1108 are formed.

Figure 36C:
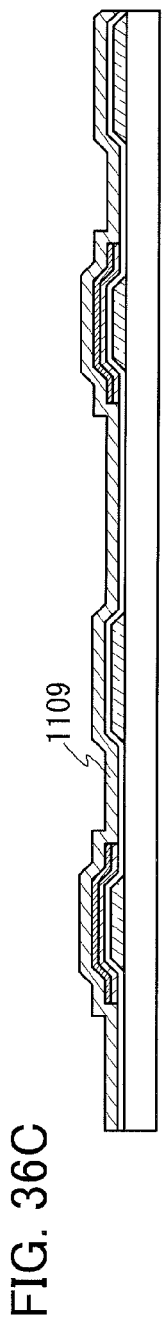

As shown in FIG. 36C, a conductive film 1109 is formed after the mask 1106 is removed. The conductive film 1109 can be formed as a single layer or a multi-layer using titanium, molybdenum, tantalum, chromium, tungsten, aluminum, neodymium, copper, silver, gold, platinum, niobium, silicon, zinc, iron, barium, germanium, ITO, IZO, zinc oxide (ZnO), or tin oxide (SnO) by sputtering, CVD, or the like.

Figure 36D:
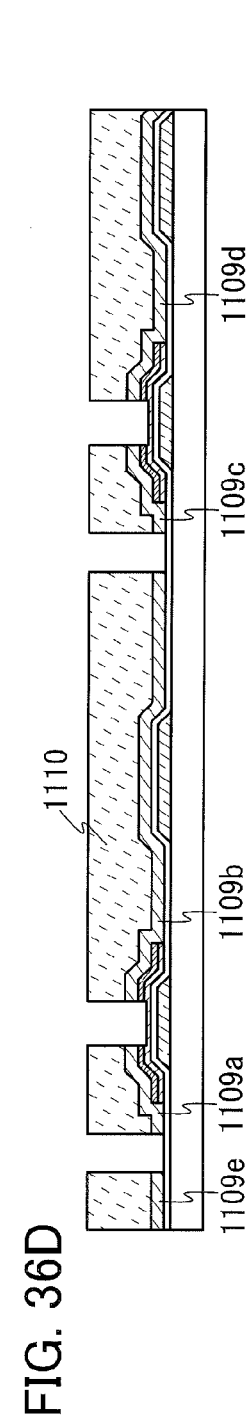

As shown in FIG. 36D, a mask 1110 is formed. The mask 1110 is a mask for patterning the conductive film 1109 and forming an electrode which can function as a source electrode or a drain electrode. At the same time, the mask 1110 is used as an etching mask for etching part of the semiconductor layer 1108 for forming a channel formation region. The conductive film 1109 is patterned to form electrodes 1109a to 1109e. The electrode 1109b and the electrode 1109d can function as auxiliary electrodes.

Figure 36E:
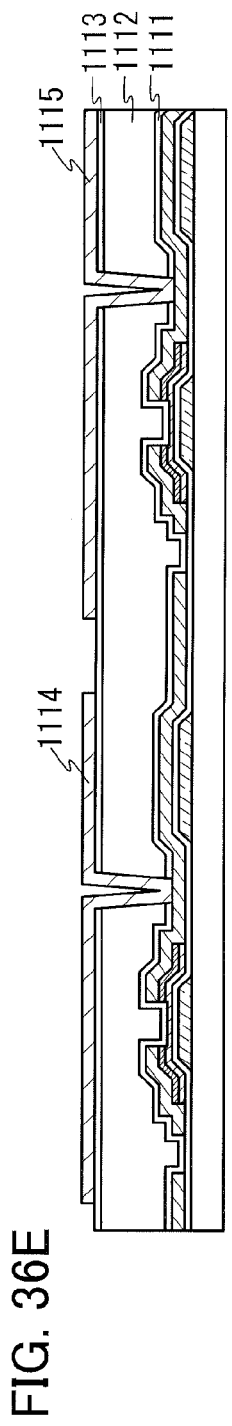

As shown in FIG. 36E, an insulating film 1111 is formed after the mask 1110 is removed. The insulating film 1111 is formed using silicon nitride or the like by sputtering or grow discharge decomposition. By forming the insulating film 1111, the channel region can be protected.

Note that the semiconductor layer 1107 can include a portion functioning as the channel region of a transistor. The semiconductor layer 1108 can include portions functioning as a source region and a drain region of the transistor.

Then, an insulating film 1112 is formed. The insulating film 1112 can be formed using a silicon oxide-based material, a silicon nitride-based material, or the like by plasma-enhanced CVD, sputtering, or the like. The insulating film 1112 may be formed as a single layer or a multi-layer using an organic material; for example acrylic, polyimide, polyamide, polyimide amide, benzocyclobutene, and epoxy can be used. The insulating film 1112 may be a stacked layer of an organic material and an inorganic material. The insulating film 1112 may include a material with a light-proof property. An example of a material with a light-proof property is a carbon black and organic resin including a black pigment. Further, an insulating film 1113 is preferably provided over the insulating film 1112. By forming the insulating film 1113, entry of moisture can be prevented. The insulating film 1113 preferably includes silicon nitride or the like.

Next, the insulating film 1111, the insulating film 1112, and the insulating film 1113 are patterned, and openings are formed to expose parts of the electrode 1109b and the electrode 1109d. Then, in the openings, an electrode 1114 electrically connected to the electrode 1109b and an electrode 1115 electrically connected to the electrode 1109d are formed. The electrode 1114 and the electrode 1115 can function as pixel electrodes.

Figure 37:
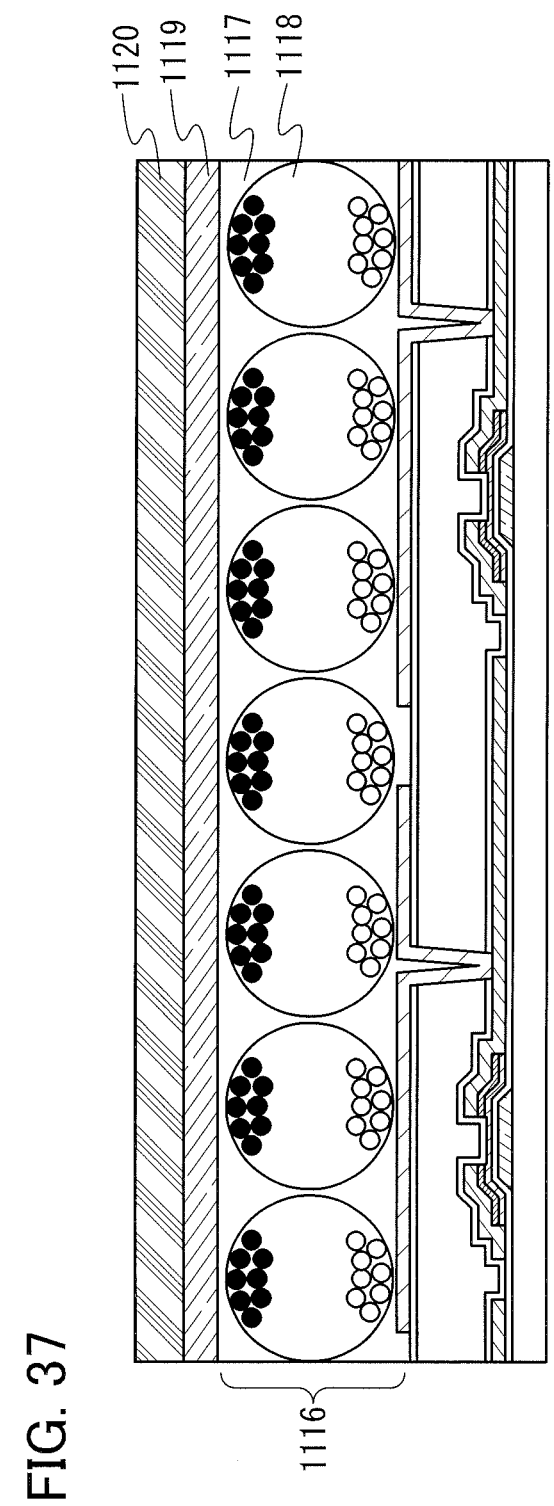
FIG. 37 is a cross-sectional view in accordance with an embodiment of the present invention.

As shown in FIG. 37, a layer 1116, a conductive film 1119, and a substrate 1120 are formed, provided, or attached over/to the electrode 1114 and the electrode 1115. The layer 1116 includes a display medium. A microcapsule 1118 is fixed in a dispersant 1117.

The conductive film 1119 can be formed as a single layer or a multi-layer using titanium, molybdenum, tantalum, chromium, tungsten, aluminum, neodymium, copper, silver, gold, platinum, niobium, silicon, zinc, iron, barium, germanium, ITO, IZO, zinc oxide (ZnO), or tin oxide (SnO). The conductive film 1119 can function as a counter electrode.

A plastic substrate, a resin substrate, a film substrate, a glass substrate, a ceramic substrate, a stainless steel substrate, a stainless steel foil substrate, or the like can be used for the substrate 1120.

Through the above steps, a display device using a TFT including amorphous silicon can be fabricated.

Note that this embodiment can be combined with the structure described in any of the other embodiments in this specification as appropriate. Note that description in this embodiment is an example and is not the all description of the embodiment of the present invention.

Embodiment 9

In this embodiment, a process of manufacturing a display device using a TFT including an oxide semiconductor is described.

Figure 38A:
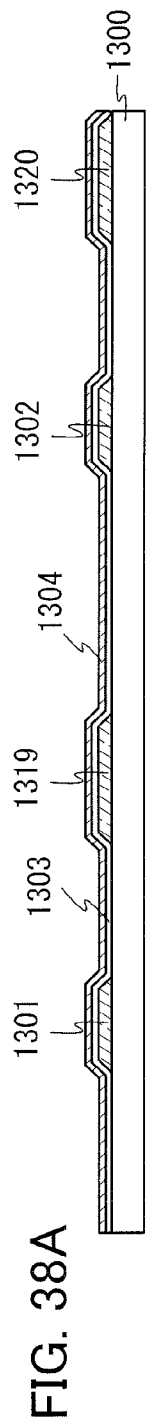
FIGS. 38A to 38E are cross-sectional views in accordance with an embodiment of the present invention.

As shown in FIG. 38A, a conductive film is formed over a substrate 1300 and then the conductive film is processed (patterned) to have a desired shape, so that an electrode 1301, an electrode 1302, a conductive layer 1319, and a conductive layer 1320 are formed. The substrate 1300 may be, for example, a glass substrate such as barium borosilicate glass substrate and an aluminoborosilicate glass substrate, a ceramic substrate, and a plastic substrate. The electrode 1301 and the electrode 1302 can function as gate electrodes. The conductive film which is to be the electrode 1301, the electrode 1302, the conductive layer 1319, and the conductive layer 1320 may be formed as a single layer or a multi-layer using titanium, molybdenum, tantalum, chromium, tungsten, aluminum, neodymium, copper, silver, gold, platinum, niobium, silicon, zinc, iron, barium, germanium, indium tin oxide (hereinafter, ITO), indium oxide and zinc oxide (hereinafter, IZO), zinc oxide (ZnO), and tin oxide (SnO) by sputtering, CVD, or the like.

An insulating film 1303 is formed to cover the electrode 1301, the electrode 1302, the conductive layer 1319, and the conductive layer 1320. The insulating film 1303 can be formed as a single layer or a multi-layer using a silicon oxide-based material, a silicon nitride-based material, or the like by plasma CVD or sputtering. The insulating film 1303 can function as a gate insulating film. In the case where the conductive layer 1319 and the conductive layer 1320 function as electrodes of a capacitor, the insulating film 1303 formed in contact with the conductive layer can function as an insulating film of the capacitor.

A semiconductor film 1304 is formed over the insulating film 1303. The semiconductor film 1304 is formed as a single layer or a multi-layer including a light-transmitting material or a material with high light transmittance. The semiconductor film 1304 is formed using an oxide semiconductor. An example of an oxide semiconductor which can be used is an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, an In—O-based material, a Sn—O-based material, or a Zn—O-based material. The oxide semiconductor film can be formed by a sputtering method in a rare gas (typically, argon) atmosphere, an oxygen atmosphere, or an atmosphere containing a rare gas (typically, argon) and oxygen. In the case of sputtering, it is preferable that the oxide semiconductor film be formed using a target including silicon oxide at from 2 wt % to 10 wt % to include silicon oxide which suppresses crystallization; thus, crystallization can be suppressed. Further, before the oxide semiconductor film 1304 is formed, dust attached to a surface of the insulating film 1303 is preferably removed by reverse sputtering in which an argon gas is introduced to a sputtering apparatus and plasma is generated. The reverse sputtering refers to a method in which, without application of a voltage to a target side, an RF power source is used for application of a voltage to a substrate side in an argon atmosphere to generate plasma in the vicinity of the substrate and modify a surface. Note that a nitrogen atmosphere, a helium atmosphere, an oxygen atmosphere, or the like may be used instead of an argon atmosphere.

Figure 38B:
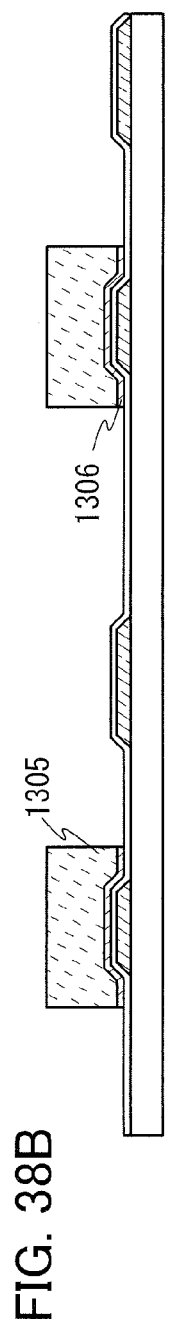

As shown in FIG. 38B, a mask 1305 is formed, the semiconductor film 1304 is processed (patterned) to have a desired shape. The semiconductor film 1304 is divided and island-shaped, so that a semiconductor layer 1306 is formed.

Figure 38C:
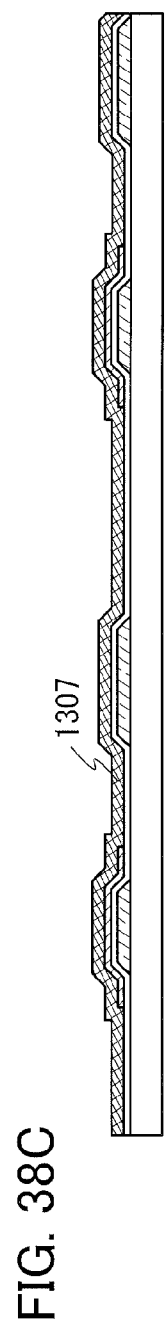

As shown in FIG. 38C, a conductive film 1307 is formed after the mask 1305 is removed. The conductive film 1307 can be formed as a single layer or a multi-layer using titanium, molybdenum, tantalum, chromium, tungsten, aluminum, neodymium, copper, silver, gold, platinum, niobium, silicon, zinc, iron, barium, germanium, ITO, IZO, zinc oxide (ZnO), or tin oxide (SnO) by sputtering, CVD, or the like.

Figure 38D:
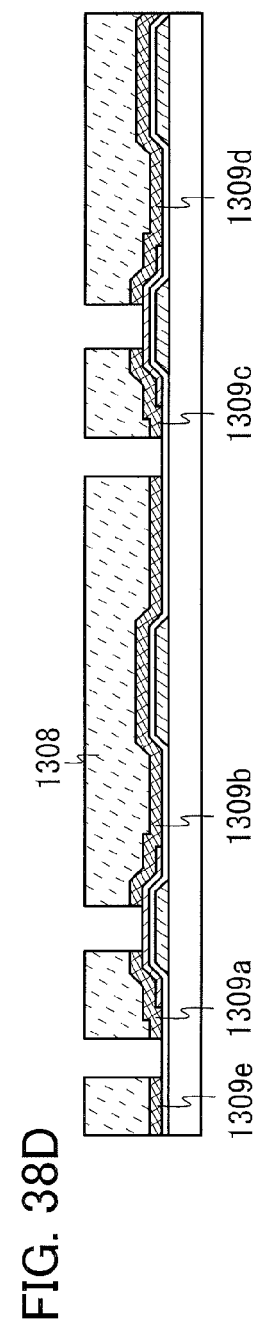

As shown in FIG. 38D, a mask 1308 is formed. The mask 1308 is a mask for patterning the conductive film 1307 and forming an electrode which can function as a source electrode or a drain electrode. The conductive film 1309 is patterned to form electrodes 1309a to 1309e. The electrode 1309b and the electrode 1309d can function as auxiliary electrodes.

Figure 38E:
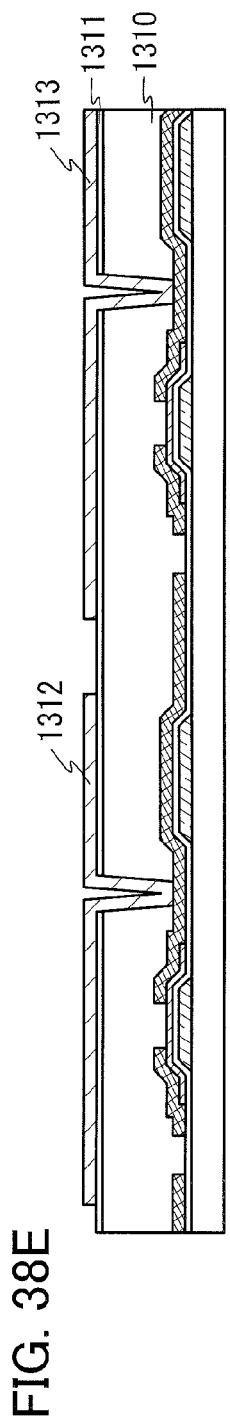

As shown in FIG. 38E, an insulating film 1310 is formed after the mask 1308 is removed. The insulating film 1310 can be formed using a silicon oxide-based material, a silicon nitride-based material, or the like by plasma-enhanced CVD, sputtering, or the like. The insulating film 1310 may be formed as a single layer or a multi-layer using an organic material; for example acrylic, polyimide, polyamide, polyimide amide, benzocyclobutene, and epoxy can be used. The insulating film 1310 may be a stacked layer of an organic material and an inorganic material. The insulating film 1310 may include a material with a light-proof property. An example of a material with a light-proof property is a carbon black and organic resin including a black pigment. Further, an insulating film 1311 is preferably provided over the insulating film 1310. By forming the insulating film 1311, entrance of moisture can be prevented. The insulating film 1311 preferably includes silicon nitride or the like.

Next, the insulating film 1310 and the insulating film 1311 are patterned, and openings are formed to expose parts of the electrode 1309b and the electrode 1309d. Then, in the openings, an electrode 1312 electrically connected to the electrode 1309b and an electrode 1313 electrically connected to the electrode 1309d are formed. The electrode 1312 and the electrode 1313 can function as pixel electrodes.

Figure 39:
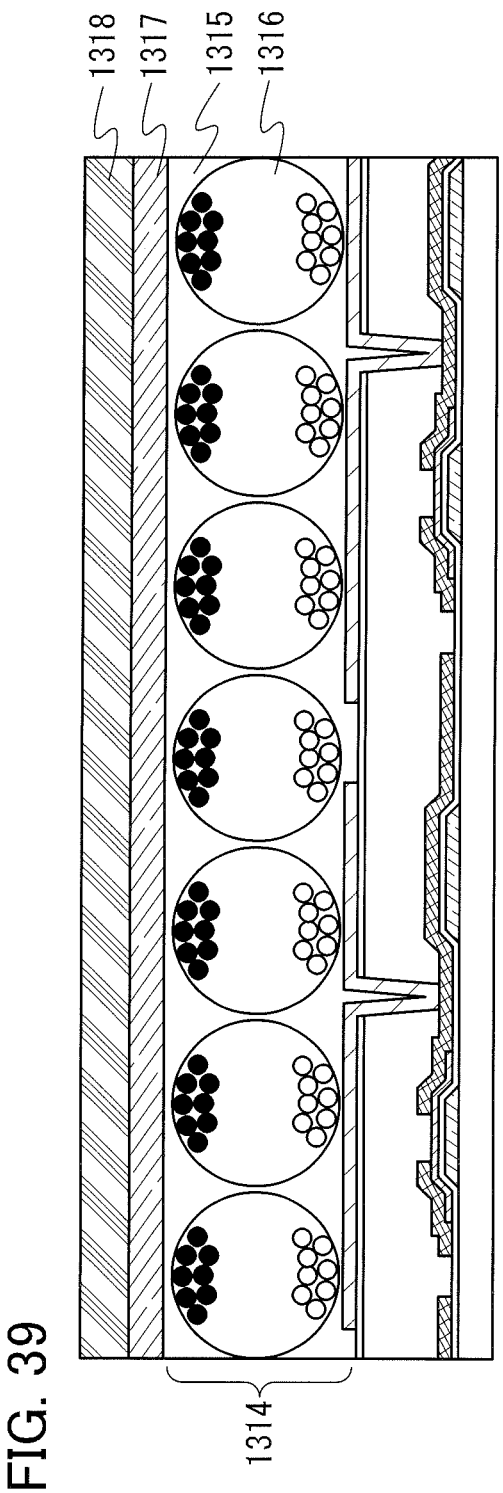
FIG. 39 is a cross-sectional view in accordance with an embodiment of the present invention.

As shown in FIG. 39, a layer 1314, a conductive film 1317, and a substrate 1318 are formed, provided, or attached over/to the electrode 1312 and the electrode 1313. The layer 1314 includes a display medium. A microcapsule 1315 is fixed in a dispersant 1316.

The conductive film 1317 can be formed as a single layer or a multi-layer using titanium, molybdenum, tantalum, chromium, tungsten, aluminum, neodymium, copper, silver, gold, platinum, niobium, silicon, zinc, iron, barium, germanium, ITO, IZO, zinc oxide (ZnO), or tin oxide (SnO). The conductive film 1317 can function as a counter electrode.

A plastic substrate, a resin substrate, a film substrate, a glass substrate, a ceramic substrate, a stainless steel substrate, a stainless steel foil substrate, or the like can be used for the substrate 1318.

Through the above steps, a display device using a TFT including an oxide semiconductor can be fabricated.

A TFT including an oxide semiconductor has higher light-transmittance than a TFT including amorphous silicon or the like. In the case of using a TFT including an oxide semiconductor, a display device has a display surface on the TFT substrate side by using a light-transmitting material or a material with high light transmittance as a wiring material.

The conductive layer 1319, the conductive layer 1320, the electrode 1319b, and the electrode 1319d can be formed using a transparent conductive material and the electrode 1301 and the electrode 1302 can be formed using a metal material. A transparent material is used for elements in a pixel, whereby an aperture ratio can be improved. Further, when a portion functioning as a wiring is formed using a metal material, resistance can be reduced.

Note that this embodiment can be combined with the structure described in any of the other embodiments in this specification as appropriate. Note that description in this embodiment is an example and is not the all description of the embodiment of the present invention.

Embodiment 10

The display device shown in the above embodiments can be applied to various electronic devices for displaying information. For example, the display device shown in the above embodiments can be applied to e-book readers (electronic books), posters, advertisements on vehicles such as trains, or displays on various cards such as credit cards.

Figure 41A:
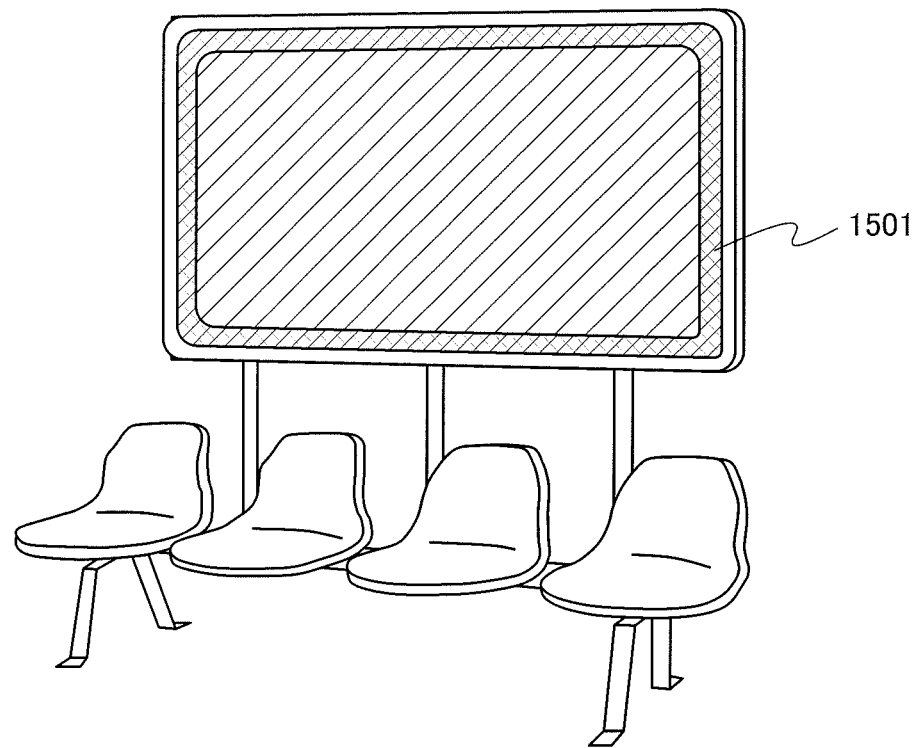
FIGS. 41A and 41B each illustrate an electronic device including a display device in accordance with an embodiment of the present invention.

FIG. 41A shows a poster 1501 using display device. A printed advertisement is changed by hand. However, in the case of using the display device shown in the above embodiments, display of the advertisement can be changed in a short time. In addition, stable images can be obtained without display defects. Note that the poster may have a configuration capable of wirelessly transmitting and receiving data.

Figure 41B:
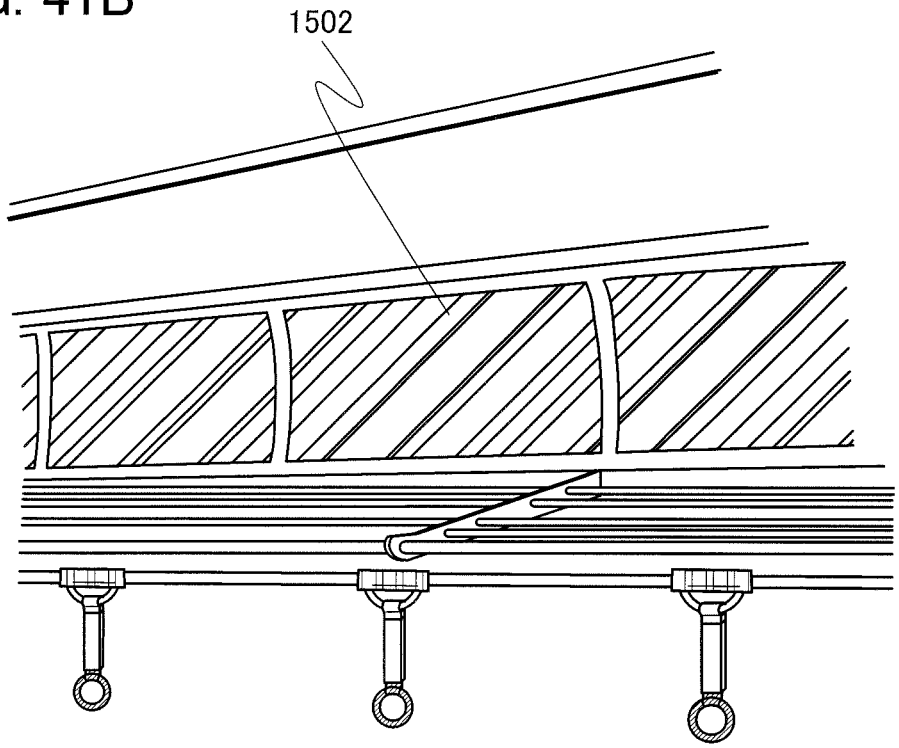

FIG. 41B illustrates an advertisement 1502 on a vehicle such as a train. A printed advertisement is changed by hand. However, in the case of using the display device shown in the above embodiments, display of the advertisement can be changed in a short time with less manpower. In addition, stable images can be obtained without display defects. Note that the advertisement may have a configuration capable of wirelessly transmitting and receiving data.

FIG. 14A shows an example of an electronic book device. The electronic book device shown in FIG. 14A includes two housings, a housing 1500 and a housing 1501. The housing 1500 and the housing 1501 are combined with a hinge 1504 so that the electronic book device can be opened and closed with the hinge 1504. With such a structure, the electronic book device can operate like a paper book.

A display portion 1602 and a display portion 1603 are incorporated in the housing 1600 and the housing 1601, respectively. The display portion 1602 and the display portion 1603 may display one image or may display different images. When the display portion 1602 and the display portion 1603 display different images, for example, a display portion on the right side (the display portion 1602 in FIG. 42A) can display text and a display portion on the left side (the display portion 1603 in FIG. 42A) can display graphics.

Figure 42A:
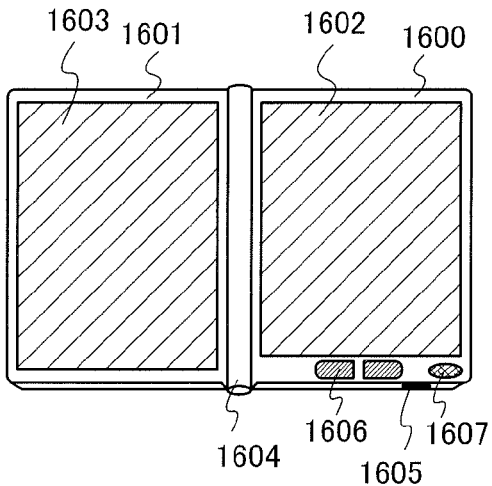
FIGS. 42A to 42D each illustrate an electronic device including a display device in accordance with an embodiment of the present invention.

FIG. 42A shows an example in which the housing 1600 is provided with an operation portion and the like. For example, the housing 1600 is provided with a power switch 1605, an operation key 1606, a speaker 1607, and the like. With the operation key 1606, pages can be turned. Note that a keyboard, a pointing device, and the like may be provided on the same surface as the display portion of the housing. Furthermore, an external connection terminal (an earphone terminal, a USB terminal, a terminal that can be connected to an AC adapter or various cables such as a USB cable, or the like), a recording medium insertion portion, and the like may be provided on the back surface or the side surface of the housing. Furthermore, the electronic book device shown in FIG. 42A may serve as an electronic dictionary.

The electronic book device shown in FIG. 42A may transmit and receive data wirelessly. Through wireless communication, desired book data or the like can be purchased and downloaded from an electronic book server.

Figure 42B:
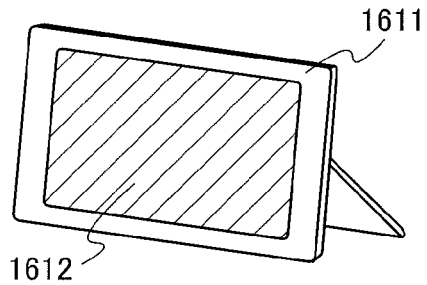

FIG. 42B shows an example of a digital photo frame. For example, in the digital photo frame shown in FIG. 42B, a display portion 1612 is incorporated in a housing 1611. The display portion 1612 can display a variety of images, for example, image data taken with a digital camera or the like, so that the digital photo frame can function in a manner similar to a general picture frame.

Note that the digital photo frame shown in FIG. 42B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a memory storing image data taken with a digital camera is inserted into the storage medium insertion portion of the digital photo frame, and the image data is loaded to be displayed on the display portion 1612.

The digital photo frame shown in FIG. 42B may transmit and receive data wirelessly. A structure may be employed in which desired image data is loaded wirelessly to be displayed.

Figure 42C:
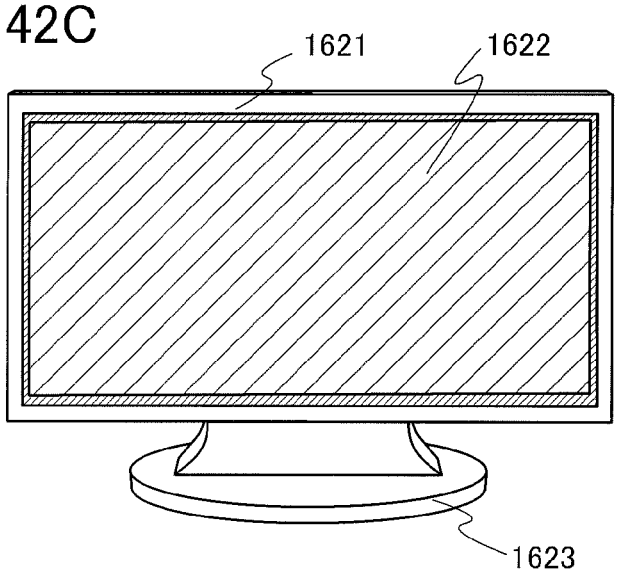

FIG. 42C shows an example of a television device. In the television device shown in FIG. 42C, a display portion 1622 is incorporated in a housing 1621. The display portion 1622 can display an image. Further, the housing 1621 is supported by a stand 1623 in FIG. 42C.

The television device shown in FIG. 42C can be operated with an operation switch of the housing 1621 or a separate remote controller. Channels and volume can be controlled by an operation key of the remote controller, so that an image displayed on the display portion 1622 can be controlled. Further, the remote controller may be provided with a display portion for displaying data output from the remote controller.

Note that the television device shown in FIG. 42C is preferably provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 42D:
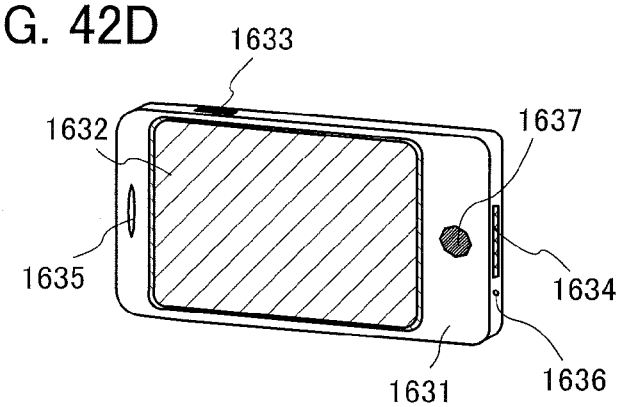

FIG. 42D shows an example of a mobile phone. The mobile phone shown in FIG. 42D is provided with a display portion 1632 incorporated in a housing 1631, operation buttons 1633 and 1637, an external connection port 1634, a speaker 1635, a microphone 1636, and the like.

The display portion 1632 of the mobile phone shown in FIG. 42D is a touchscreen. When the display portion 1632 is touched with a finger or the like, contents displayed in the display portion 1632 can be controlled. Further, operations such as making calls and composing mails can be performed by touching the display portion 1632 with a finger or the like.

There are mainly three screen modes of the display portion 1632. The first mode is a display mode mainly for displaying an image. The second mode is an input mode mainly for inputting data such as text. The third mode is a mode in which two modes of the display mode and the input mode are combined.

For example, in making calls and composing mails, an input mode mainly for inputting text is selected for the display portion 1632, and input operation may be performed by touching characters displayed on a screen. In that case, it is preferable to display a keyboard or number buttons on a large area of the screen of the display portion 1632.

When a detection device shown in FIG. 42D including a sensor for detecting inclination, such as a gyroscope or an acceleration sensor, is provided inside the mobile phone, the mode (or display data) of the display portion 1632 can be automatically switched by determining the orientation of the mobile phone (whether the mobile phone is placed horizontally or vertically for a landscape mode or a portrait mode).

Further, the screen modes are switched by touching the display portion 1632 or operating the operation button 1637 of the housing 1631. Alternatively, the screen modes can be switched depending on kinds of images displayed on the display portion 1632. For example, when a signal of an image displayed on the display portion is the one of moving image data, the screen mode can be switched to the display mode. When the signal is the one of text data, the screen mode can be switched to the input mode.

Further, in the input mode, when input by touching the display portion 1632 is not performed for a certain period while a signal detected by an optical sensor in the display portion 1632 is detected, the screen mode may be controlled so as to be switched from the input mode to the display mode.

The display portion 1632 may function as an image sensor. For example, an image of a palm print, a fingerprint, or the like is taken by an image sensor when the display portion 1632 is touched with a palm or a finger, whereby personal authentication can be performed. Further, by providing a backlight or a sensing light source which emits near-infrared light in the display portion, an image of a finger vein, a palm vein, or the like can be taken.

This embodiment can be implemented in appropriate combination with the structures described in the other embodiments.

Embodiment 11

In the other embodiments, various examples are shown. This embodiment shows an example of the case of performing modification, amendment, addition, deletion, replacement, and application of part of or all of contents described in the other embodiments. Alternatively, this embodiment shows another example describing contents different from those of another embodiment. Alternatively, this embodiment shows an example describing contents of another embodiment in detail. Alternatively, this embodiment shows an example describing broader concept of contents of another embodiment. Alternatively, this embodiment shows an example describing a definition of contents of another embodiment.

Therefore, an example of an embodiment of the present invention is not limited to the contents described in this embodiment.

For example, a display element, a display device which is a device having a display element, a light-emitting element, and a light-emitting device which is a device having a light-emitting element can use various types and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a digital micromirror device (DMD), a piezoelectric ceramic display, or a carbon nanotube, can be used in a display element, a display device, a light-emitting element, or a light-emitting device. Note that an example of display devices having EL elements is an EL display. Examples of display devices including electron emitters are a field emission display (FED) and an SED-type flat panel display (SED: surface-conduction electron-emitter display). Display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Examples of display devices having electronic ink or electrophoretic elements is electronic paper.

An example of an EL element is an element including an anode, a cathode, and an EL layer interposed between the anode and the cathode. Examples of an EL layer are a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, a layer including a high-molecular material and a low-molecular material, and the like. Note that the present invention is not limited thereto, and various EL elements can be used.

An example of an electron emitter is an element in which electrons are extracted by high electric field aggregation on a cathode. Specifically, examples of an electron emitter are a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a thin film type in which a metal, an insulator, a semiconductor, and a metal are stacked, a HEED type, an EL type, a porous silicon type, a surface-conduction (SCE) type, and the like. However, the present invention is not limited thereto, and various elements can be used as an electron emitter.

Examples of electronic paper are a device for displaying images by molecules (a device which utilizes optical anisotropy, dye molecular orientation, or the like), a device for displaying images by particles (a device which utilizes electrophoresis, particle movement, particle rotation, phase change, or the like), a device for displaying images by movement of one end of a film, a device for displaying images by using coloring properties or phase change of molecules, a device for displaying images by using optical absorption by molecules, and a device for displaying images by using self-light emission by combination of electrons and holes. Specific examples of display methods, materials, and elements of electronic paper are microcapsule electrophoresis, horizontal electrophoresis, vertical electrophoresis, a spherical twisting ball, a magnetic twisting ball, a columnar twisting ball, a charged toner, Electro Liquid Powder, magnetophoresis, a magnetic thermosensitive type, electrowetting, light-scattering (transparent-opaque change), a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, and flexible organic EL. Note that the present invention is not limited thereto, and various types of electronic papers and various display methods thereof can be used. By using microcapsule electrophoresis, aggregation or precipitation of particles can be solved. Electro Liquid Powder has advantages such as high-speed response, high reflectivity, wide viewing angle, low power consumption, and memory properties.

Note that electroluminescence, a cold cathode fluorescent lamp, a hot cathode fluorescent lamp, an LED, a laser light source, a mercury lamp, or the like can be used as an example of a light source of a display device which needs a light source. Examples of such a display device are a liquid crystal display (e.g., a transmissive liquid crystal display, a transflective liquid crystal display, a reflective liquid crystal display, a direct-view liquid crystal display, or a projection liquid crystal display), a display device including a grating light valve (GLV), and a display device including a digital micromirror device (DMD). Note that the present invention is not limited thereto, and a variety of light sources can be used.

A transistor to be used can have various structures. Therefore, there is no limitation on the kinds of transistors to be used. For example, a thin film transistor (TFT) including a non-single crystal semiconductor film typified by amorphous silicon, polycrystalline silicon, microcrystalline (also referred to as microcrystal, nanocrystal, or semi-amorphous) silicon, or the like can be used. In the case of using such a TFT, there are various advantages. For example, since the TFT can be formed at a temperature lower than that of the case of using single crystalline silicon, manufacturing cost can be reduced and a manufacturing device can be made larger. Since the manufacturing device can be made larger, the TFT can be formed using a large substrate. Therefore, many display devices can be formed at the same time, so that the display device can be formed at low cost. Alternatively, a substrate having low heat resistance can be used because of low manufacturing temperature. Therefore, the transistor can be formed using a light-transmitting substrate. Alternatively, transmission of light in a display element can be controlled by using the transistors formed over the light-transmitting substrate. Alternatively, part of a film included in the transistor can transmit light because the transistor is thin. Therefore, the aperture ratio can be improved.

Note that by using a catalyst (e.g., nickel) in the case of forming polycrystalline silicon, crystallinity can be further improved and a transistor having excellent electrical characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed using the same substrate as a pixel portion.

Note that by using a catalyst (e.g., nickel) in the case of forming microcrystalline silicon, crystallinity can be further improved and a transistor having excellent electrical characteristics can be formed. In this case, crystallinity can be improved by just performing heat treatment without performing laser irradiation. Accordingly, a gate driver circuit (e.g., a scan line driver circuit) and part of a source driver circuit (e.g., an analog switch) can be formed using the same substrate as a pixel portion. Note that in the case where laser irradiation for crystallization is not performed, unevenness in crystallinity of silicon can be suppressed. Therefore, high-quality images can be displayed. Note that polycrystalline silicon or microcrystalline silicon can be formed without use of a catalyst (e.g., nickel).

Note that it is preferable that crystallinity of silicon be improved to form a polycrystal, a microcrystal, or the like in the whole panel; however, the present invention is not limited to this. Crystallinity of silicon may be improved only in part of the panel. Selective improvement in crystallinity is possible by selective laser irradiation or the like. For example, only a peripheral driver circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Thus, a region whose crystallinity is improved is small, so that manufacturing steps can be decreased. Thus, throughput can be increased and manufacturing cost can be reduced. Alternatively, since the number of necessary manufacturing apparatus can be smaller, manufacturing cost can be reduced.

Note that for example, a transistor including a compound semiconductor or an oxide semiconductor, such as ZnO, a-In-GaZnO, SiGe, GaAs, IZO, ITO, SnO, TiO, or AlZnSnO (AZTO), a thin film transistor obtained by thinning such a compound semiconductor or an oxide semiconductor, or the like can be used as a transistor. Thus, manufacturing temperature can be lowered and, for example, such a transistor can be formed at room temperature. Accordingly, the transistor can be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Since such an element can be formed at the same time as the transistor, cost can be reduced.

Note that for example, a transistor or the like formed by inkjet or printing can be used as a transistor. Thus, a transistor can be formed at room temperature, can be formed at a low vacuum, or can be formed using a large substrate. Therefore, the transistor can be formed without use of a mask (reticle), so that the layout of the transistor can be easily changed. Alternatively, since the transistor can be formed without use of a resist, material cost is reduced and the number of steps can be reduced. Alternatively, since a film can be formed where needed, a material is not wasted as compared to a manufacturing method by which etching is performed after the film is formed over the entire surface, so that cost can be reduced.

Note that for example, a transistor or the like including an organic semiconductor or a carbon nanotube can be used as a transistor. Thus, such a transistor can be formed over a flexible substrate. A semiconductor device formed using such a transistor can resist shocks.

Note that transistors with a variety of different structures can be used as a transistor. For example, a MOS transistor, a junction transistor, a bipolar transistor, or the like can be used as a transistor. By using a MOS transistor as a transistor, the size of the transistor can be reduced. Thus, a plurality of transistors can be mounted. By using a bipolar transistor as a transistor, a large amount of current can flow. Thus, a circuit can be operated at high speed. Note that a MOS transistor and a bipolar transistor may be formed over one substrate. Thus, reduction in power consumption, reduction in size, high-speed operation, and the like can be achieved.

For example, a transistor with a multi-gate structure having two or more gate electrodes can be used as a transistor. With the multi-gate structure, a structure where a plurality of transistors are connected in series is provided because channel regions are connected in series. Thus, with the multi-gate structure, the amount of off-state current can be reduced and the withstand voltage of the transistor can be increased (reliability can be improved). Alternatively, with the multi-gate structure, drain-source current does not fluctuate very much even when drain-source voltage fluctuates when the transistor operates in a saturation region, so that a flat slope of voltage-current characteristics can be obtained. By utilizing the flat slope of the voltage-current characteristics, an ideal current source circuit or an active load having an extremely large resistance value can be realized. Accordingly, a differential circuit, a current mirror circuit, or the like having excellent properties can be realized.

Note that for example, a transistor with a structure where gate electrodes are formed above and below a channel can be used as a transistor. With the structure where the gate electrodes are formed above and below the channel, a circuit structure where a plurality of transistors are connected in parallel is provided. Thus, a channel region is increased, so that the amount of current can be increased. Alternatively, with the structure where gate electrodes are formed above and below the channel, a depletion layer can be easily formed, so that subthreshold swing can be improved.

Note that for example, a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like can be used as a transistor.

Note that for example, a transistor with a structure where a source electrode or a drain electrode overlaps with a channel region (or part of it) can be used as a transistor. With the structure where the source electrode or the drain electrode overlaps with the channel region (or part of it), unstable operation due to accumulation of electric charge in part of the channel region can be prevented.

Note that for example, a transistor with a structure where an LDD region is provided can be used as a transistor. By providing the LDD region, the amount of off-state current can be reduced or the withstand voltage of the transistor can be increased (reliability can be improved). Alternatively, by providing the LDD region, drain-source current does not fluctuate very much even when drain-source voltage fluctuates when the transistor operates in the saturation region, so that a flat slope of voltage-current characteristics can be obtained.

Note that a transistor can be formed using a variety of substrates, without limitation to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As a glass substrate, a barium borosilicate glass substrate, an aluminoborosilicate glass substrate, a soda-lime glass substrate, or the like can be used, for example. For a flexible substrate, a flexible synthetic resin such as plastics typified by polyethylene terephthalate (PET), polyethylene naphthalate (PEN), or polyether sulfone (PES), or acrylic can be used, for example. For an attachment film, polypropylene, polyester, vinyl, polyvinyl fluoride, polyvinyl chloride, or the like can be used, for example. For a base material film, polyester, polyamide, polyimide, an inorganic vapor deposition film, paper, or the like can be used, for example. In particular, by forming transistors with the use of a semiconductor substrate (e.g., a single crystal substrate), an SOI substrate, or the like, transistors with fewer variations in characteristics, sizes, shapes, or the like, with high current supply capability, and with small sizes can be formed. By forming a circuit with the use of such a transistor, power consumption of the circuit can be reduced or the circuit can be highly integrated.

Note that the transistor may be formed using one substrate, and then, the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability and high heat resistance can be provided, or reduction in weight or thickness can be achieved.

Note that all the circuits that are necessary to realize a predetermined function can be formed using the same substrate (e.g., a glass substrate, a plastic substrate, a single crystal substrate, or an SOI substrate). Thus, cost can be reduced by reduction in the number of components or reliability can be improved by reduction in the number of connections to circuit components.

Note that it is possible not to form all the circuits that are necessary to realize the predetermined function over the same substrate. That is, some of the circuits which are necessary to realize the predetermined function can be formed using one substrate and some of the circuits which are necessary to realize the predetermined function can be formed using another substrate. For example, some of the circuits which are necessary to realize the predetermined function can be formed using a glass substrate and some of the circuits which are necessary to realize the predetermined function can be formed using a single crystal substrate (or an SOI substrate). The single crystal substrate over which some of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate by TAB (tape automated bonding), COF (chip on film), SMT (surface mount technology), a printed circuit board, or the like. When some of the circuits are formed using the same substrate as a pixel portion in this manner, cost can be reduced by reduction in the number of components or reliability can be improved by reduction in the number of connections to circuit components. In particular, a circuit with high driving voltage, a circuit with high driving frequency, or the like consumes a large amount of power in many cases. Thus, such a circuit is formed using a substrate which is different from the substrate over which the pixel portion is formed (e.g., a single crystal substrate), and an IC chip is formed. With the IC chip, the increase in power consumption can be prevented.

For example, one pixel is one element whose brightness can be controlled. For example, one pixel is one color element and brightness is expressed with the one color element. Thus, in the case of a color display device having color elements of R (red), G (green), and B (blue), the minimum unit of an image includes three pixels: an R pixel, a G pixel, and a B pixel. Note that the color elements are not limited to three colors, and color elements of more than three colors may be used or a color other than R, G, and B may be used. For example, R, G, B, and W (W corresponds to white) can be used by addition of white. Alternatively, one or more colors of yellow, cyan, magenta, emerald green, vermilion, and the like can be added to R, G, and B, for example. Alternatively, a color which is similar to at least one of R, and B can be added to R, and B. For example, R, B1, and B2 may be used. Although both B1 and B2 are blue, they have slightly different wavelengths. Similarly, R1, R2, G, and B can be used. By using such color elements, display which is closer to the real object can be performed and power consumption can be reduced.

Note that in the case where the brightness of one color element is controlled using a plurality of regions, one region can correspond to one pixel. For example, when area ratio gray scale display is performed or subpixels are included, a plurality of regions that control brightness are provided in each color element and gradation is expressed with the whole region in some cases. In that case, one region which controls brightness can correspond to one pixel. That is, one color element includes a plurality of pixels. Note that even when a plurality of regions that control brightness are provided in one color element, they may be collectively referred to as one pixel. In that case, one color element includes one pixel. Note that in the case where the brightness of one color element is controlled using a plurality of regions, regions which contribute to display might have different sizes depending on pixels. In the plurality of regions which control brightness in each color element, signals supplied to the plurality of regions may be slightly different from each other so that the viewing angle can be widened. In other words, the potentials of pixel electrodes in a plurality of regions in each color element may be different from each other. Accordingly, voltages applied to liquid crystal molecules are varied depending on the pixel electrodes. Thus, the viewing angle can be widened.

Note that explicit description "one pixel (for three colors)" corresponds to the case where three pixels of R, G, and B are considered as one pixel. Explicit description "one pixel (for one color)" corresponds to the case where a plurality of regions are provided in each color element and collectively considered as one pixel.

For example, pixels might be provided (arranged) in matrix. Here, description that pixels are provided (arranged) in matrix includes the case where the pixels are arranged in a straight line and the case where the pixels are arranged in a jagged line, in a longitudinal direction or a lateral direction. Thus, for example, when full color display is performed with three color elements (e.g., R, G, and B), the following cases are included: the case where the pixels are arranged in stripes, the case where dots of the three color elements are arranged in a delta pattern, the case where the dots of the three color elements are provided in Bayer arrangement, the case where the dots of the three color elements are provided in a mosaic pattern. Note that the size of display regions may be different between dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also a variety of active elements (non-linear elements) can be used. For example, an MIM (metal insulator metal), a TFD (thin film diode), or the like can also be used. Since such an element has a small number of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, a passive matrix method in which an active element (a non-linear element) is not used can be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

For example, a transistor is an element having at least three terminals: a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Here, since the source and the drain of the transistor change depending on the structure, the operating condition, and the like of the transistor, it is difficult to define which is a source or a drain. Thus, a portion which serves as a source or a portion which serves as a drain is not referred to as a source or a drain in some cases. In that case, one of the source and the drain might be referred to as a first terminal, a first electrode, or a first region, and the other of the source and the drain might be referred to as a second terminal, a second electrode, or a second region, for example.

Note that a transistor may be an element having at least three terminals: a base, an emitter, and a collector. Also in this case, one of the emitter and the collector might be referred to as a first terminal, a first electrode, or a first region, and the other of the emitter and the collector might be referred to as a second terminal, a second electrode, or a second region, for example. Note that in the case where a bipolar transistor is used as the transistor, the term "gate" can be replaced with the term "base".

For example, a gate corresponds to all or some of a gate electrode and a gate wiring (also referred to as a gate line, a gate signal line, a scan line, a scan signal line, or the like). A gate electrode corresponds to part of a conductive film which overlaps with a semiconductor forming a channel region with a gate insulating film therebetween. Note that part of the gate electrode can overlap with an LDD (lightly doped drain) region or a source region (or a drain region) with the gate insulating film therebetween. A gate wiring corresponds to a wiring for connecting gate electrodes of transistors to each other, a wiring for connecting gate electrodes of pixels to each other, or a wiring for connecting a gate electrode to another wiring.

Note that there is a portion (a region, a conductive film, a wiring, or the like) which serves as both a gate electrode and a gate wiring. Such a portion (a region, a conductive film, a wiring, or the like) may be referred to as either a gate electrode or a gate wiring. That is, there is a region in which a gate electrode and a gate wiring cannot be clearly distinguished from each other. For example, in the case where a channel region overlaps with part of an extended gate wiring, the overlapped portion (region, conductive film, wiring, or the like) serves as both a gate wiring and a gate electrode. Thus, such a portion (a region, a conductive film, a wiring, or the like) may be referred to as either a gate electrode or a gate wiring.

Note that a portion (a region, a conductive film, a wiring, or the like) which is formed using the same material as a gate electrode, forms the same island as the gate electrode, and is connected to the gate electrode may be referred to as a gate electrode. Similarly, a portion (a region, a conductive film, a wiring, or the like) which is formed using the same material as a gate wiring, forms the same island as the gate wiring, and is connected to the gate wiring may be referred to as a gate wiring. In a strict sense, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may be referred to as either a gate electrode or a gate wiring.

For example, in a multi-gate transistor, for example, a gate electrode is often connected to another gate electrode by using a conductive film which is formed using the same material as the gate electrode. Since such a portion (a region, a conductive film, a wiring, or the like) is a portion (a region, a conductive film, a wiring, or the like) for connecting a gate electrode to another gate electrode, the portion may be referred to as a gate wiring, or the portion may be referred to as a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. Further, as another example, part of a conductive film which connects the gate electrode and the gate wiring and is formed using a material which is different from that of the gate electrode or the gate wiring may be referred to as either a gate electrode or a gate wiring.

Note that a gate terminal corresponds to part of a portion (a region, a conductive film, a wiring, or the like) of a gate electrode or part of a portion (a region, a conductive film, a wiring, or the like) which is electrically connected to the gate electrode.

In the case where a wiring is referred to as a gate wiring, a gate line, a gate signal line, a scan line, a scan signal line, or the like, a gate of a transistor is not connected to the wiring in some cases. In this case, the gate wiring, the gate line, the gate signal line, the scan line, or the scan signal line sometimes corresponds to a wiring formed in the same layer as the gate of the transistor, a wiring formed using the same material as the gate of the transistor, or a wiring formed at the same time as the gate of the transistor. Examples are a wiring for a storage capacitor, a power supply line, and a reference potential supply line.

A source corresponds to all or some of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Therefore, a region containing a small amount of p-type impurities or n-type impurities, that is, an LDD (lightly doped drain) region is rarely included in the source region. A source electrode is part of a conductive layer which is formed using a material different from that of a source region and is electrically connected to the source region. Note that a source electrode and a source region are collectively referred to as a source electrode in some cases. A source wiring corresponds to a wiring for connecting source electrodes of transistors to each other, a wiring for connecting source electrodes of pixels to each other, or a wiring for connecting a source electrode to another wiring.

However, there is a portion (a region, a conductive film, a wiring, or the like) which serves as both a source electrode and a source wiring. Such a portion (a region, a conductive film, a wiring, or the like) may be referred to as either a source electrode or a source wiring. That is, there is a region in which a source electrode and a source wiring cannot be clearly distinguished from each other. For example, in the case where a source region overlaps with part of an extended source wiring, the overlapped portion (region, conductive film, wiring, or the like) serves as both a source wiring and a source electrode. Thus, such a portion (a region, a conductive film, a wiring, or the like) may be referred to as either a source electrode or a source wiring.

Note that a portion (a region, a conductive film, a wiring, or the like) which is formed using the same material as a source electrode, forms the same island as the source electrode, and is connected to the source electrode; a portion (a region, a conductive film, a wiring, or the like) which connects a source electrode and another source electrode; or a portion which overlaps with a source region may be referred to as a source electrode. Similarly, a region which is formed using the same material as a source wiring, forms the same island as the source wiring, and is connected to the source wiring may be referred to as a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may be referred to as either a source electrode or a source wiring.

For example, part of a conductive film which connects the source electrode and the source wiring and is formed using a material which is different from that of the source electrode or the source wiring may be referred to as either a source electrode or a source wiring.

A source terminal corresponds to part of a source region, part of a source electrode, or part of a portion (a region, a conductive film, a wiring, or the like) which is electrically connected to the source electrode.

In the case where a wiring is referred to as a source wiring, a source line, a source signal line, a data line, a data signal line, or the like, a source (a drain) of a transistor is not connected to the wiring in some cases. In this case, the source wiring, the source line, the source signal line, the data line, or the data signal line sometimes corresponds to a wiring formed in the same layer as the source (the drain) of the transistor, a wiring formed using the same material as the source (the drain) of the transistor, or a wiring formed at the same time as the source (the drain) of the transistor. Examples are a wiring for a storage capacitor, a power supply line, and a reference potential supply line.

Note that the same can be said for a drain.

For example, a semiconductor device corresponds to a device having a circuit including a semiconductor element (e.g., a transistor, a diode, or a thyristor). The semiconductor device may correspond to also all devices that can function by utilizing semiconductor characteristics and a device having a semiconductor material.

Note that a display device corresponds to a device having a display element. The display device may include a plurality of pixels each having a display element. Note that that the display device may include a peripheral driver circuit for driving the plurality of pixels. The peripheral driver circuit for driving the plurality of pixels may be formed using the same substrate as the plurality of pixels. The display device may include a peripheral driver circuit provided over a substrate by wire bonding or bump bonding, namely, an IC chip connected by chip on glass (COG) or an IC chip connected by TAB or the like. The display device may include a flexible printed circuit (FPC) to which an IC chip, a resistor, a capacitor, an inductor, a transistor, or the like is attached. Note that the display device may include a printed wiring board (PWB) which is connected through a flexible printed circuit (FPC) and to which an IC chip, a resistor, a capacitor, an inductor, a transistor, or the like is attached. The display device may include an optical sheet such as a polarizing plate or a retardation plate. The display device may include a lighting device, a housing, an audio input and output device, an optical sensor, or the like.

Note that a lighting device may include a backlight unit, a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a light-emitting device corresponds to a device having a light-emitting element or the like. In the case where a light-emitting device includes a light-emitting element as a display element, the light-emitting device is one of specific examples of a display device.

Note that a reflective device corresponds to a device having a light-reflective element, a light diffraction element, light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of signals from a source signal line to pixels (also referred to as a selection transistor, a switching transistor, or the like), a transistor which supplies voltage or current to a pixel electrode, a transistor which supplies voltage or current to a light-emitting element, and the like are examples of the driving device. A circuit which supplies signals to a gate signal line (also referred to as a gate driver, a gate line driver circuit, or the like), a circuit which supplies signals to a source signal line (also referred to as a source driver, a source line driver circuit, or the like), and the like are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that "X and Y are connected", the case where X and Y are electrically connected, the case where X and Y are functionally connected, and the case where X and Y are directly connected are included therein. Here, each of X and Y is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

For example, in the case where X and Y are electrically connected, one or more elements which enable electrical connection between X and Y (e.g., a switch, a transistor, a capacitor, an inductor, a resistor, and/or a diode) can be connected between X and Y.

For example, in the case where X and Y are functionally connected, one or more circuits which enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that "X and Y are electrically connected", the case where X and Y are electrically connected (i.e., the case where X and Y are connected with another element or another circuit interposed therebetween), the case where X and Y are functionally connected (i.e., the case where X and Y are functionally connected with another circuit interposed therebetween), and the case where X and Y are directly connected (i.e., the case where X and Y are connected without another element or another circuit interposed therebetween) are included therein. That is, when it is explicitly described that "X and Y are electrically connected", the description is the same as the case where it is explicitly only described that "X and Y are connected".

Note that when it is explicitly described that "Y is formed on X" or "Y is formed over X", it does not necessarily mean that Y is formed in direct contact with X. The description includes the case where X and Y are not in direct contact with each other, i.e., the case where another object is interposed between X and Y. Here, each of X and Y is an object (e.g., a device, an element, a circuit, a wiring, an electrode, a terminal, a conductive film, or a layer).

Accordingly, for example, when it is explicitly described that "a layer Y is formed on (or over) a layer X", it includes both the case where the layer Y is formed in direct contact with the layer X, and the case where another layer (e.g., a layer Z) is formed in direct contact with the layer X and the layer Y is formed in direct contact with the layer Z. Note that another layer (e.g., a layer Z) may be a single layer or a plurality of layers (a stacked layer).

In a similar manner, when it is explicitly described that "Y is formed above X", it does not necessarily mean that B is formed in direct contact with X, and another object may be interposed therebetween. Thus, for example, when it is described that "a layer Y is formed above a layer X", it includes both the case where the layer Y is formed in direct contact with the layer X and the case where another layer (e.g., a layer Z) is formed in direct contact with the layer X and the layer Y is formed in direct contact with the layer Z. Note that another layer (e.g., a layer Z) may be a single layer or a plurality of layers (a stacked layer).

Note that when it is explicitly described that "Y is formed on X", "Y is formed over X", or "Y is formed above X", it includes the case where Y is formed obliquely over/above X.

Note that the same can be said when it is described that "Y is formed under X" or "Y is formed below X".

Note that when an object is explicitly described in a singular form, the object is preferably singular. Note that the present invention is not limited to this, and the object can be plural. In a similar manner, when an object is explicitly described in a plural form, the object is preferably plural. Note that the present invention is not limited to this, and the object can be singular.

Note that terms such as "first", "second", "third", and the like are used for distinguishing various elements, members, regions, layers, and areas from others. Therefore, the terms such as "first", "second", "third", and the like do not limit the number of the elements, members, regions, layers, areas, or the like. Further, for example, the term "first" can be replaced with the term "second", "third", or the like.

For example, terms for describing spatial arrangement, such as "over", "above", "under", "below", "laterally", "right", "left", "obliquely", "behind", "front", "inside", "outside", and "in" are often used for briefly showing a relationship between an element and another element or between a feature and another feature with reference to a diagram. Note that embodiments of the present invention are not limited to this, and such terms for describing spatial arrangement can indicate not only the direction illustrated in a diagram but also another direction. For example, when it is explicitly described that "Y is over X", it does not necessarily mean that Y is placed over X and can include the case where Y is placed under X because a device in a diagram can be inverted or rotated by 180°. Accordingly, "over" can refer to the direction described by "under" in addition to the direction described by "over". Note that embodiments of the present invention are not limited to this, and "over" can refer to any of the other directions described by "laterally", "right", "left", "obliquely", "behind", "front", "inside", "outside", and "in" in addition to the directions described by "over" and "under" because the device in the diagram can be rotated in a variety of directions. That is, the terms for describing spatial arrangement can be construed adequately depending on the situation.

Note that in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, part of the diagram or the text is taken out, and one embodiment of the invention can be constituted. For example, M pieces of circuit elements (e.g., transistors or capacitors) (M is an integer, where M<N) are taken out from a circuit diagram in which N pieces of circuit elements (e.g., transistors or capacitors) (N is an integer) are provided, and one embodiment of the invention can be constituted. As another example, M pieces of layers (M is an integer, where M<N) are taken out from a cross-sectional view in which N pieces of layers (N is an integer) are provided, and one embodiment of the invention can be constituted. As another example, M pieces of elements (M is an integer, where M<N) are taken out from a flow chart in which N pieces of elements (N is an integer) are provided, and one embodiment of the invention can be constituted.

Note that in a diagram or a text described in one embodiment, in the case where at least one specific example is described, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted.

Note that a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted.

This application is based on Japanese Patent Application serial no. 2010-151026 filed with the Japan Patent Office on Jul. 1, 2010, the entire contents of which are hereby incorporated by reference.

What is claimed is:

1. An electric field driving display device comprising:
a first semiconductor layer over a substrate;
a second semiconductor layer over the substrate;
a conductive layer over the substrate;
a first gate electrode over the first semiconductor layer;
a second gate electrode over the second semiconductor layer;
a first insulating film over the first semiconductor layer, the second semiconductor layer, the conductive layer, the first gate electrode and the second gate electrode;
a first electrode over the first insulating film, the first electrode being electrically connected to the first semiconductor layer;
a second electrode over the first insulating film, the second electrode being electrically connected to the second semiconductor layer;
a second insulating film over the first electrode and the second electrode;
a third electrode over the second insulating film, the third electrode being electrically connected to the first electrode;
a fourth electrode over the second insulating film, the fourth electrode being electrically connected to the second electrode;
a layer comprising a charged particle, over the second insulating film, the third electrode and the fourth electrode; and
a fifth electrode over the layer comprising the charged particle,
wherein the third electrode overlaps with a first region of the second insulating film,
wherein the fourth electrode overlaps with a second region of the second insulating film,
wherein a third region between the first region and the second region of the second insulating film overlaps with at least part of the first electrode,
wherein the third electrode does not overlap with the third region of the second insulating film,
wherein the fourth electrode does not overlap with the third region of the second insulating film,
wherein the conductive layer overlaps with the first region of the second insulating film, and
wherein a shortest distance between the first electrode and the second electrode is approximately equal to a shortest distance between the third electrode and the fourth electrode.

2. The electric field driving display device according to claim 1,
wherein the third electrode and the fourth electrode each comprise a transparent material, and
wherein the transparent material is selected from chromium, titanium, titanium nitride, molybdenum, tungsten, tantalum, or tantalum nitride.

3. The electric field driving display device according to claim 1, wherein the first gate electrode and the second gate electrode each comprise a single layer or a multi-layer including titanium, molybdenum, tantalum, chrome, tungsten, aluminum, neodymium, copper, silver, gold, platinum, niobium, silicon, zinc, iron, barium, germanium, indium tin oxide, indium oxide and zinc oxide, zinc oxide, or tin oxide.

4. The electric field driving display device according to claim 1,
wherein the layer comprises a micro capsule,
wherein the micro capsule comprises the charged particle, and
wherein the micro capsule overlaps with the third region.

5. The electric field driving display device according to claim 1, wherein the second insulating film comprises a material absorbing light.

6. An electric field driving display device comprising:
a first gate electrode over a substrate;
a second gate electrode over the substrate;
a conductive layer over the substrate;
a first semiconductor layer over the first gate electrode;
a second semiconductor layer over the second gate electrode;
a first electrode over the first semiconductor layer, the first electrode being electrically connected to the first semiconductor layer;
a second electrode over the second semiconductor layer, the second electrode being electrically connected to the second semiconductor layer;
an insulating film over the conductive layer, the first electrode and the second electrode;
a third electrode over the insulating film, the third electrode being electrically connected to the first electrode;
a fourth electrode over the insulating film, the fourth electrode being electrically connected to the second electrode;
a layer comprising a charged particle, over the insulating film, the third electrode and the fourth electrode; and
a fifth electrode over the layer comprising the charged particle,
wherein the third electrode overlaps with a first region of the insulating film,
wherein the fourth electrode overlaps with a second region of the insulating film,
wherein a third region between the first region and the second region of the insulating film overlaps with at least part of the first electrode,
wherein the third electrode does not overlap with the third region of the insulating film, wherein the fourth electrode does not overlap the third region of the insulating film, wherein the conductive layer overlaps with the first region of the insulating film, and wherein a shortest distance between the first electrode and the second electrode is approximately equal to a shortest distance between the third electrode and the fourth electrode.

7. The electric field driving display device according to claim 6, wherein the third electrode and the fourth electrode each comprise a transparent material, and wherein the transparent material is selected from chromium, titanium, titanium nitride, molybdenum, tungsten, tantalum, or tantalum nitride.

8. The electric field driving display device according to claim 6, wherein the first semiconductor layer and the second semiconductor layer each comprise an oxide semiconductor.

9. The electric field driving display device according to claim 8, wherein the oxide semiconductor comprises an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material.

10. The electric field driving display device according to claim 6, wherein the first gate electrode and the second gate electrode each comprise a single layer or a multi-layer including titanium, molybdenum, tantalum, chrome, tungsten, aluminum, neodymium, copper, silver, gold, platinum, niobium, silicon, zinc, iron, barium, germanium, indium tin oxide, indium oxide and zinc oxide, zinc oxide, or tin oxide.

11. The electric field driving display device according to claim 6, wherein the layer comprises a micro capsule, wherein the micro capsule comprises the charged particle, and wherein the micro capsule overlaps with the third region.

12. The electric field driving display device according to claim 6, wherein the insulating film comprises a material absorbing light.

* * * * *